US007824954B2

(12) United States Patent
An et al.

(10) Patent No.: US 7,824,954 B2
(45) Date of Patent: Nov. 2, 2010

(54) METHODS OF FORMING PHASE CHANGE MEMORY DEVICES HAVING BOTTOM ELECTRODES

(75) Inventors: Hyeong-Geun An, Gyeonggi-do (KR); Dong-Ho Ahn, Gyeonggi-do (KR); Young-Soo Lim, Chungcheongbuk-do (KR); Yong-Ho Ha, Gyeonggi-do (KR); Jun-Young Jang, Gyeonggi-do (KR); Dong-Won Lim, Seoul (KR); Gyeo-Re Lee, Seoul (KR); Joon-Sang Park, Seoul (KR); Han-Bong Ko, Gyeonggi-do (KR); Young-Lim Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 282 days.

(21) Appl. No.: 12/170,038

(22) Filed: Jul. 9, 2008

(65) Prior Publication Data

US 2009/0017577 A1     Jan. 15, 2009

(30) Foreign Application Priority Data

Jul. 12, 2007   (KR) ..................... 10-2007-0070153
Jul. 23, 2007   (KR) ..................... 10-2007-0073521

(51) Int. Cl.
*H01L 21/06* (2006.01)
(52) U.S. Cl. ................... 438/102; 438/385; 438/900; 257/4; 257/E45.002
(58) Field of Classification Search ............ 438/95, 438/102, 385, 900; 257/4, E21.04, E45.002
See application file for complete search history.

(56) References Cited

U.S. PATENT DOCUMENTS

| 6,429,064 | B1 | 8/2002 | Wicker |
| 6,670,628 | B2 | 12/2003 | Lee et al. |
| 7,038,230 | B2 | 5/2006 | Chen et al. |
| 7,511,297 | B2* | 3/2009 | Jang et al. ............... 257/42 |
| 7,569,845 | B2* | 8/2009 | Chen et al. ............... 257/3 |

(Continued)

FOREIGN PATENT DOCUMENTS

JP     2006-019686     1/2006

(Continued)

*Primary Examiner*—Tuan N. Quach
(74) *Attorney, Agent, or Firm*—Myers Bigel Sibley & Sajovec, P.A.

(57) ABSTRACT

Phase change memory devices can have bottom patterns on a substrate. Line-shaped or L-shaped bottom electrodes can be formed in contact with respective bottom patterns on a substrate and to have top surfaces defined by dimensions in x and y axes directions on the substrate. The dimension along the x-axis of the top surface of the bottom electrodes has less width than a resolution limit of a photolithography process used to fabricate the phase change memory device. Phase change patterns can be formed in contact with the top surface of the bottom electrodes to have a greater width than each of the dimensions in the x and y axes directions of the top surface of the bottom electrodes and top electrodes can be formed on the phase change patterns, wherein the line shape or the L shape represents a sectional line shape or a sectional L shape of the bottom electrodes in the x-axis direction.

36 Claims, 38 Drawing Sheets

U.S. PATENT DOCUMENTS

| | | | |
|---|---|---|---|
| 7,608,848 B2 * | 10/2009 | Ho et al. | 257/3 |
| 2004/0087074 A1 * | 5/2004 | Hwang et al. | 438/198 |
| 2006/0006374 A1 | 1/2006 | Chang | |

FOREIGN PATENT DOCUMENTS

| | | |
|---|---|---|
| KR | 1020060001055 A | 1/2006 |
| KR | 1020060001056 A | 1/2006 |
| KR | 1020060092511 A | 8/2006 |
| KR | 10-0650724 | 11/2006 |

* cited by examiner

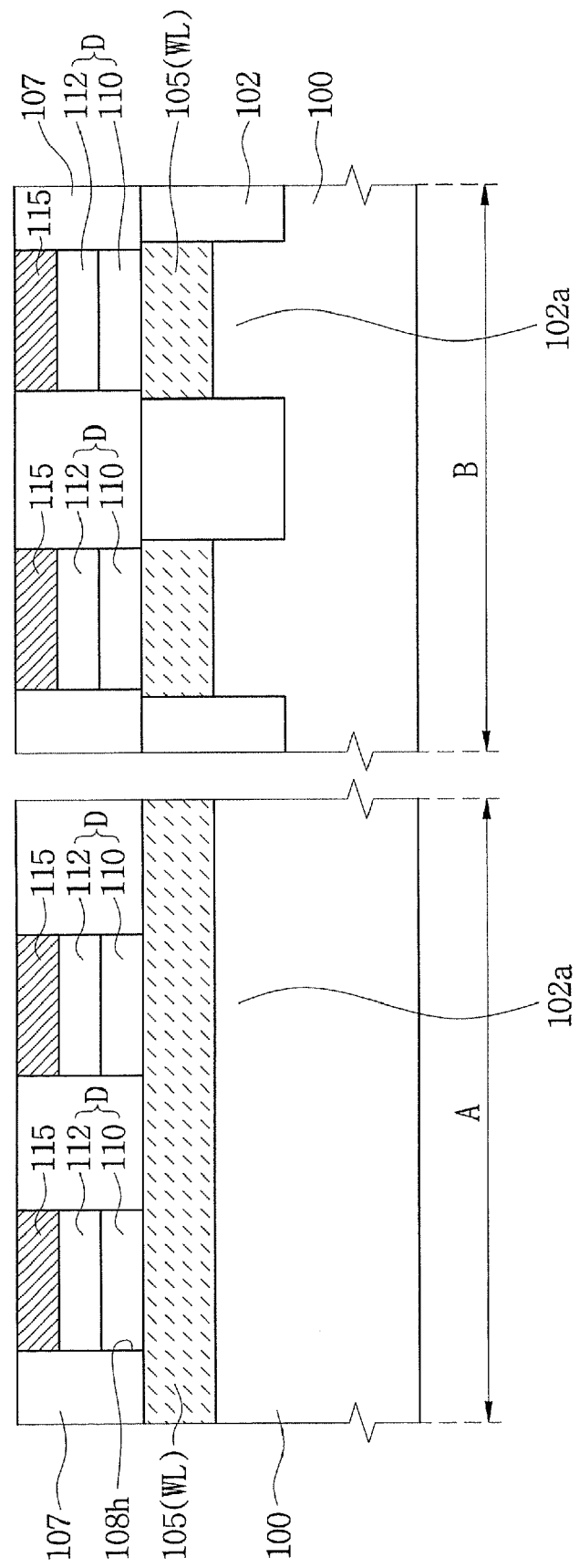

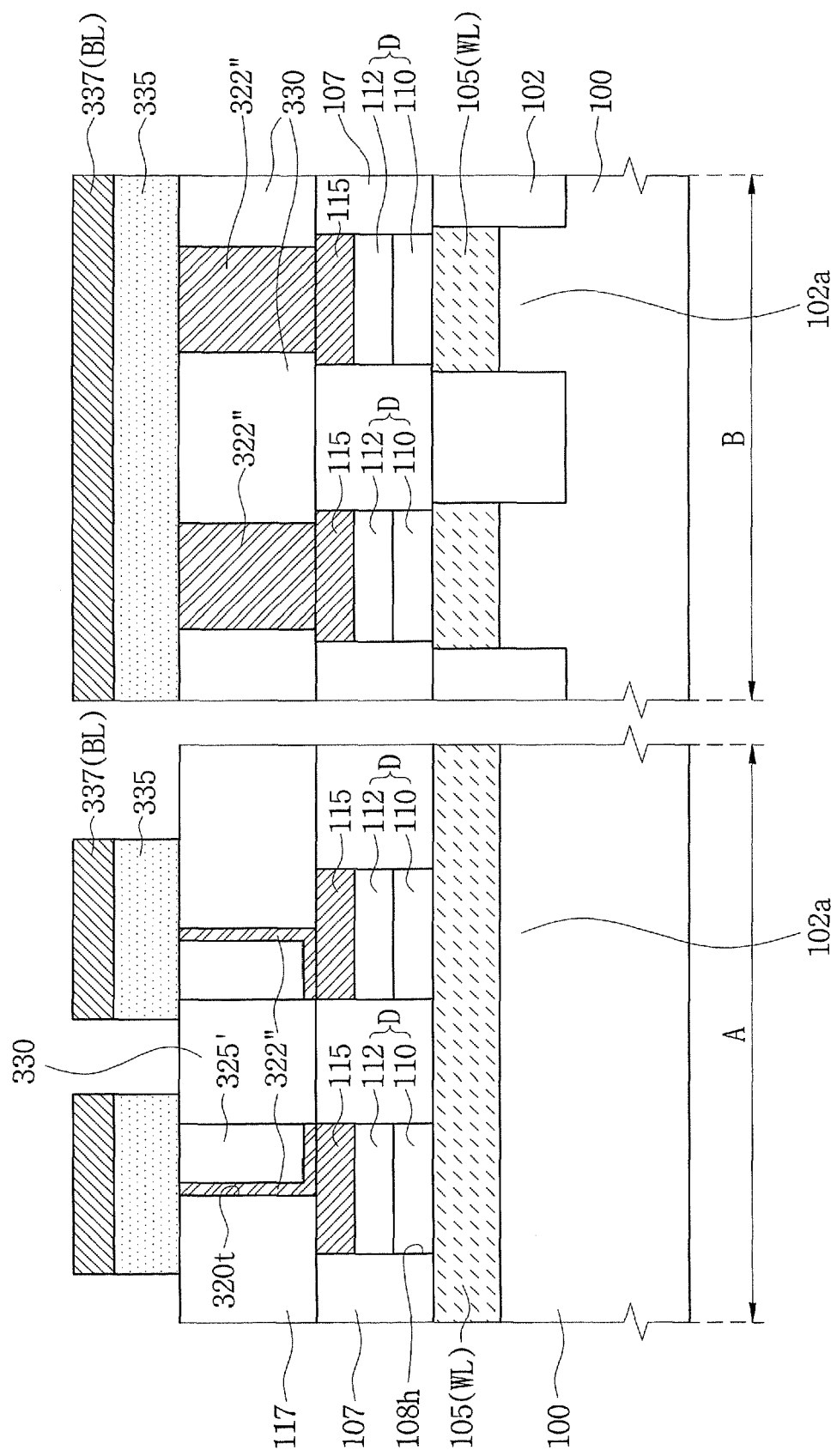

METHODS OF FORMING PHASE CHANGE MEMORY DEVICES HAVING BOTTOM ELECTRODES

CROSS-REFERENCE TO RELATED APPLICATION

This application claims the benefit of Korean Patent Application Nos. 10-2007-0070153 and 10-2007-0073521, filed Jul. 12, 2007, and Jul. 23, 2007, respectively, the contents of which are hereby incorporated herein by reference in their entirety.

FIELD OF THE INVENTION

The present invention relates to semiconductor memory devices and methods of fabricating the same, and more particularly, to phase change memory devices having a bottom electrode and methods of fabricating the same.

BACKGROUND

A unit cell of the phase change memory device includes an access device, and a data storage element serially connected to the access device. The data storage element can include a bottom electrode electrically connected to the access device and a phase change material layer in contact with the bottom electrode. The phase change material layer can be electrically switched between an amorphous state and a crystalline state or between various resistivity states within the crystalline state depending on an amount of current provided thereto.

When a program current flows through the bottom electrode, Joule heat can be generated at an interface between the phase change material layer and the bottom electrode. Such Joule heat can transform a portion of the phase change material layer (hereinafter, referred to as a 'transition region') into an amorphous state or a crystalline state. Resistivity of the transition region having the amorphous state is higher than that of the transition region having the crystalline state. Accordingly, by detecting a current flowing through the transition region in a read mode, data stored in the phase change material layer of the phase change memory device may be discriminated as a logical one (1) or logical zero (0).

SUMMARY

In some embodiments according to the invention, phase change memory devices can have bottom patterns on a substrate. Line-shaped or L-shaped bottom electrodes can be formed in contact with respective bottom patterns on a substrate and to have top surfaces defined by dimensions in x and y axes directions on the substrate. The dimension along the x-axis of the top surface of the bottom electrodes has less width than a resolution limit of a photolithography process used to fabricate the phase change memory device. Phase change patterns can be formed in contact with the top surface of the bottom electrodes to have a greater width than each of the dimensions in the x and y axes directions of the top surface of the bottom electrodes and top electrodes can be formed on the phase change patterns, wherein the line shape or the L shape represents a sectional line shape or a sectional L shape of the bottom electrodes in the x-axis direction.

BRIEF DESCRIPTION OF THE DRAWINGS

The foregoing and other objects, features and advantages of the invention will become apparent from the following more particular description of example embodiments of the invention, as illustrated in the accompanying drawings. The drawings are not necessarily to scale, emphasis instead being placed upon illustrating the principles of the invention.

FIGS. 3A through 3E are cross-sectional views taken along lines I-I' and II-II' of FIG. 2, illustrating a method of fabricating a phase change memory device in some embodiments according to the invention.

FIGS. 8A through 8C are cross-sectional views illustrating a method of fabricating a phase change memory device in some embodiments according to the invention.

DESCRIPTION OF EMBODIMENTS ACCORDING TO THE INVENTION

Figure 1:
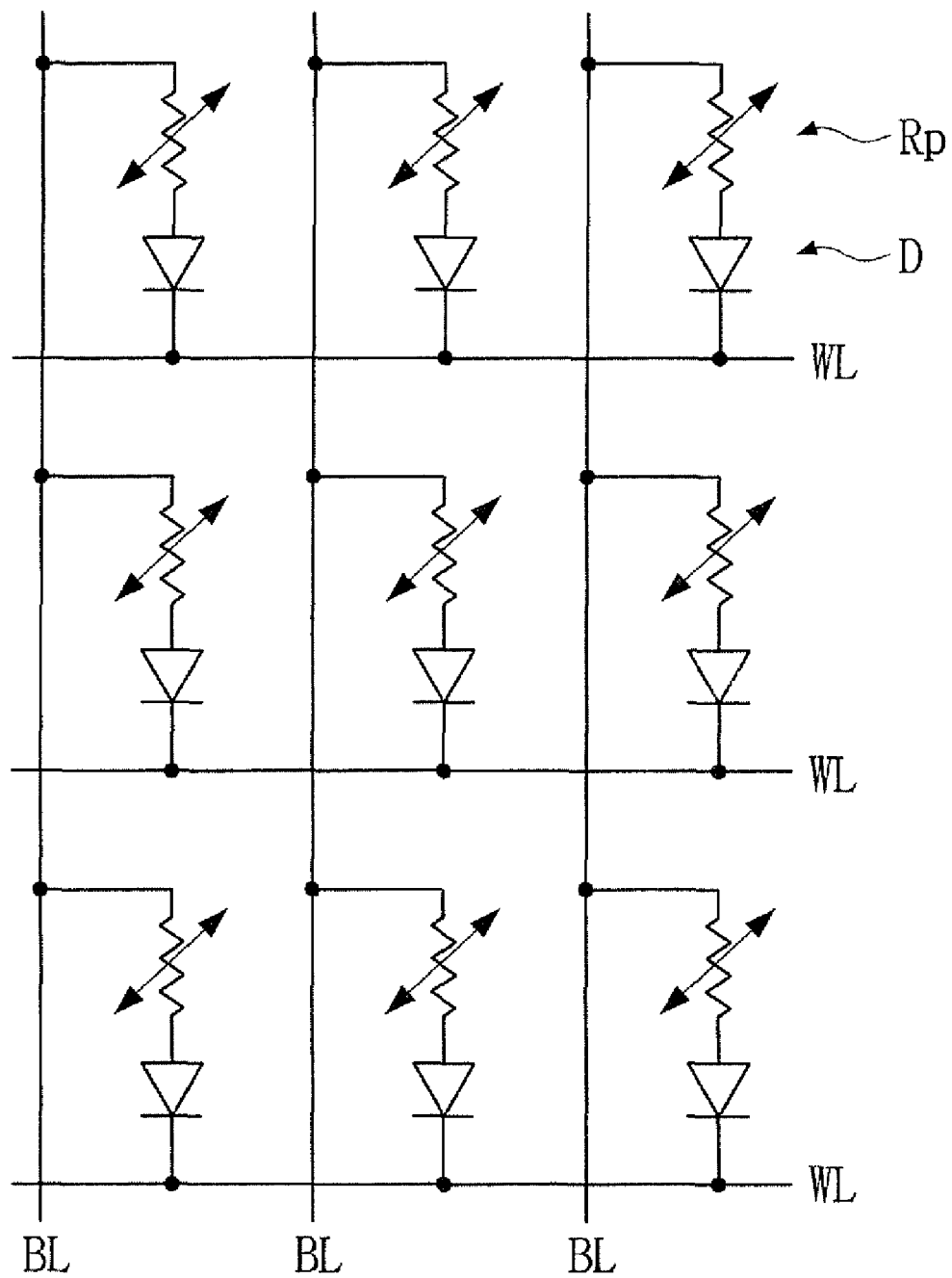
FIG. 1 is an equivalent circuit diagram of a portion of a cell array region of a phase change memory device in some embodiments according to the invention.

The present invention is described more fully hereinafter with reference to the accompanying drawings, in which embodiments of the invention are shown by way of example. The present invention may, however, be embodied in many different forms and should not be construed as limited to the example embodiments set forth herein. Rather, these example embodiments are provided so that this disclosure will be through and complete, and will fully convey the scope of the present invention to those skilled in the art. Moreover, each embodiment described and illustrated herein includes it complementary conductivity type embodiment as well.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) anot her element, there are no intervening elements present. Like numbers refer to like elements throughout. As used herein, the term "and/or" includes any and all combination s of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

It will be understood that line-shaped and L-shaped bottom electrodes described in embodiments according to the present invention represent sectional shapes of the bottom electrodes in an x-axis direction, and the L-shaped bottom electrodes include a section of an L shape and a section of a symmetrical structure of the L shape in a vertical direction. Alternatively, the line-shaped and L-shaped bottom electrodes may represent sectional shapes of the bottom electrodes in a y-axis direction.

Exemplary embodiments of the invention provide phase change memory devices having bottom electrodes suitable for reducing a current to be applied during a reset operation by reducing an interface area between a phase change material layer and the bottom electrode where Joule heat is generated, and methods of fabricating the same.

In some example embodiments of the present invention, the y-axis of the top surface of the bottom electrodes may have a width equal to or greater than a resolution limit of a photolithography process.

In other example embodiments, the y-axis of the top surface of the bottom electrodes may have a smaller width than a resolution limit of a photolithography process.

In still other example embodiments, the L-shaped bottom electrodes may include a section of an L shape and a section of a symmetrical structure of the L shape in a vertical direction. The L-shaped structures of the L-shaped bottom electrodes adjacent to each other may be symmetrically arranged.

In yet other example embodiments, the bottom patterns may be a diode.

In yet other example embodiments, the bottom patterns may be a contact plug in contact with the substrate and a conductive pattern disposed on the contact plug. Transistors electrically connected to the respective bottom patterns may be disposed on the substrate.

In yet other example embodiments, the phase change patterns may extend in a direction parallel to the x-axis of the top surface of the bottom electrodes or may extend in a direction parallel to the y-axis of the top surface of the bottom electrodes.

In another aspect, the invention is directed to methods of fabricating a phase change memory device. The methods include preparing a substrate having bottom patterns. Line-shaped or L-shaped bottom electrodes are formed which are in contact with the respective bottom patterns and have top surfaces defined by x and y axes on the substrate having the bottom patterns. In this case, the x-axis of the top surface of the bottom electrodes has a smaller width than a resolution limit of a photolithography process. In addition, the line shape or the L shape represents a sectional shape of the bottom electrodes in the x-axis direction. Phase change patterns are formed which are in contact with the top surface of the bottom electrodes and have a greater width than each of the x and y axes of the top surface of the bottom electrodes. Top electrodes are formed on the phase change patterns.

In some example embodiments of the present invention, the y-axis of the top surface of the bottom electrodes may have a width equal to or greater than a resolution limit of a photolithography process.

In other example embodiments, forming the line-shaped bottom electrodes may include forming an interlayer insulating layer on the substrate having the bottom patterns. Line-shaped trenches extending in the y-axis direction and simultaneously exposing portions of the two bottom patterns neighboring in the x-axis direction may be formed within the interlayer insulating layer. Bottom electrode spacers may be formed on sidewalls of the line-shaped trenches, and first insulating patterns filling the line-shaped trenches may be formed in the substrate having the bottom electrode spacers. Line-shaped mask patterns extending in the x-axis direction may be formed on the substrate having the first insulating patterns, the bottom electrode spacers and the interlayer insulating layer, and the first insulating patterns, the bottom electrode spacers and the interlayer insulating layer may be etched until the bottom patterns are exposed using the line-shaped mask patterns as an etch mask. Subsequently, second insulating patterns may be filled in the etched region.

In still other example embodiments, forming the L-shaped bottom electrodes may include forming an interlayer insulating layer on the substrate having the bottom patterns, and forming, within the interlayer insulating layer, line-shaped trenches extending in the y-axis direction and simultaneously exposing portions of the two bottom patterns neighboring in the x-axis direction. Subsequently, a bottom electrode layer and a spacer layer may be sequentially formed in the substrate having the line-shaped trenches, and the spacer layer and the bottom electrode layer may be sequentially etched-back to form L-shaped bottom electrode patterns and spacers. First insulating patterns filling the line-shaped trenches may be formed in the substrate having the L-shaped bottom electrode patterns and the spacers, and line-shaped mask patterns extending in the x-axis direction may be formed on the substrate having the first insulating patterns and the L-shaped bottom electrode patterns. The first insulating patterns, the L-shaped bottom electrode patterns, and the interlayer insulating layer may be etched until the bottom patterns are exposed using the line-shaped mask patterns as an etch mask. Subsequently, second insulating patterns may be filled in the etched region.

In yet other example embodiments, forming the L-shaped bottom electrodes may include forming an interlayer insulating layer on the substrate having the bottom patterns, and forming, within the interlayer insulating layer, line-shaped trenches extending in the y-axis direction and simultaneously exposing portions of the two bottom patterns neighboring in the x-axis direction. Subsequently, bottom electrode patterns may be formed on sidewalls and bottom surfaces of the line-shaped trenches, and internal insulating patterns filling the line-shaped trenches may be formed on the substrate having the bottom electrode patterns. On the substrate having the internal insulating patterns and the bottom electrode patterns, mask patterns having a first opening exposing a central region of the internal insulating patterns in the y-axis direction and a second opening exposing a top region between the bottom patterns in the x-axis direction may be formed. The internal insulating patterns, the bottom electrode patterns, and the interlayer insulating layer may be etched until the bottom patterns are exposed using the mask patterns as an etch mask. Subsequently, insulating patterns may be filled in the etched region.

In yet other example embodiments, the y-axis of the top surface of the bottom electrodes may have a smaller width than a resolution limit of a photolithography process.

In yet other example embodiments, forming the line-shaped bottom electrodes may include forming an interlayer insulating layer on the substrate having the bottom patterns, and forming, within the interlayer insulating layer, line-shaped trenches extending in the y-axis direction and simultaneously exposing portions of the two bottom patterns neighboring in the x-axis direction. Bottom electrode spacers may be formed on sidewalls of the line-shaped trenches, and first insulating patterns filling the line-shaped trenches may be formed in the substrate having the bottom electrode spacers. Line-shaped sacrificial patterns extending in the x-axis direction may be formed on the substrate having the first insulating patterns, the bottom electrode spacers, and the interlayer insulating layer, and mask spacers may be formed on sidewalls of the line-shaped sacrificial patterns. The line-shaped sacrificial patterns, the interlayer insulating layer, the bottom electrode spacers, and the first insulating patterns may be etched until the bottom patterns are exposed using the mask spacers as an etch mask. Subsequently, second insulating patterns may be filled in the etched region. In this case, the sidewalls of the line-shaped sacrificial patterns may be formed above the respective bottom patterns.

In yet other example embodiments, forming the L-shaped bottom electrodes may include forming an interlayer insulating layer on the substrate having the bottom patterns, and forming, within the interlayer insulating layer, line-shaped trenches extending in the y-axis direction and simultaneously exposing portions of the two bottom patterns neighboring in the x-axis direction. A bottom electrode layer and a spacer layer may be sequentially formed in the substrate having the line-shaped trenches, and the spacer layer and the bottom electrode layer may be sequentially etched-back to form L-shaped bottom electrode patterns and spacers. First insulating patterns filling the line-shaped trenches may be formed in the substrate having the L-shaped bottom electrode patterns and the spacers, and line-shaped sacrificial patterns extending in the x-axis direction may be formed on the substrate having the first insulating patterns and the L-shaped bottom electrode patterns. Mask spacers may be formed on sidewalls of the line-shaped sacrificial patterns, and the line-shaped sacrificial patterns, the first insulating patterns, the L-shaped bottom electrode patterns and the interlayer insulating layer may be etched until the bottom patterns are exposed using the mask spacers as an etch mask. Subsequently, second insulating patterns may be filled in the etched region. The sidewalls of the line-shaped sacrificial patterns may be formed above the respective bottom patterns.

In yet other example embodiments, the L-shaped bottom electrodes may include a section of an L shape and a section of a symmetrical structure of the L shape in a vertical direction. The L-shaped bottom electrodes adjacent to each other may have the symmetrical L-shaped structures.

In yet other example embodiments, the bottom patterns may be formed of a diode.

In yet other example embodiments, the bottom patterns may be formed of a contact plug in contact with the substrate and a conductive pattern disposed on the contact plug. Transistors electrically connected to the respective bottom patterns may be formed on the substrate before forming the contact plug.

In yet other example embodiments, the phase change patterns may extend in a direction parallel to the x-axis of the top surface of the bottom electrodes or may extend in a direction parallel to the y-axis of the top surface of the bottom electrodes.

In yet other example embodiments, the phase change patterns and the top electrodes may be simultaneously formed by patterning.

In another aspect, the invention is directed to methods of fabricating a phase change memory device. The methods include preparing a substrate having bottom patterns. An interlayer insulating layer is formed on the substrate having the bottom patterns. Cylindrical bottom electrodes are formed in contact with the bottom patterns through the interlayer insulating layer. Insulating patterns are formed in the interlayer insulating layer to cut portions of the cylindrical bottom electrodes and the interlayer insulating layer in a vertical direction. Phase change patterns are formed in contact with upper portions of the partially cut cylindrical bottom electrodes. Top electrodes are formed on the phase change patterns.

In some example embodiments of the present invention, the partially cut cylindrical bottom electrodes may have a crescent shape, a "C" shape, or a "(" shape from the top view.

In other example embodiments, the bottom patterns may include diodes and diode electrodes which are sequentially stacked.

In yet other example embodiments, the bottom patterns may include contact plugs in contact with the substrate and conductive patterns disposed on the contact plugs. Transistors electrically connected to the respective bottom patterns may be formed on the substrate.

In yet other example embodiments, forming the insulating patterns may include cutting the portions of the cylindrical bottom electrodes and the interlayer insulating layer in a vertical direction to form trenches exposing portions of top surfaces of the bottom patterns and cut sidewalls of the partially cut cylindrical bottom electrodes and forming an insulating layer within the trenches.

In yet other example embodiments, forming the insulating patterns may include cutting the portions of the cylindrical bottom electrodes and the interlayer insulating layer in a vertical direction to form trenches exposing top surfaces and sidewalls of the cut portions of the partially cut cylindrical bottom electrodes and forming an insulating layer within the trenches.

In yet other example embodiments, forming the cylindrical bottom electrodes may include forming bottom electrode contact holes exposing top surfaces of the bottom patterns through the interlayer insulating layer. A bottom electrode layer may be formed to cover sidewalls and bottom surfaces of the bottom electrode contact holes on the interlayer insulating layer having the bottom electrode contact holes. An internal insulating layer may be formed to fill the bottom electrode contact holes on the substrate having the bottom electrode layer. The internal insulating layer and the bottom electrode layer may be planarized until a top surface of the interlayer insulating layer is exposed.

In yet other example embodiments, after planarizing the internal insulating layer and the bottom electrode layer until the top surface of the interlayer insulating layer is exposed, a planarization process may be performed at least once.

In yet another aspect, the invention is directed to methods of fabricating a phase change memory device. The methods include preparing a substrate having a bottom pattern. An interlayer insulating layer is formed on the substrate having the bottom patterns. Cylindrical bottom electrodes are formed on the respective bottom patterns through the interlayer insulating layer. Line-shaped insulating patterns are formed in the interlayer insulating layer in an x-axis or y-axis direction to cut portions of the cylindrical bottom electrodes and the interlayer insulating layer in a vertical direction. Phase change patterns are formed in contact with upper portions of the partially cut cylindrical bottom electrodes. Top electrodes are formed on the respective phase change patterns.

In some example embodiments of the present invention, the partially cut cylindrical bottom electrodes may have a crescent shape, a "C" shape, or a "(" shape from the top view.

In other example embodiments, the same portions of the cylindrical bottom electrodes may be cut to form a uniform CCC arrangement when viewing the partially cut cylindrical bottom electrodes from the top view.

In yet other example embodiments, the phase change patterns may be formed to extend in a direction parallel to or perpendicular to a surface along which the portions of the cylindrical bottom electrodes are cut.

In yet other example embodiments, forming the line-shaped insulating patterns may include cutting the portions of the cylindrical bottom electrodes and the interlayer insulating layer in a vertical direction to form line-shaped trenches exposing portions of top surfaces of the bottom patterns and cut sidewalls of the partially cut cylindrical bottom electrodes and forming an insulating layer within the line-shaped trenches.

In yet other example embodiments, forming the line-shaped insulating patterns may include cutting the portions of the cylindrical bottom electrodes and the interlayer insulating layer in a vertical direction to form line-shaped trenches exposing top surfaces and sidewalls of the cut portions of the partially cut cylindrical bottom electrodes and forming an insulating layer in the line-shaped trenches.

FIG. 1 is an equivalent circuit diagram of a portion of a cell array region of a phase change memory device in some embodiments according to the invention.

Referring to FIG. 1, the phase change memory device according to example embodiments of the present invention may include bit lines BL disposed parallel to each other in a column direction, word lines WL disposed parallel to each other in a row direction, a plurality of phase change patterns Rp, and a plurality of diodes D.

The bit lines BL may intersect the word lines WL. The phase change patterns Rp may be disposed at respective intersections of the bit lines BL and the word lines WL. Each of the diodes D may be serially connected to the corresponding one of the phase change patterns Rp. In addition, each of the phase change patterns Rp may be connected to the corresponding one of the bit lines BL. Each of the diodes D may be connected to the corresponding one of the word lines WL. The diodes D may act as access devices. In some embodiments according to the invention, the diodes D may be omitted. In some embodiments according to the invention, the access device may be a Metal Oxide Semiconductor (MOS) transistor.

Methods of fabricating the phase change memory device according to example embodiments of the present invention will now be described with reference to FIGS. 2 and 3A through 3E. In this case, reference symbols A and B in FIGS. 3A through 3E indicate cross-sectional views taken along lines I-I' and II-II' of FIG. 2, respectively.

Figure 2:
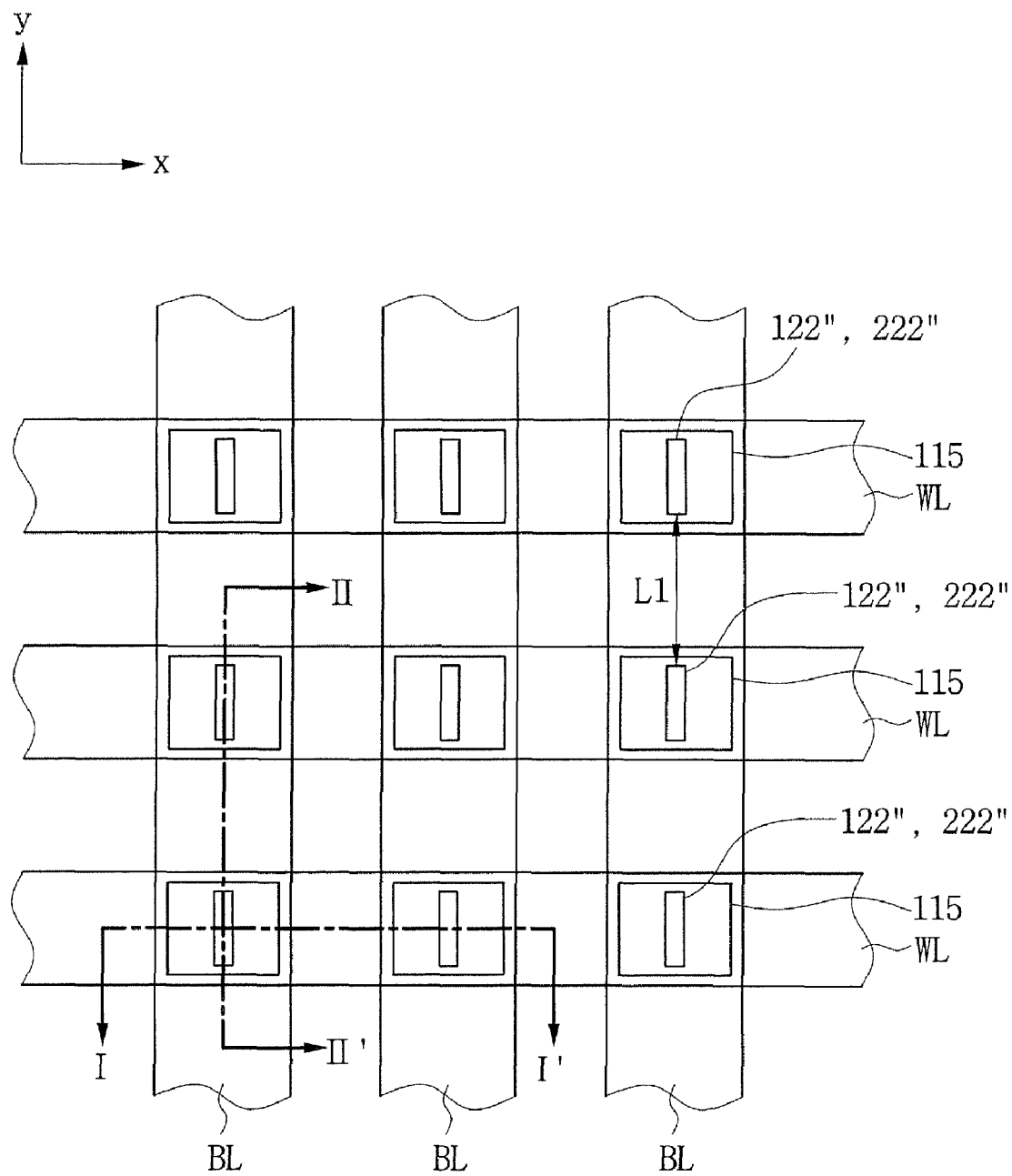
FIG. 2 is a plan view of a cell array region of a phase change memory device in some embodiments according to the invention corresponding to the equivalent circuit diagram of FIG. 1.

Referring to FIGS. 2 and 3A, an isolation layer 102 defining active regions 102a may be formed in a predetermined region of a substrate 100. A semiconductor substrate such as a silicon wafer or silicon-on-insulator (SOI) wafer may be employed for the substrate 100. The substrate 100 may have first conductivity type impurity ions. The isolation layer 102 may be formed using a shallow trench isolation (STI) technique. The isolation layer 102 may be formed of a silicon oxide layer, a silicon nitride layer, a silicon oxynitride layer, or combinations thereof. The active regions 102a may be formed to have line-shapes.

Impurity ions of a second conductivity type different from the first conductivity type may be implanted into the active regions 102a to form word lines WL 105. Hereinafter, it is assumed that the first and second conductivity types are P and N types for simplicity of description, respectively. In some embodiments according to the invention, the first and second conductivity types may be N and P types, respectively.

A first interlayer insulating layer 107 may be formed on the substrate 100 having the word lines WL 105 and the isolation layer 102. In some embodiments according to the invention, the first interlayer insulating layer 107 may be formed of a silicon oxide layer, a silicon nitride layer, a silicon oxynitride layer, or combinations thereof. The first interlayer insulating layer 107 may be patterned to form contact holes 108h exposing a predetermined region of the word lines WL 105.

First and second semiconductor patterns 110 and 112 may be sequentially deposited within the contact holes 108h. In some embodiments according to the invention, the first and second semiconductor patterns 110 and 112 may be formed using an epitaxial growth technique or a chemical vapor deposition (CVD) technique. In some embodiments according to the invention, the first and second semiconductor patterns 110 and 112 may include diodes D.

The first semiconductor pattern 110 may be in contact with the word lines WL 105. The first semiconductor pattern 110 may be formed to have the second conductivity type impurity ions. The second semiconductor pattern 112 may be formed to have the first conductivity type impurity ions. In some embodiments according to the invention, the first semiconductor pattern 110 may be formed to have the first conductivity type impurity ions and the second semiconductor pattern 112 may be formed to have the second conductivity type impurity ions. In some embodiments according to the invention, a metal silicide layer may be further formed on the second semiconductor pattern 112, however, which is omitted for simplicity of description.

Diode electrodes 115 may be formed on the respective diodes D. In some embodiments according to the invention, the diode electrodes 115 may include one selected from the group consisting of a titanium (Ti) layer, a titanium silicon (TiSi) layer, a titanium nitride (TiN) layer, a titanium oxynitride (TiON) layer, a titanium tungsten (TiW) layer, a titanium aluminum nitride (TiAlN) layer, a titanium aluminum oxynitride (TiAlON) layer, a titanium silicon nitride (TiSiN) layer, a titanium boron nitride (TiBN) layer, a tungsten (W) layer, a tungsten nitride (WN) layer, a tungsten oxynitride (WON) layer, a tungsten silicon nitride (WSiN) layer, a tungsten boron nitride (WBN) layer, a tungsten carbon nitride (WCN) layer, a silicon (Si) layer, a tantalum (Ta) layer, a tantalum silicon (TaSi) layer, a tantalum nitride (TaN) layer, a tantalum oxynitride (TaON) layer, a tantalum aluminum nitride (TaAlN) layer, a tantalum silicon nitride (TaSiN) layer, a tantalum carbon nitride (TaCN) layer, a molybdenum (Mo) layer, a molybdenum nitride (MoN) layer, a molybdenum silicon nitride (MoSiN) layer, a molybdenum aluminum nitride (MOAlN) layer, a niobium nitride (NbN) layer, a zirconium silicon nitride (ZrSiN) layer, a zirconium aluminum nitride (ZrAlN) layer, a ruthenium (Ru) layer, a cobalt silicon (CoSi) layer, a nickel silicon (NiSi) layer, a conductive carbon group layer, a copper (Cu) layer and combinations thereof. For example, in some embodiments according to the invention, the diode electrodes 115 may be formed by sequentially depositing a TiN layer and a W layer.

The diode electrodes 115 may be formed within the contact holes 108h. In this case, the diode electrodes 115 may be self-aligned on the respective diodes D. In some embodiments according to the invention, the diode electrodes 115 may be omitted.

Figure 3B:
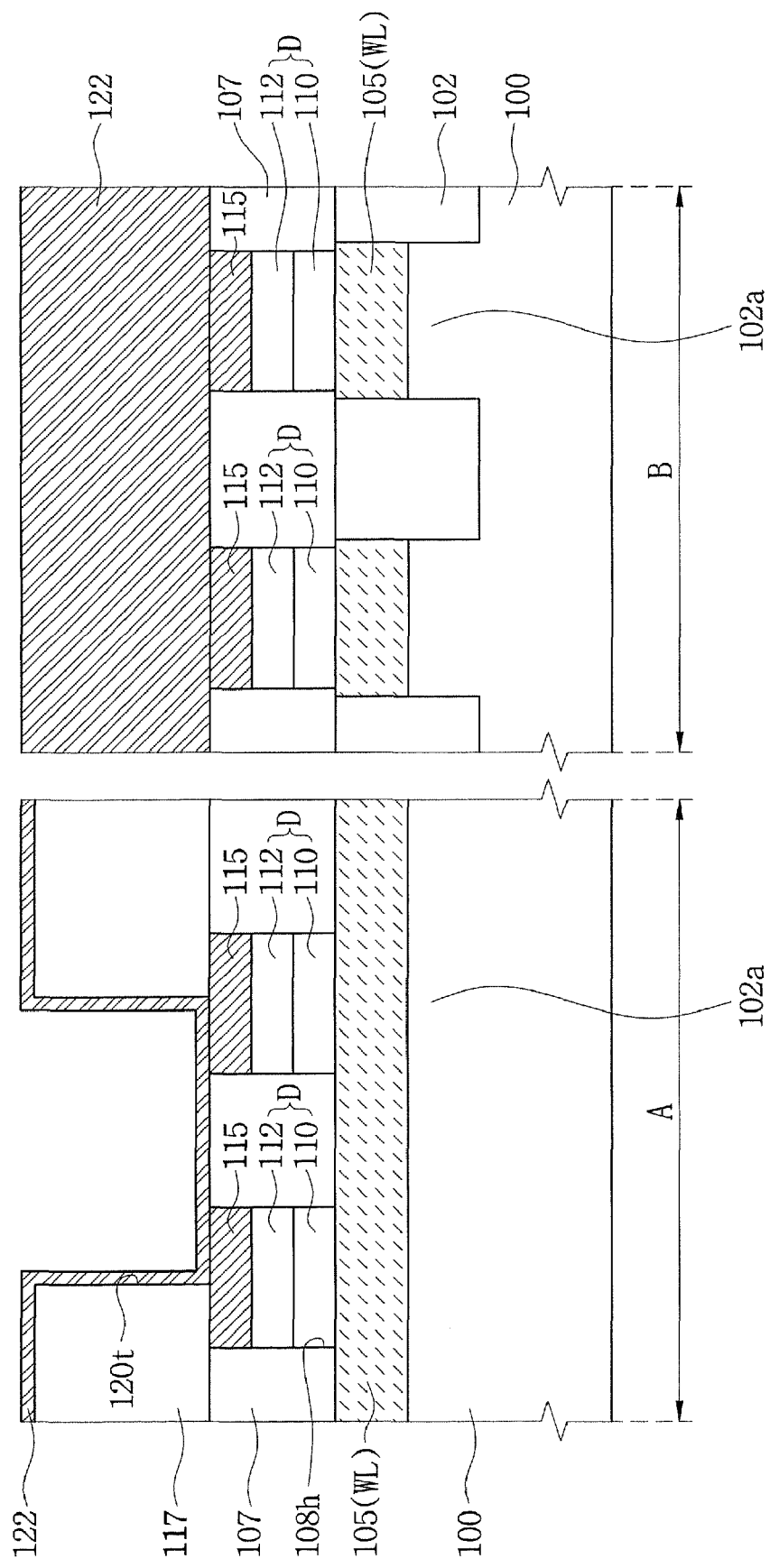

Referring to FIGS. 2 and 3B, a second interlayer insulating layer 117 may be formed on the substrate 100 having the diode electrodes 115. The second interlayer insulating layer 117 may be patterned to form line-shaped trenches 120t within the second interlayer insulating layer 117 which simultaneously expose portions of immediately neighboring diodes electrodes 115 in an x-axis direction and extend in a y-axis direction. A bottom electrode layer 122 may be formed along a bottom step on the substrate having the line-shaped trenches 120t. The bottom electrode layer 122 may cover the exposed diode electrodes 115 and the exposed first interlayer insulating layer 107 within the line-shaped trenches 120t, and may cover sidewalls of the line-shaped trenches 120t and a top surface of the second interlayer insulating layer 117.

In some embodiments according to the invention, the bottom electrode layer 122 may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

Figure 3C:
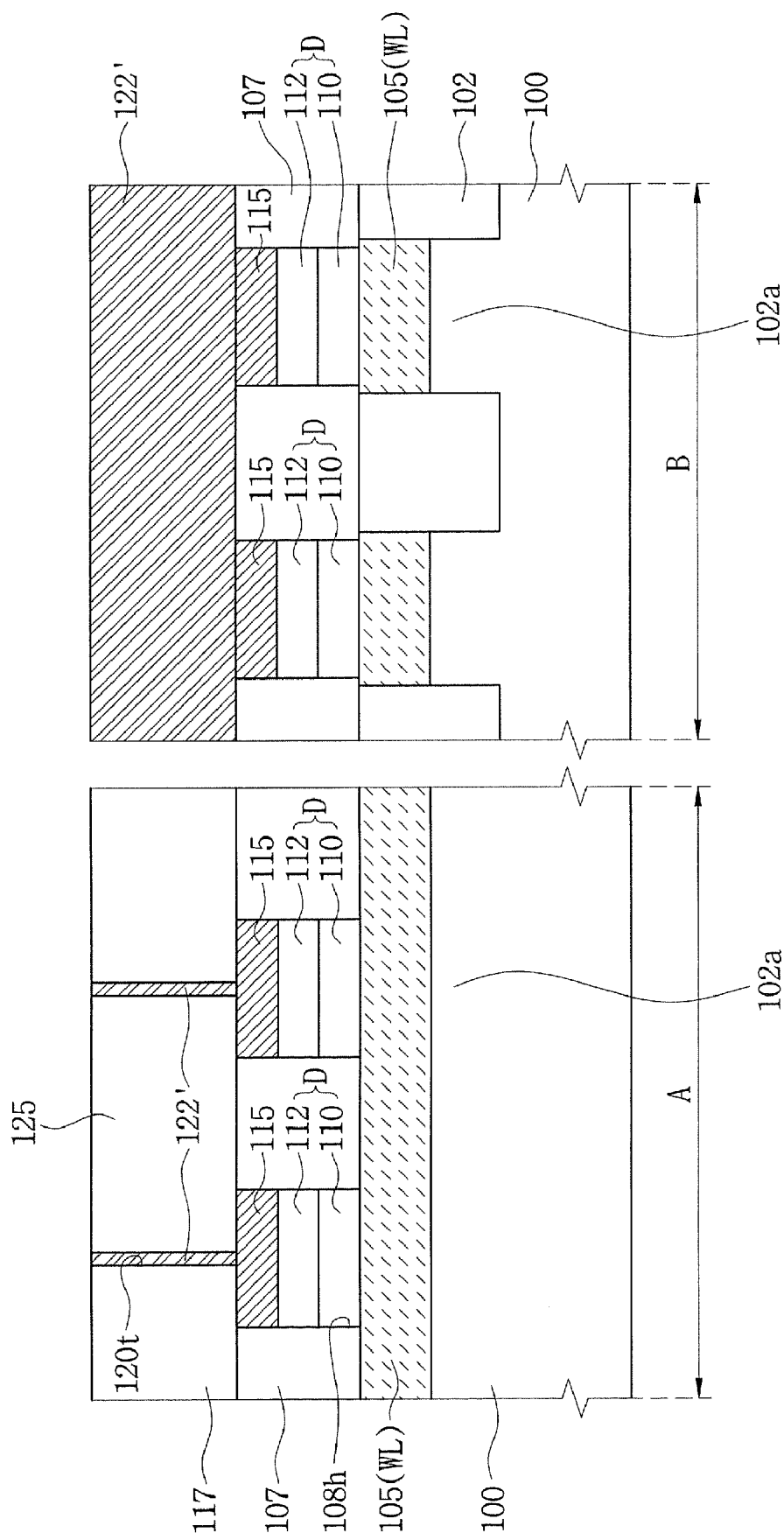

Referring to FIGS. 2 and 3C, the substrate having the bottom electrode layer 122 may be etched-back to form bottom electrode spacers 122' covering the sidewalls of the line-shaped trenches 120t. First insulating patterns 125 filling the line-shaped trenches 120t may be formed on the substrate having the bottom electrode spacers 122'. To detail this, forming the first insulating patterns 125 may include forming a first insulating layer on the substrate having the bottom electrode spacers 122', and planarizing the first insulating layer to expose top surfaces of the bottom electrode spacers 122'. The first insulating patterns 125 may be formed of an insulating layer such as a silicon oxide layer, a silicon nitride layer, a silicon oxynitride layer or combinations thereof. In some embodiments according to the invention, the first insulating patterns 125 may be formed of the same material layer as the second interlayer insulating layer 117.

In other embodiments, after the first insulating layer is planarized until the top surfaces of the bottom electrode spacers 122' are exposed, a planarization process may be carried out at least once to more uniformly form the height of the bottom electrode spacers 122' within the second interlayer insulating layer 117.

Figure 3D:
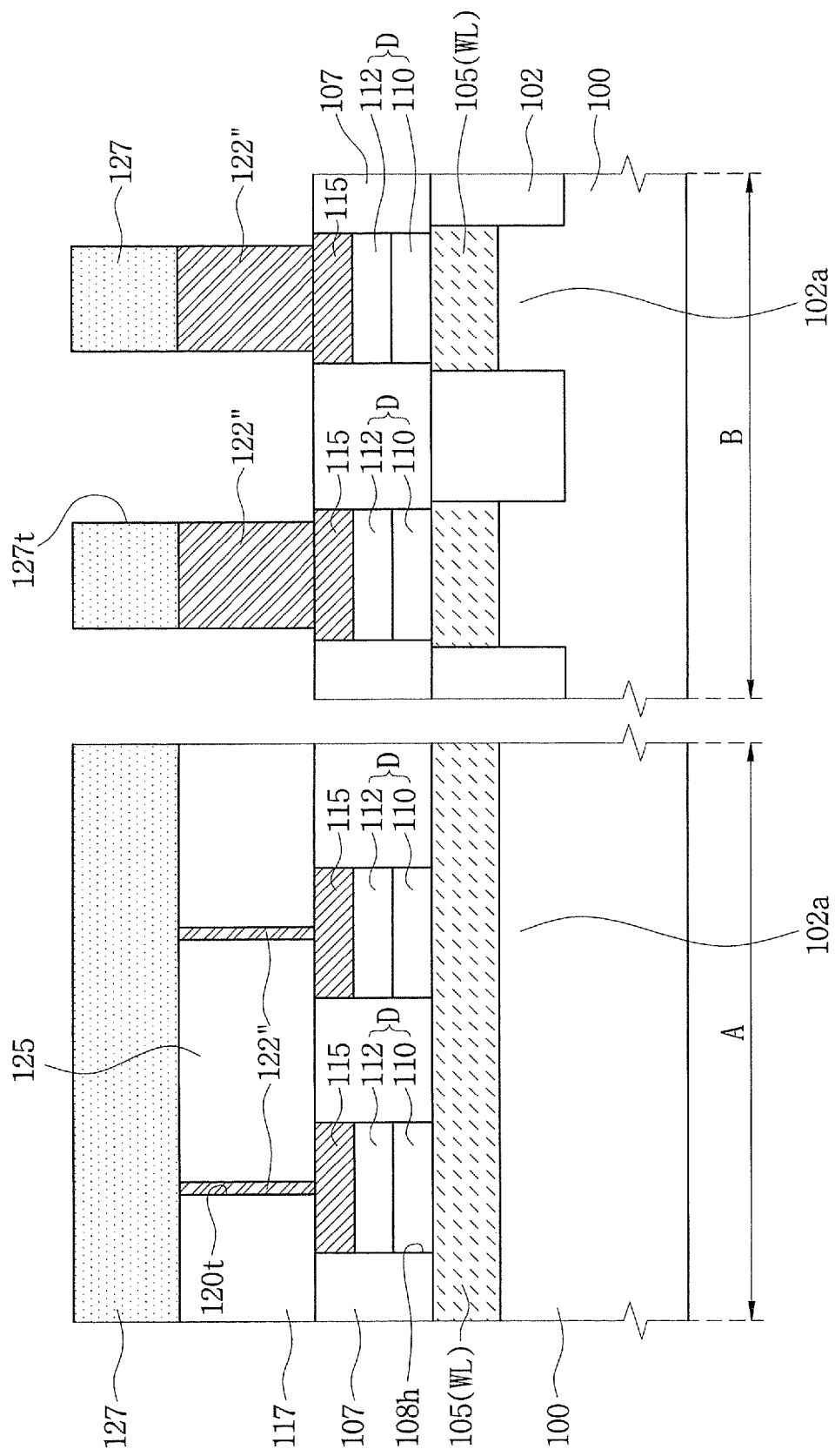

Referring to FIGS. 2 and 3D, line-shaped mask patterns 127 extending in an x-axis direction may be formed on the substrate having the first insulating patterns 125, the bottom electrode spacers 122' and the second interlayer insulating layer 117. The line-shaped mask patterns 127 may include line-shaped openings 127t exposing a top region between the neighboring diode electrodes 115 in a y-axis direction. The line-shaped mask patterns 127 may be formed of a material layer having an etch selectivity with respect to the second interlayer insulating layer 117, the first insulating patterns 125 and the bottom electrode spacers 122'. The line-shaped mask patterns 127 may be hard mask patterns or photoresist patterns. The hard mask pattern may be formed of a nitride layer.

Subsequently, the second interlayer insulating layer 117, the first insulating patterns 125, and the bottom electrode spacers 122' may be etched until the first interlayer insulating layer 107 or the diode electrodes 115 are exposed using the line-shaped mask patterns 127 as an etch mask. As a result, line-shaped bottom electrodes 122" are formed on the diode electrodes 115. The line-shaped bottom electrodes 122" have top surfaces defined by the x and y axes. The x-axis width of the top surface of the line-shaped bottom electrodes 122" becomes equal to the thickness of the bottom electrode spacers 122'. Accordingly, the x-axis of the top surface of the line-shaped bottom electrodes 122" may be formed to have a smaller width than a resolution limit of a photolithography process. Sections of the line-shaped bottom electrodes 122" in the x-axis direction may have a shape of number "1."

Figure 3E:
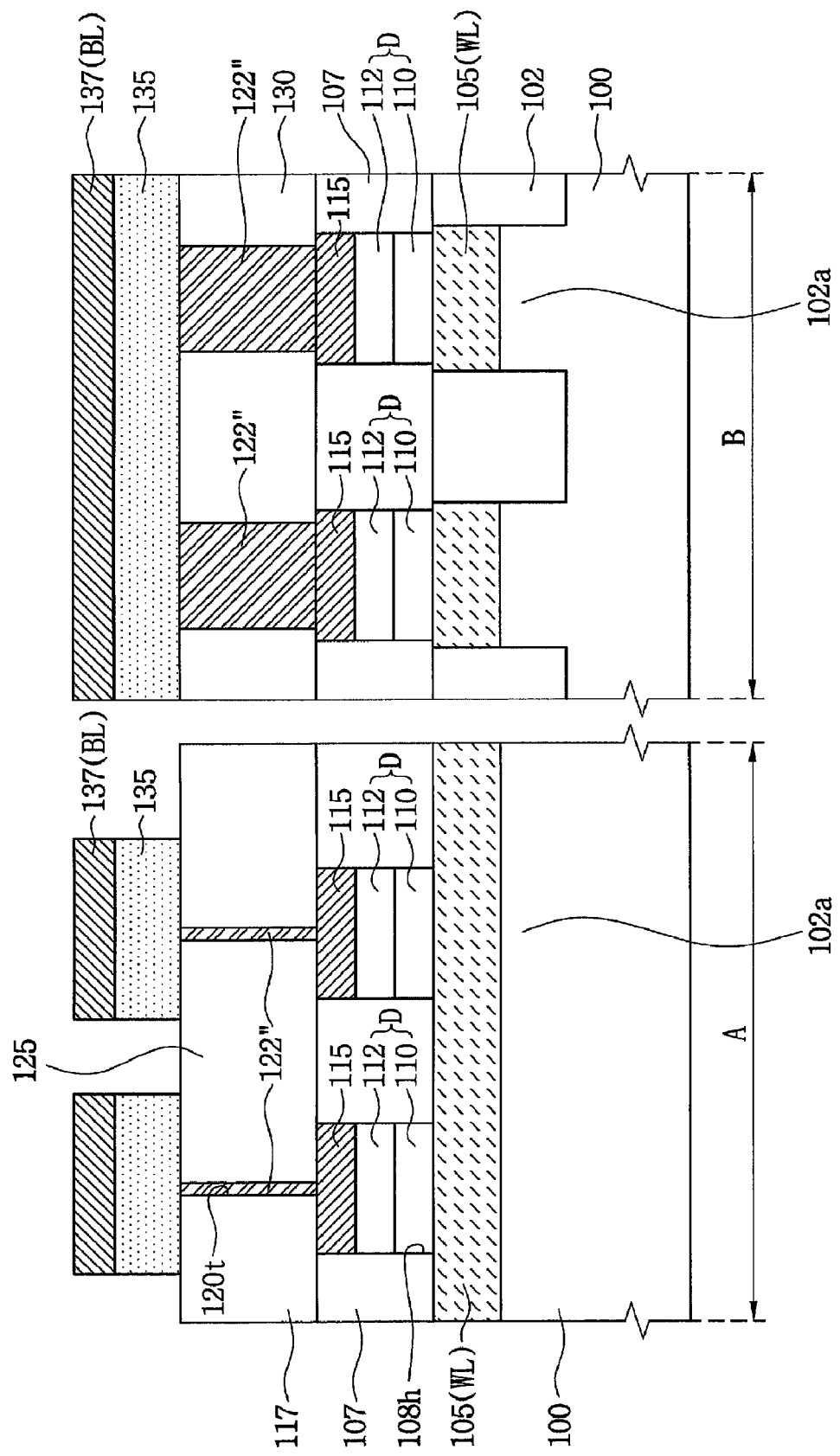

Referring to FIGS. 2 and 3E, the line-shaped mask patterns 127 may be removed. Subsequently, second insulating patterns 130 may be filled in the etched region. To detail this, a second insulating layer may be formed on the substrate having the etched region, and may be planarized until top surfaces of the line-shaped bottom electrodes 122" are exposed. Alternatively, the line-shaped mask patterns 127 may not be removed before forming the second insulating layer, and may be simultaneously removed together with the second insulating layer by the process of planarizing the second insulating layer.

A phase change pattern 135 and a top electrode 137 may be sequentially deposited on the substrate having the second insulating patterns 130 while being in contact with the line-shaped bottom electrodes 122". To detail this, a phase change layer and a top electrode layer may be sequentially formed on the substrate having the second insulating patterns 130. Subsequently, the top electrode layer and the phase change layer may be sequentially patterned to form the phase change pattern 135 and the top electrode 137.

The top electrodes 137 may act as a bit line BL. The phase change patterns 135 and the top electrodes 137 BL may extend in a direction parallel to the line direction of the line-shaped trenches 120t as shown in FIG. 3E. In some embodiments according to the invention, the phase change patterns 135 and the top electrodes 137 may extend in a direction perpendicular to the line direction of the line-shaped trenches 120t. The top electrodes 137 BL may extend in a direction perpendicular to the word lines 105 WL.

The phase change patterns 135 may be formed of a chalcogenide material layer. For example, in some embodiments according to the invention, the phase change patterns 135 may include a compound formed of at least two selected from the group consisting of Te, Se, Ge, Sb, Bi, Pb, Sn, Ag, As, S, Si, P, O and C. An interface layer (not shown) may be interposed between the phase change patterns 135 and the line-shaped bottom electrodes 122".

In some embodiments according to the invention, the top electrodes 137 BL may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

As described above, the line-shaped bottom electrodes 122" according to example embodiments of the present invention may have top surfaces defined by the x and y axes. The x-axis of the top surface of the line-shaped bottom electrodes 122" may have a smaller width than a resolution limit of a photolithography process. Accordingly, the line-shaped bottom electrodes 122" may overcome the patterning limit to have a smaller area than the conventional art. As a result, an interface area between the phase change pattern 135 and the line-shaped bottom electrode 122" where Joule heat is generated may be reduced so that a current to be applied during a reset operation may be reduced compared to the conventional art. In some embodiments according to the invention, the term "line-shaped" refers to the shape of an a complete outer boundary of the structure that directly contacts the phase change pattern 135. In some embodiments according to the invention, the terms x and y axes refer to directions with are orthogonal to one another.

Figure 4:
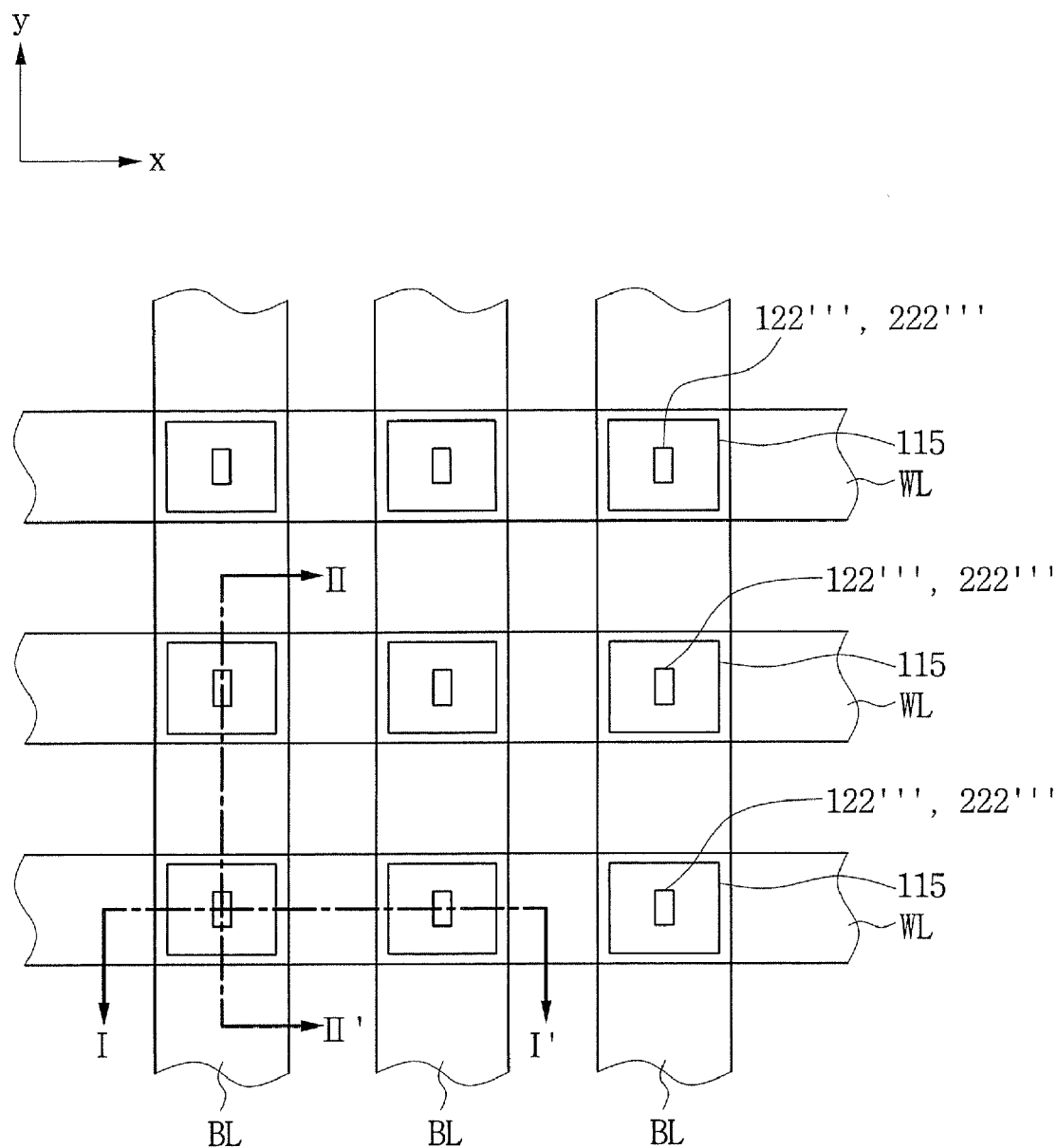
FIG. 4 is a plan view illustrating methods of fabricating a phase change memory device in some embodiments according to the invention
Figure 5A:
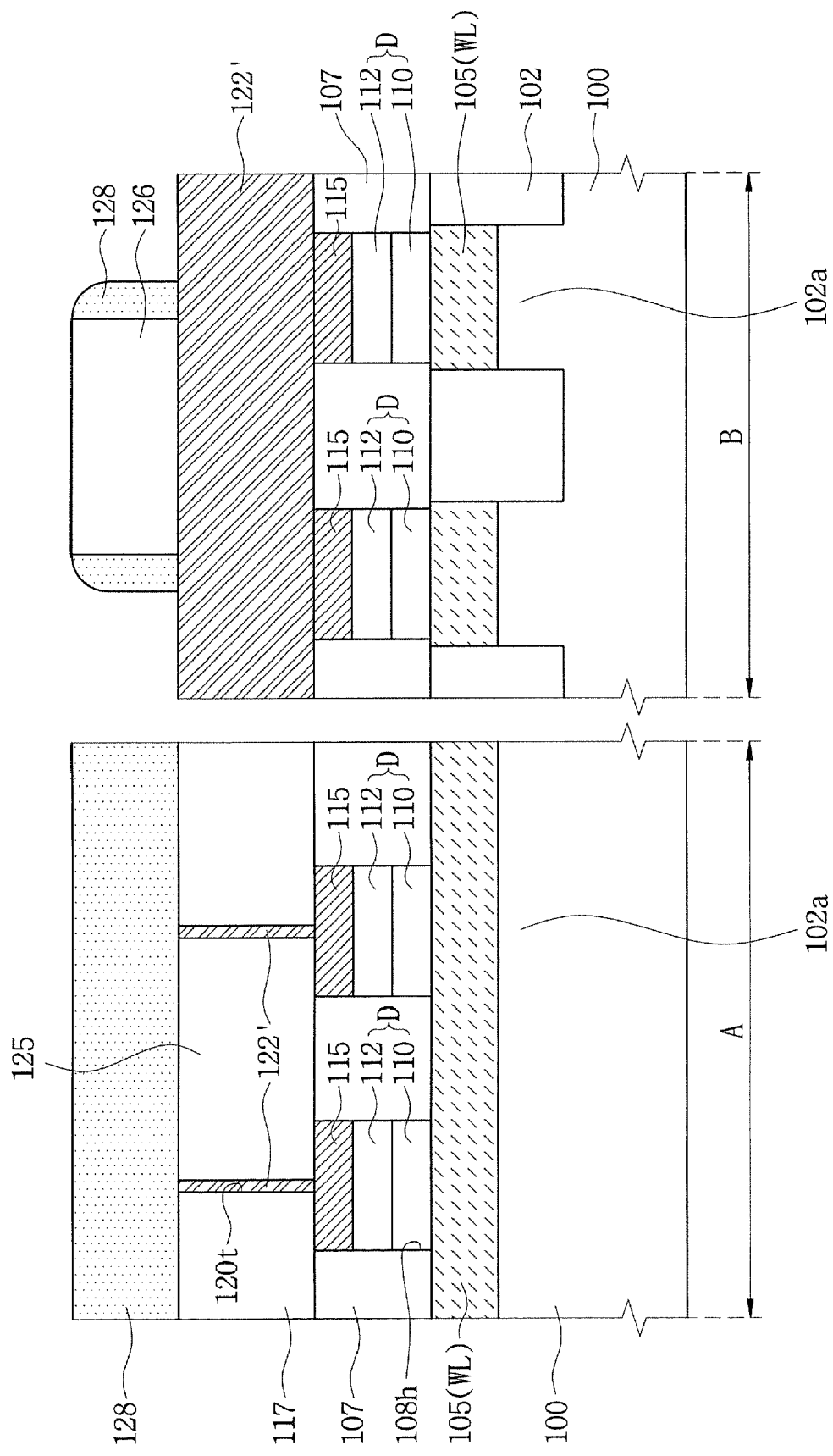
FIGS. 5A through 5C are cross-sectional views taken along lines I-I' and II-II' of FIG. 4, illustrating methods of fabricating a phase change memory device in some embodiments according to the invention.
Figure 5B:
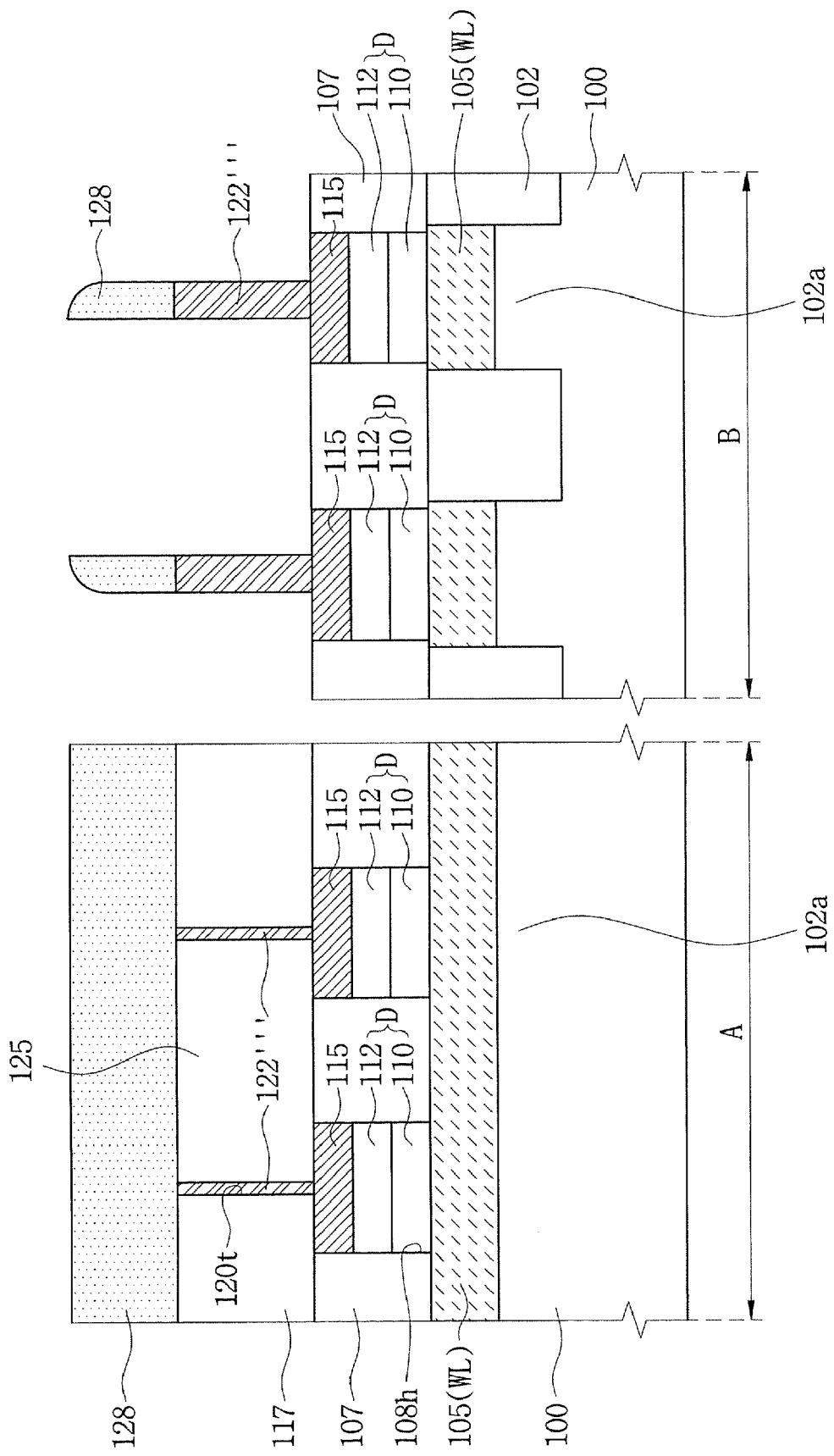
Figure 5C:
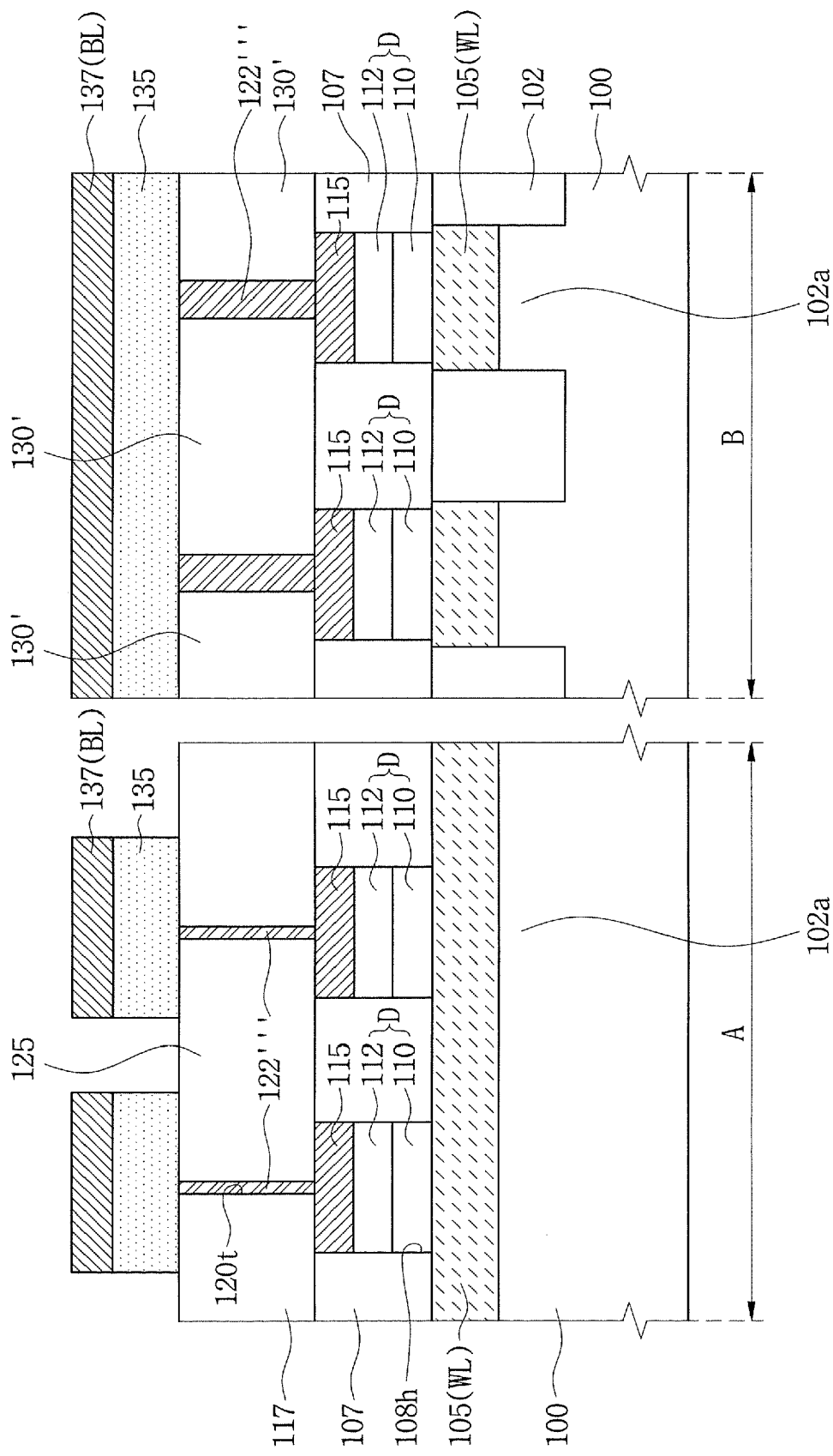

FIG. 4 is a plan view illustrating methods of fabricating a phase change memory device according to other example embodiments of the present invention, and FIGS. 5A through 5C are cross-sectional views taken along lines I-I' and II-II' of FIG. 4, illustrating methods of fabricating a phase change memory device according to other example embodiments of the present invention. Reference symbols A and B in FIGS. 5A through 5C indicate cross-sectional views taken along lines I-I' and II-II' of FIG. 4, respectively.

Referring to FIGS. 4 and 5A, in some embodiments according to the invention, the same process as the method described with reference to FIGS. 3A through 3C can be carried out up to the formation of the first insulating patterns 125 filling the line-shaped trenches 120t. Subsequently, line-shaped sacrificial patterns 126 extending in an x-axis direction may be formed on the substrate having the first insulating patterns 125. Sidewalls of the line-shaped sacrificial patterns 126 may be formed above the respective diode electrodes 115. The line-shaped sacrificial patterns 126 may be formed of a material layer having low etch selectivity with respect to the second interlayer insulating layer 117. The line-shaped sacrificial patterns 126 may be formed of an oxide layer. The line-shaped sacrificial patterns 126 may be formed of the same material layer as the second interlayer insulating layer 117.

Subsequently, mask spacers 128 may be formed on sidewalls of the line-shaped sacrificial patterns 126. The mask spacers 128 may be formed of a material layer having an etch selectivity with respect to the second interlayer insulating layer 117, the first insulating patterns 125 and the bottom electrode spacers 122'. The mask spacers 128 may be formed of a hard mask pattern or a photoresist pattern. The hard mask pattern may be formed of a nitride layer.

Referring to FIGS. 4 and 5B, the line-shaped sacrificial patterns 126, the second interlayer insulating layer 117, the bottom electrode spacers 122', and the first insulating patterns 125 may be etched until the diode electrodes 115 are exposed using the mask spacers 128 as an etch mask. As a result, line-shaped bottom electrodes 122''' may be formed on the diode electrodes 115.

The line-shaped bottom electrodes 122''' have top surfaces defined by the x and y axes. The x-axis width of the top surface of the line-shaped bottom electrodes 122''' becomes equal to the thickness of the bottom electrode spacers 122'. In addition, the y-axis width of the top surface of the line-shaped bottom electrodes 122''' becomes equal to the thickness of the mask spacers 128. Accordingly, both x and y axes of the top surface of the line-shaped bottom electrodes 122''' may be formed to have a smaller width than a resolution limit of a photolithography process. As a result, sections of the line-shaped bottom electrodes 122''' in the x and y axis direction may have a shape of number "1" (i.e., a lowercase letter "L").

Referring to FIGS. 4 and 5C, the mask spacers 128 may be removed. Subsequently, second insulating patterns 130' may be filled in the etched region. To detail this, a second insulating layer may be formed on the substrate having the etched region, and may be planarized until the top surfaces of the line-shaped bottom electrodes 122''' are exposed. Alternatively, the mask spacers 128 may not be removed before forming the second insulating layer, and may be simultaneously removed together with the second insulating layer by the process of planarizing the second insulating layer.

Subsequently, the same process as the method described with reference to FIG. 3E may be carried out to form the phase change pattern 135 and the top electrode 137 which are sequentially deposited on the substrate having the second insulating patterns 130' while being in contact with the line-shaped bottom electrodes 122'''. The top electrodes 137 may act as a bit line BL. The phase change patterns 135 and the top electrodes 137 BL may extend in a direction parallel to the line direction of the line-shaped trenches 120t as shown in FIG. 4. Alternatively, the phase change patterns 135 and the top electrodes 137 BL may extend in a direction perpendicular to the line direction of the line-shaped trenches 120t. The top electrodes 137 BL may extend in a direction perpendicular to the word lines 105 WL.

As described above, the line-shaped bottom electrodes 122''' according to example embodiments of the present invention may have top surfaces defined by the x and y axes. The x and y axes of the top surface of the line-shaped bottom electrodes 122''' may have smaller widths than a resolution limit of a photolithography process. Accordingly, the line-shaped bottom electrodes 122''' may overcome the patterning limit to have a smaller area than the conventional art. As a result, an interface area between the phase change pattern 135 and the line-shaped bottom electrode 122''' where Joule heat is generated may be reduced so that a current to be applied during a reset operation may be reduced compared to the conventional art.

Figure 6A:
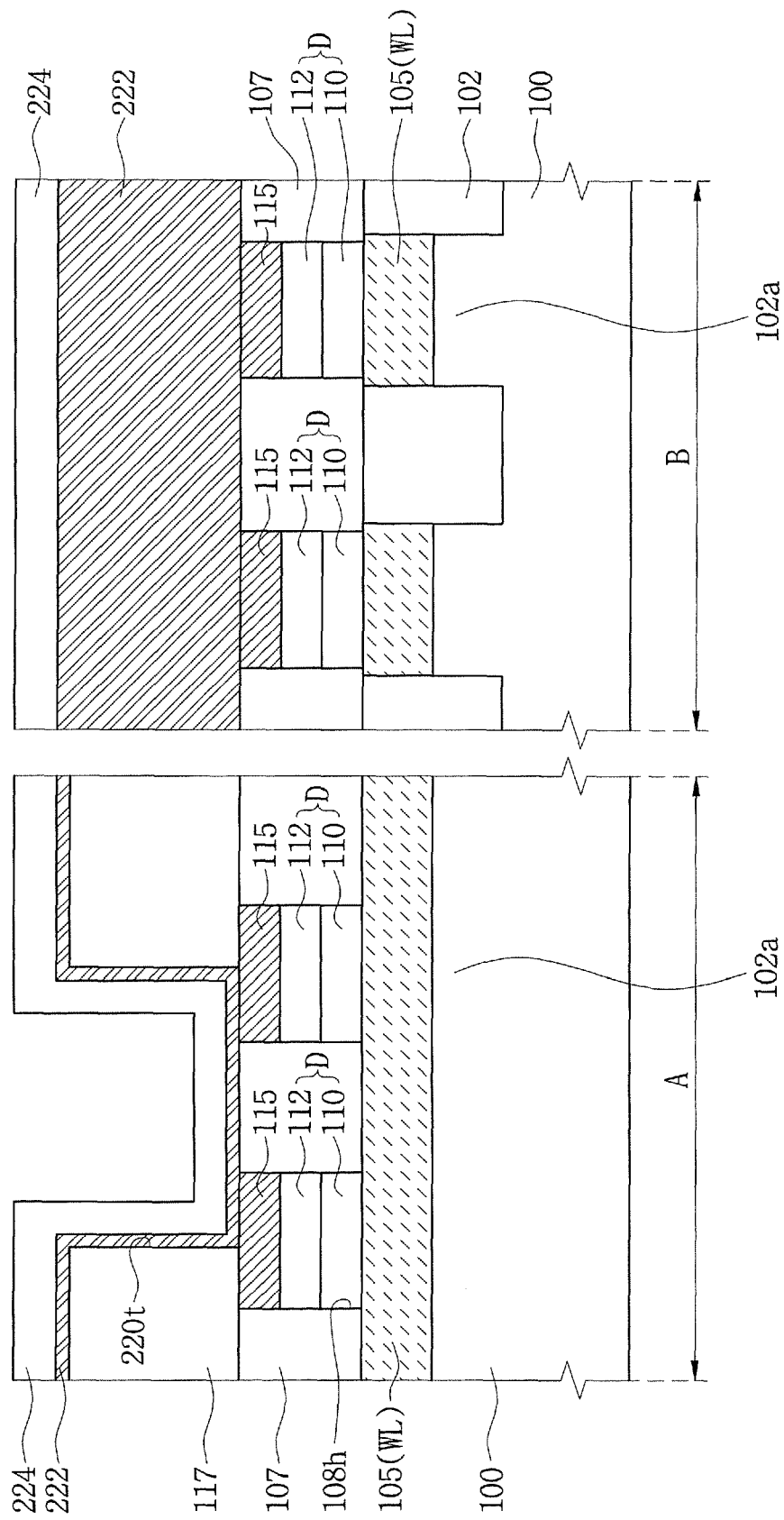
FIGS. 6A through 6C are cross-sectional views illustrating a method of fabricating a phase change memory device in some embodiments according to the invention.
Figure 6B:
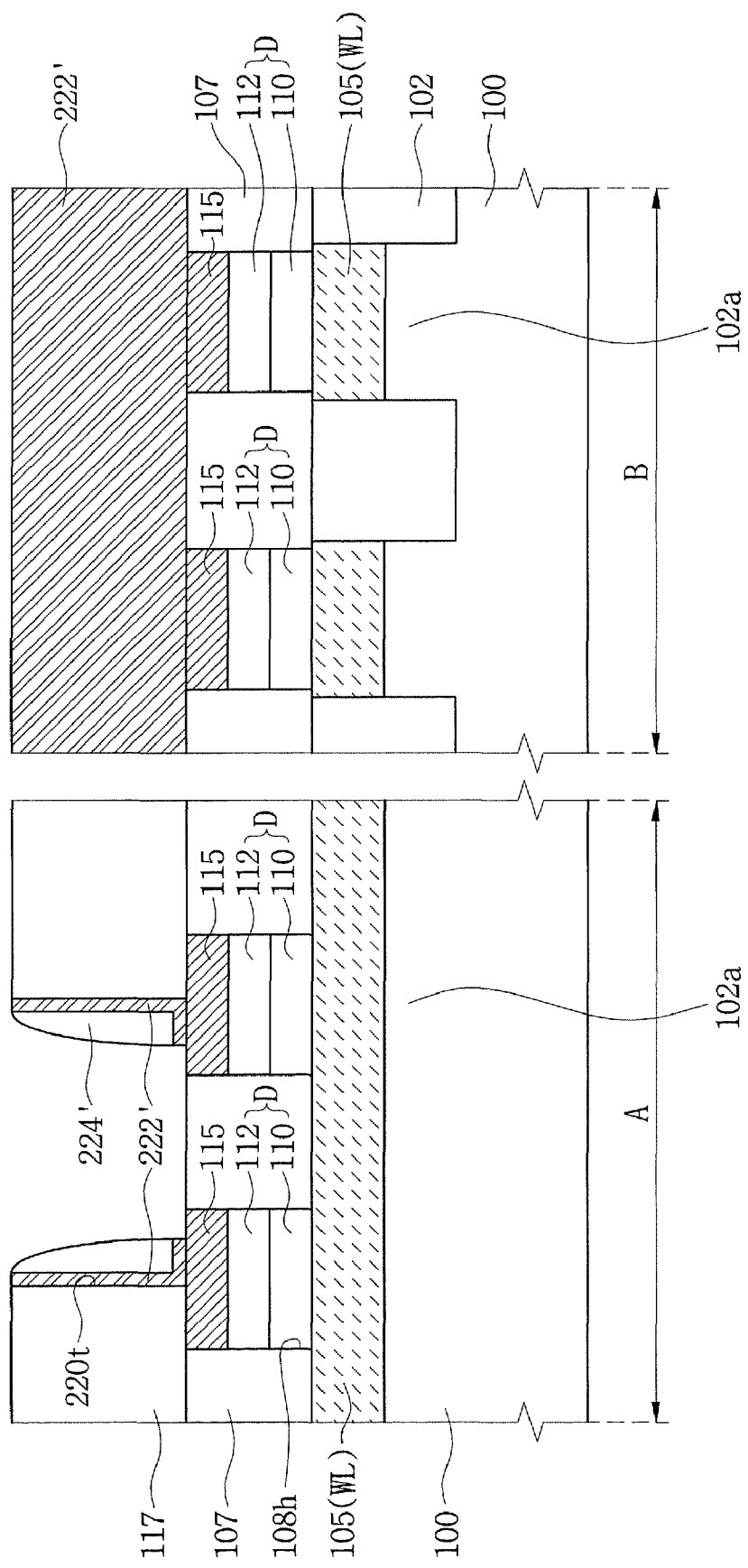
Figure 6C:
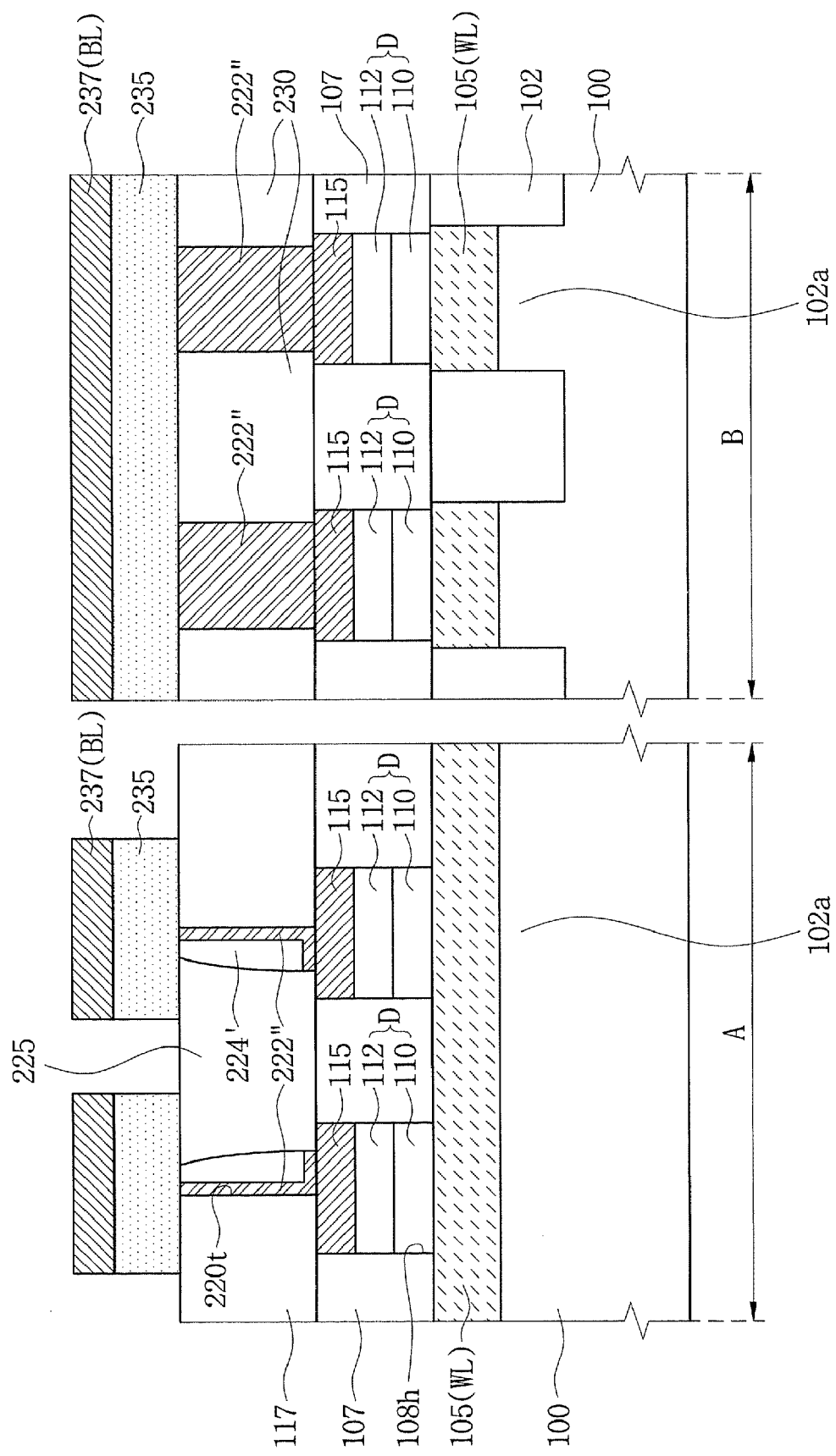

FIGS. 6A through 6C are cross-sectional views illustrating a method of fabricating a phase change memory device in some embodiments according to the invention, the term "line-shaped" refers to the shape of a complete outer boundary of the structure that directly contacts the phase change pattern 135. FIG. 2 is also referred to again.

Referring to FIGS. 2 and 6A, in some embodiments according to the invention, the same process as the method described with reference to FIGS. 3A and 3B may be carried out up to the formation of line-shaped trenches 220t and a bottom electrode layer 222. Subsequently, a spacer layer 224 may be formed along a step of the line-shaped trenches 220t on the substrate having the bottom electrode layer 222. A thickness of the spacer layer 224 may be freely changed. The spacer layer 224 may be formed of an oxide layer. The spacer layer 224 may be formed of the same material layer as the second interlayer insulating layer 117.

Referring to FIGS. 2 and 6B, the spacer layer 224 and the bottom electrode layer 222 may be sequentially etched-back until the first interlayer insulating layer 107 is exposed. As a result, L-shaped bottom electrode patterns 222' and spacers 224' may be formed to sequentially cover sidewalls of the line-shaped trenches 220t. The L-shaped bottom electrode patterns 222' may have a structure surrounding sidewalls and bottom surfaces of the spacers 224' as shown in FIG. 6B. Accordingly, the spacers 224' allow the L-shaped bottom electrode patterns 222' to have an L shape or a symmetrical structure of the L shape in the section along the x-axis. A bottom width of the L shape of the L-shaped bottom electrode patterns 222' may be freely changed depending on the thickness of the spacers 224'.

Alternatively, in some embodiments according to the invention, the bottom electrode layer 222 may be patterned (without the spacers 224') to form the L-shaped bottom electrode patterns covering sidewalls of the line-shaped trenches 220t.

Referring to FIGS. 2 and 6C, first insulating patterns 225 filling the line-shaped trenches 220t may be formed on the substrate having the L-shaped bottom electrode patterns 222' and the spacers 224'. The first insulating patterns 225 may be formed of the same material layer as the second interlayer insulating layer 117. The first insulating patterns 225 may be formed of an oxide layer.

Subsequently, the same process as the method described with reference to FIG. 3D may be carried out to form line-shaped mask patterns extending in the x-axis direction on the substrate having the first insulating patterns 225 and the L-shaped bottom electrode patterns 222'. The first insulating patterns 225, the spacers 224', the L-shaped bottom electrode patterns 222', and the second interlayer insulating layer 117 may be etched until the first interlayer insulating layer 107 or the diode electrodes 115 are exposed using the line-shaped mask patterns as an etch mask. As a result, L-shaped bottom electrodes 222" may be formed on the diode electrodes 115.

The L-shaped bottom electrodes 222" may have top surfaces defined by the x and y axes. The x-axis width of the top surface of the L-shaped bottom electrodes 222" becomes equal to the thickness of the bottom electrode layer 222. Accordingly, the x-axis of the top surface of the L-shaped bottom electrodes 222" may be formed to have a smaller width than a resolution limit of a photolithography process. The sections of the L-shaped bottom electrodes 222" in the x-axis direction may have an L shape or a symmetrical structure of the L shape.

Subsequently, the line-shaped mask patterns may be removed, and second insulating patterns 230 may be filled in the etched region. To detail this, a second insulating layer may be formed on the substrate having the etched region, and may be planarized until the top surfaces of the L-shaped bottom electrodes 222" are exposed. Alternatively, the line-shaped mask patterns may not be removed before forming the second insulating layer, and may be simultaneously removed together with the second insulating layer by the process of planarizing the second insulating layer.

Subsequently, the same method as the process described with reference to FIG. 3E may be carried out to form a phase change pattern 235 and a top electrode 237 which are sequentially deposited on the substrate having the second insulating patterns 230 while being in contact with the L-shaped bottom electrodes 222". The top electrodes 237 may be act as a bit line BL. The phase change patterns 235 and the top electrodes 237 BL may extend in a direction parallel to the line direction of the line-shaped trenches 220t as shown in FIG. 6C. Alternatively, the phase change patterns 235 and the top electrodes 237 BL may extend in a direction perpendicular to the line direction of the line-shaped trenches 220t. The top electrodes 137 BL may extend in a direction perpendicular to the word lines 105 WL.

As described above, the L-shaped bottom electrodes 222" according to example embodiments of the present invention may have top surfaces defined by the x and y axes. The x-axis of the top surface of the L-shaped bottom electrodes 222" may have a smaller width than a resolution limit of a photolithography process. Accordingly, an interface area between the phase change pattern 235 and the L-shaped bottom electrodes 222" where Joule heat is generated may be reduced so that a current to be applied during a reset operation may be reduced compared to the conventional art.

In addition, in some embodiments according to the invention, a contact area between the diode electrodes 115 and the L-shaped bottom electrodes 222", i.e., the bottom width of the L shape of the L-shaped bottom electrodes 222" may be adjusted depending on the thickness of the spacers 224', so that a contact area between the diode electrodes 115 and the L-shaped bottom electrodes 222" may be increased to reduce an interface resistance. Accordingly, the L-shaped bottom electrodes 222" may overcome the patterning limit to have a structure implementing a smaller top area and a reduced interface resistance between the diode electrodes 115 and the L-shaped bottom electrodes 222" compared to the conventional art.

Figure 7:
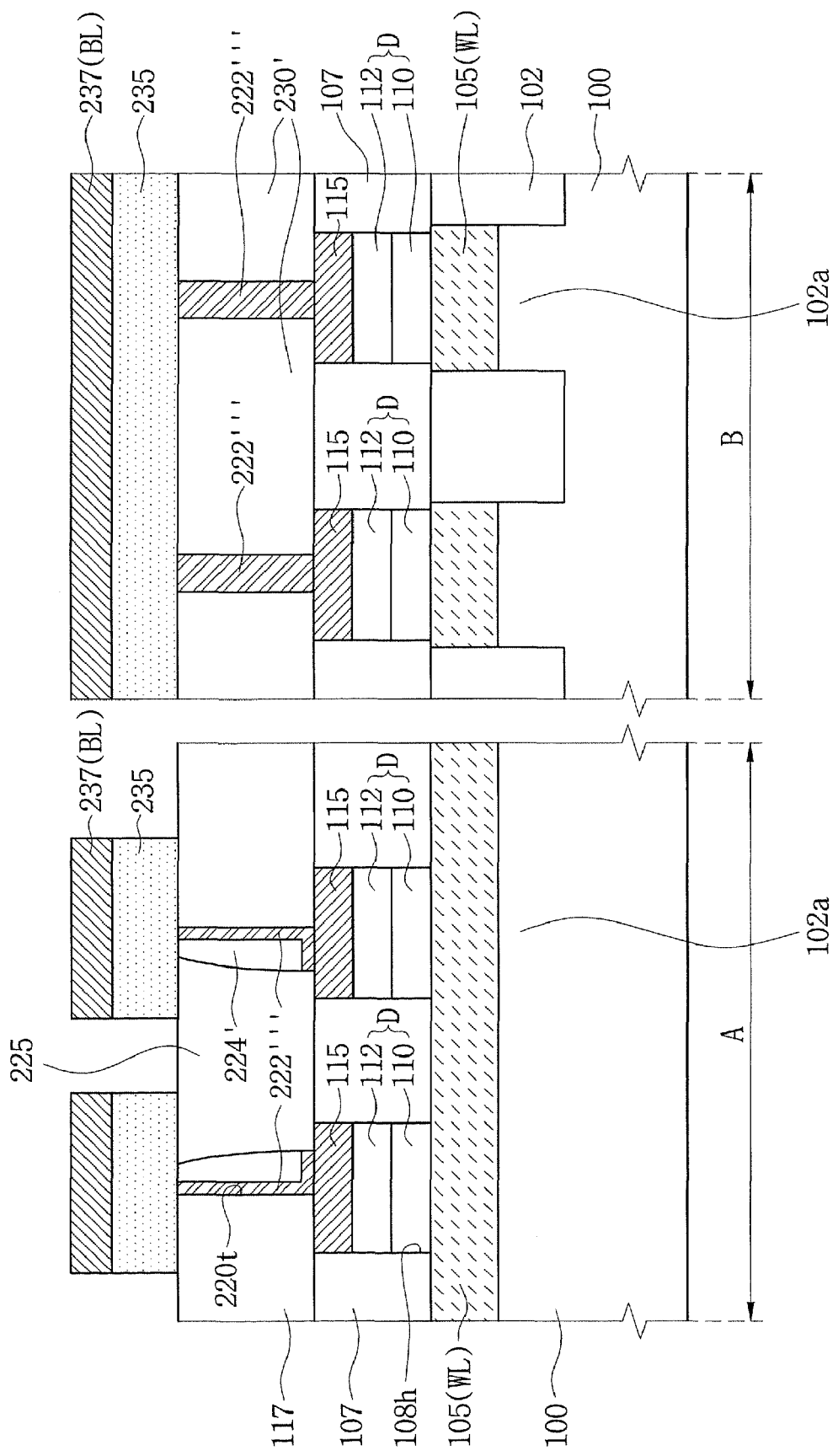
FIG. 7 is a cross-sectional view illustrating a method of fabricating a phase change memory device in some embodiments according to the invention.

FIG. 7 is a cross-sectional view illustrating a method of fabricating a phase change memory device according to yet other example embodiments of the present invention. FIG. 4 is also referred to again.

Referring to FIGS. 4 and 7, the same process as the method described with reference to FIGS. 6A and 6B may be carried out to form L-shaped bottom electrode patterns 222' and spacers 224' which sequentially cover sidewalls of the line-shaped trenches 220t. The L-shaped bottom electrode pattern 222' may have a structure surrounding the sidewalls and bottom surfaces of the spacers 224' as shown in FIG. 6B. Accordingly, the spacers 224' allow the L-shaped bottom electrode patterns 222' to have an L shape or a symmetrical structure of the L shape in the section along the x-axis. The bottom width of the L shape of the L-shaped bottom electrode patterns 222' may be freely changed depending on the thickness of the spacers 224'.

First insulating patterns 225 filling the line-shaped trenches 220t may be formed on the substrate having the L-shaped bottom electrode patterns 222' and the spacers 224'. The first insulating patterns 225 may be formed of the same material layer as the second interlayer insulating layer 117. The first insulating patterns 225 may be formed of an oxide layer.

Subsequently, the same process as the method described with reference to FIGS. 5A through 5C may be carried out to etch the second interlayer insulating layer 117, the L-shaped bottom electrode patterns 222', the spacers 224' and the first insulating patterns 225 until the diode electrodes 115 are exposed using the mask spacers (128 of FIG. 5B) as an etch mask. As a result, L-shaped bottom electrodes 222'" may be formed on the diode electrodes 115. The L-shaped bottom electrodes 222'" may have top surfaces defined by the x and y axes. The width of the x-axis of the top surface of the L-shaped bottom electrodes 222'" becomes equal to the thickness of the bottom electrode layer 222. In addition, the width of the y-axis of the top surface of the L-shaped bottom electrodes 222'" becomes equal to the thickness of the mask spacers (128 of FIG. 5B). Accordingly, both the x and y axes of the top surface of the L-shaped bottom electrodes 222'" may have smaller widths than a resolution limit of a photolithography process.

Subsequently, second insulating patterns 230' may be filled in the etched region after the mask spacers are removed. To detail this, a second insulating layer may be formed on the substrate having the etched region, and may be planarized until the top surfaces of the L-shaped bottom electrodes 222'" are exposed. In some embodiments according to the invention, the mask spacers may not be removed before forming the second insulating layer, and may be simultaneously removed together with the second insulating layer by the process of planarizing the second insulating layer.

Subsequently, the same process as the method described with reference to FIG. 3E may be carried out to form a phase change pattern 235 and a top electrode 237 which are sequentially deposited on the substrate having the second insulating patterns 230' while being in contact with the L-shaped bottom electrodes 222'". The top electrodes 237 may act as a bit line BL. The phase change patterns 235 and the top electrodes 237 BL may extend in a direction parallel to the line direction of the line-shaped trenches 220t. Alternatively, the phase change patterns 235 and the top electrodes 237 BL may extend in a direction perpendicular to the line direction of the line-shaped trenches 220t. The top electrodes 237 BL may extend in a direction perpendicular to the word lines 105 WL.

As described above, the L-shaped bottom electrodes 222'" according to yet other example embodiments of the present invention may have top surfaces defined by the x and y axes. The x and y axes of the top surface of the L-shaped bottom electrodes 222'" may have a smaller width than a resolution limit of a photolithography process. Accordingly, an interface area between the phase change pattern 235 and the L-shaped bottom electrodes 222'" where Joule heat is generated may be reduced so that a current to be applied during a reset operation may be reduced compared to the conventional art.

In addition, a contact area between the diode electrodes 115 and the L-shaped bottom electrodes 222'", i.e., the bottom width of the L shape of the L-shaped bottom electrodes 222'" may be adjusted depending on the thickness of the spacers 224', so that a contact area between the diode electrodes 115 and the L-shaped bottom electrodes 222'" may be increased to reduce an interface resistance. Accordingly, the L-shaped bottom electrodes 222'" can overcome the patterning limit to have a structure implementing a smaller top area and a reduced interface resistance between the diode electrodes 115 and the L-shaped bottom electrodes 222'" compared to the conventional art.

Figure 8A:
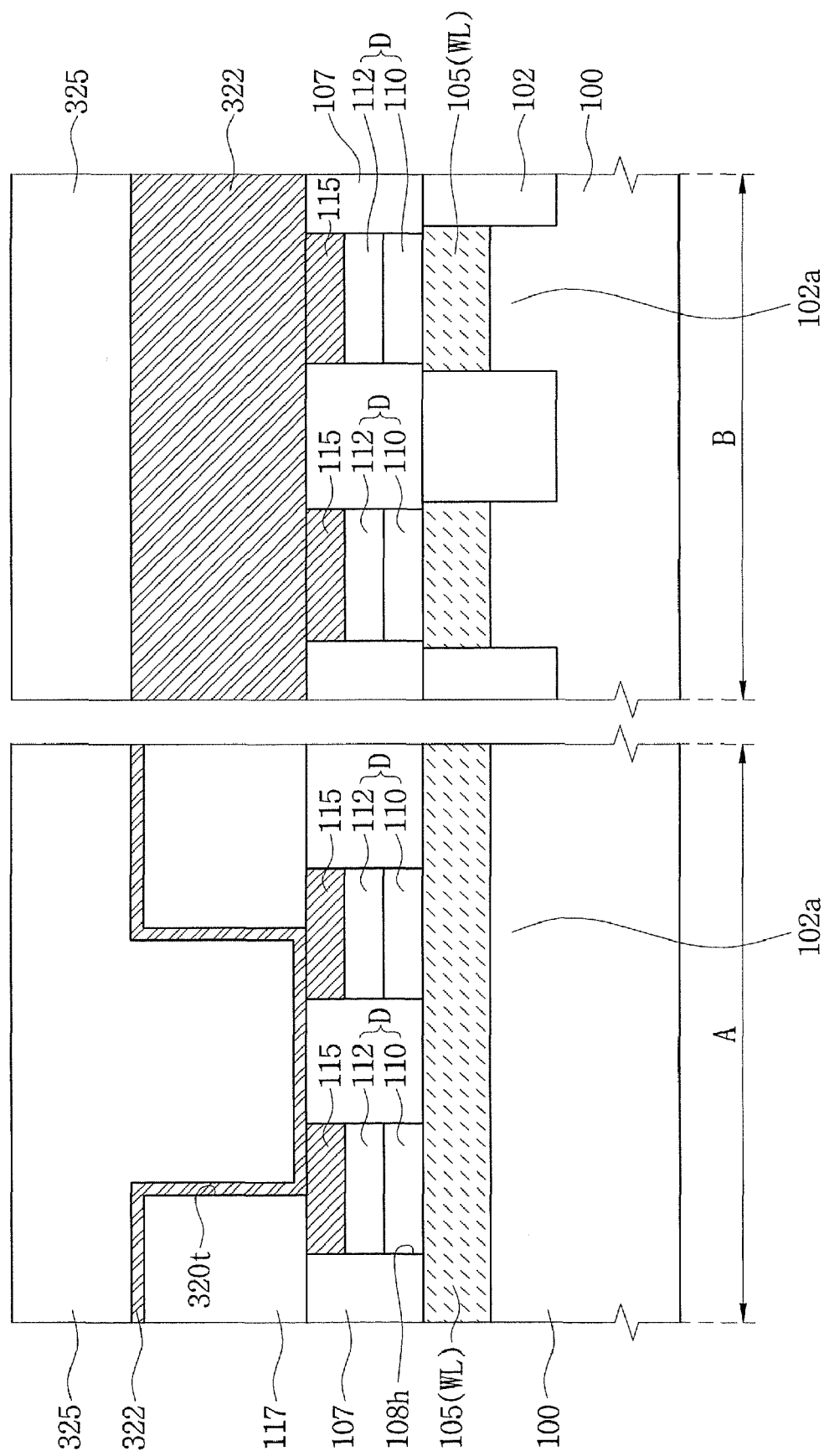
Figure 8B:
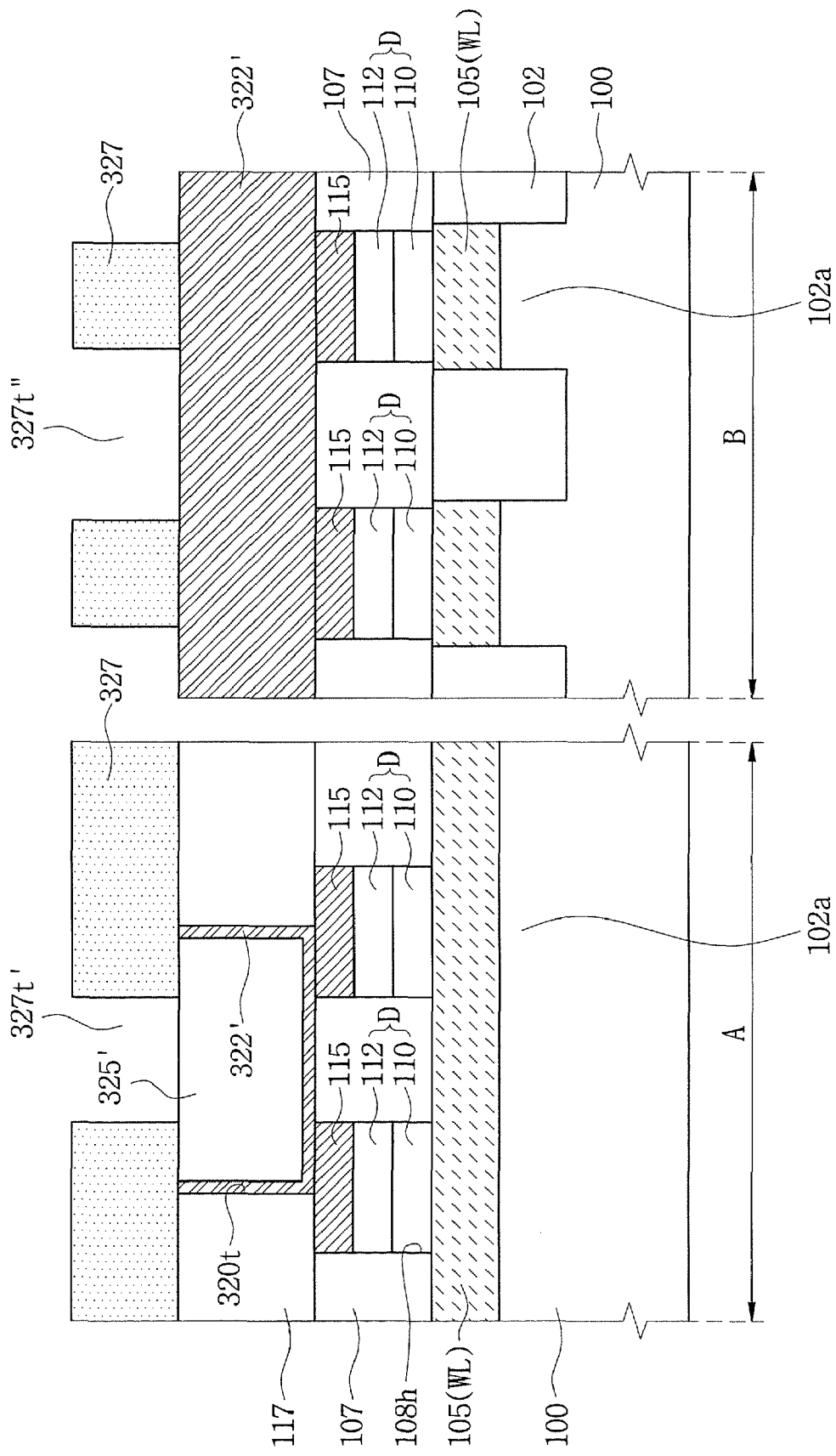

FIGS. 8A through 8C are cross-sectional views illustrating a method of fabricating a phase change memory device according to yet other example embodiments of the present invention. FIG. 2 is also referred to again.

Referring to FIGS. 2 and 8A, the same process as the method described with reference to FIGS. 3A and 3B may be carried out up to the formation of the line-shaped trenches 320t and the bottom electrode layer 322. Subsequently, an internal insulating layer 325 filling the line-shaped trenches 320t may be formed on the substrate having the bottom electrode layer 322. The internal insulating layer 325 may be formed of an insulating layer such as a silicon oxide layer, a silicon nitride layer, a silicon oxynitride layer or combinations thereof. The internal insulating layer 325 may be formed of the same material layer as the second interlayer insulating layer 117.

Referring to FIGS. 2 and 8B, the internal insulating layer 325 and the bottom electrode layer 322 may be planarized until the top surface of the second interlayer insulating layer 117 is exposed. As a result, bottom electrode patterns 322' covering sidewalls and bottom surfaces of the line-shaped trenches 320t, and internal insulating patterns 325' filling the line-shaped trenches 320t may be formed.

Mask patterns 327 having a first opening 327t' exposing a central region of the internal insulating pattern 325' in the y-axis direction and a second opening 327t" exposing a top region between the diode electrodes 115 in an x-axis direction may be formed on the substrate having the internal insulating patterns 325' and the bottom electrode patterns 322'. The mask patterns 327 may be hard mask patterns or photoresist patterns. The hard mask pattern may be formed of a nitride layer.

Referring to FIGS. 2 and 8C, the internal insulating patterns 325', the bottom electrode patterns 322', and the second interlayer insulating layer 117 may be etched until the first interlayer insulating layer 107 is exposed using the mask patterns 327 having the first opening 327t' and the second opening 327t" as an etch mask. As a result, L-shaped bottom electrodes 322" may be formed on the diode electrodes 115. The L-shaped bottom electrodes 322" may have top surfaces defined by the x and y axes. The width of the x-axis of the top surface of the L-shaped bottom electrodes 322" becomes equal to the thickness of the bottom electrode layer 322. Accordingly, the x-axis of the top surface of the L-shaped bottom electrodes 322" may have a smaller width than a resolution limit of a photolithography process. The sections of the L-shaped bottom electrodes 322" in the x-axis direction have an L shape or a symmetrical structure of the L shape.

Subsequently, insulating patterns 330 may be filled in the etched region after the mask patterns 327 are removed. To detail this, an insulating layer may be formed on the substrate having the etched region, and may be planarized until top surfaces of the L-shaped bottom electrodes 322" are exposed. Alternatively, the mask patterns 327 may not be removed before forming the insulating layer, and may be simultaneously removed together with the insulating layer by the process of planarizing the insulating layer.

Subsequently, the same process as the method described with reference to FIG. 3E may be carried out to form a phase change pattern 335 and a top electrode 337 which are sequentially deposited on the substrate having the insulating patterns 330 while being in contact with the L-shaped bottom electrodes 322". The top electrodes 337 may act as a bit line BL. The phase change patterns 335 and the top electrodes 337 BL may extend in a direction parallel to the line direction of the line-shaped trenches 320t. Alternatively, the phase change patterns 335 and the top electrodes 337 BL may extend in a direction perpendicular to the line direction of the line-shaped trenches 320t. The top electrodes 337 BL may extend in a direction perpendicular to the word lines 105 WL.

As described above, the L-shaped bottom electrodes 322" according to example embodiments of the present invention may have top surfaces defined by the x and y axes. The x axis of the top surface of the L-shaped bottom electrodes 322" may have a smaller width than a resolution limit of a photolithography process. Accordingly, an interface area between the phase change pattern 335 and the L-shaped bottom electrodes 322" where Joule heat is generated may be reduced so that a current to be applied during a reset operation may be reduced compared to the conventional art.

In addition, a contact area between the diode electrodes 115 and the L-shaped bottom electrodes 322" may be adjusted by the width of the first openings 327t', so that the contact area may be increased as many as possible to minimize the interface resistance. Accordingly, the L-shaped bottom electrodes 322" may overcome the patterning limit to have a structure implementing a smaller top area and a reduced interface resistance between the diode electrodes 115 and the L-shaped bottom electrodes 322" compared to the conventional art.

Figure 9:
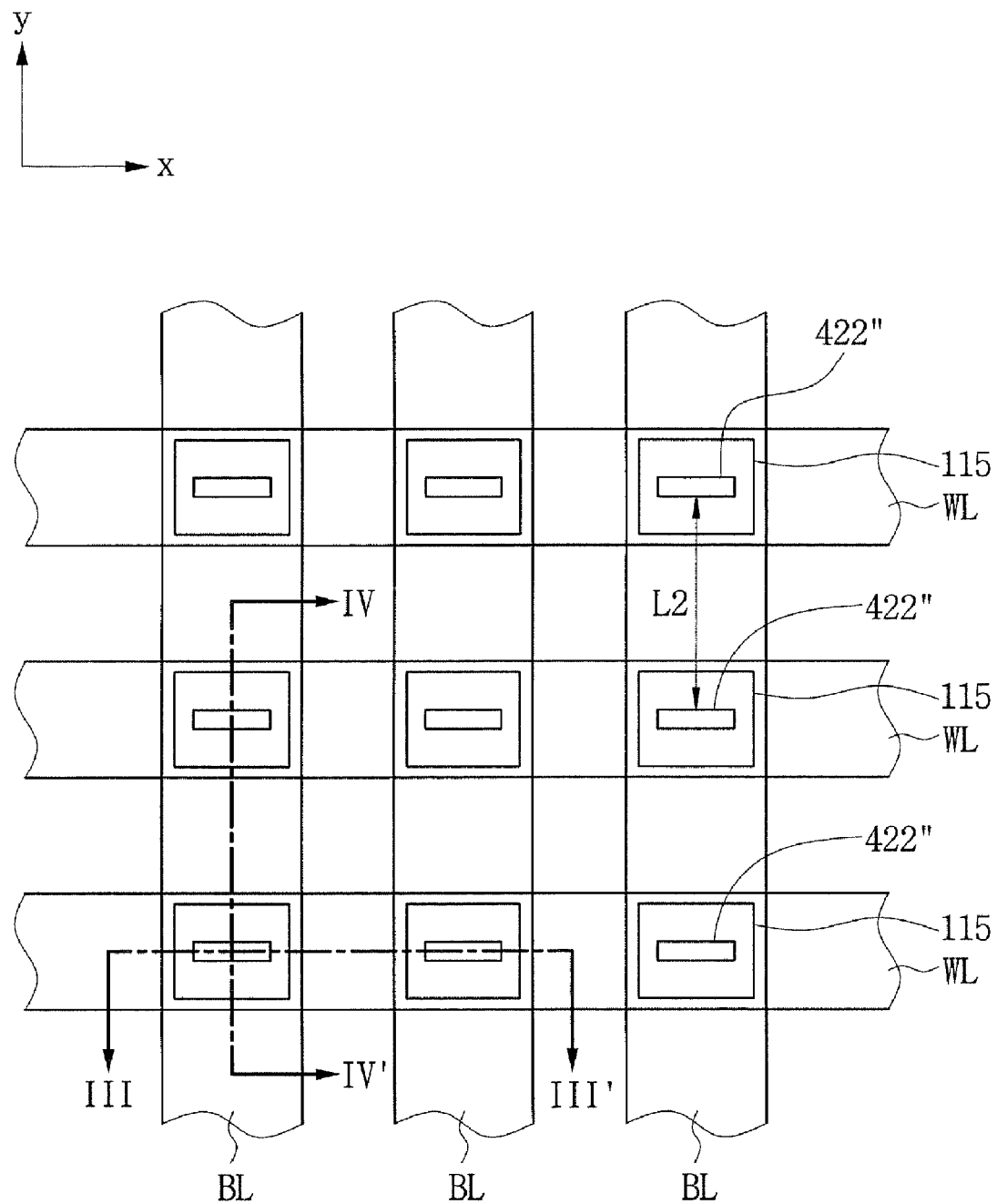
FIG. 9 is a plan view illustrating methods of fabricating a phase change memory device in some embodiments according to the invention.
Figure 10:
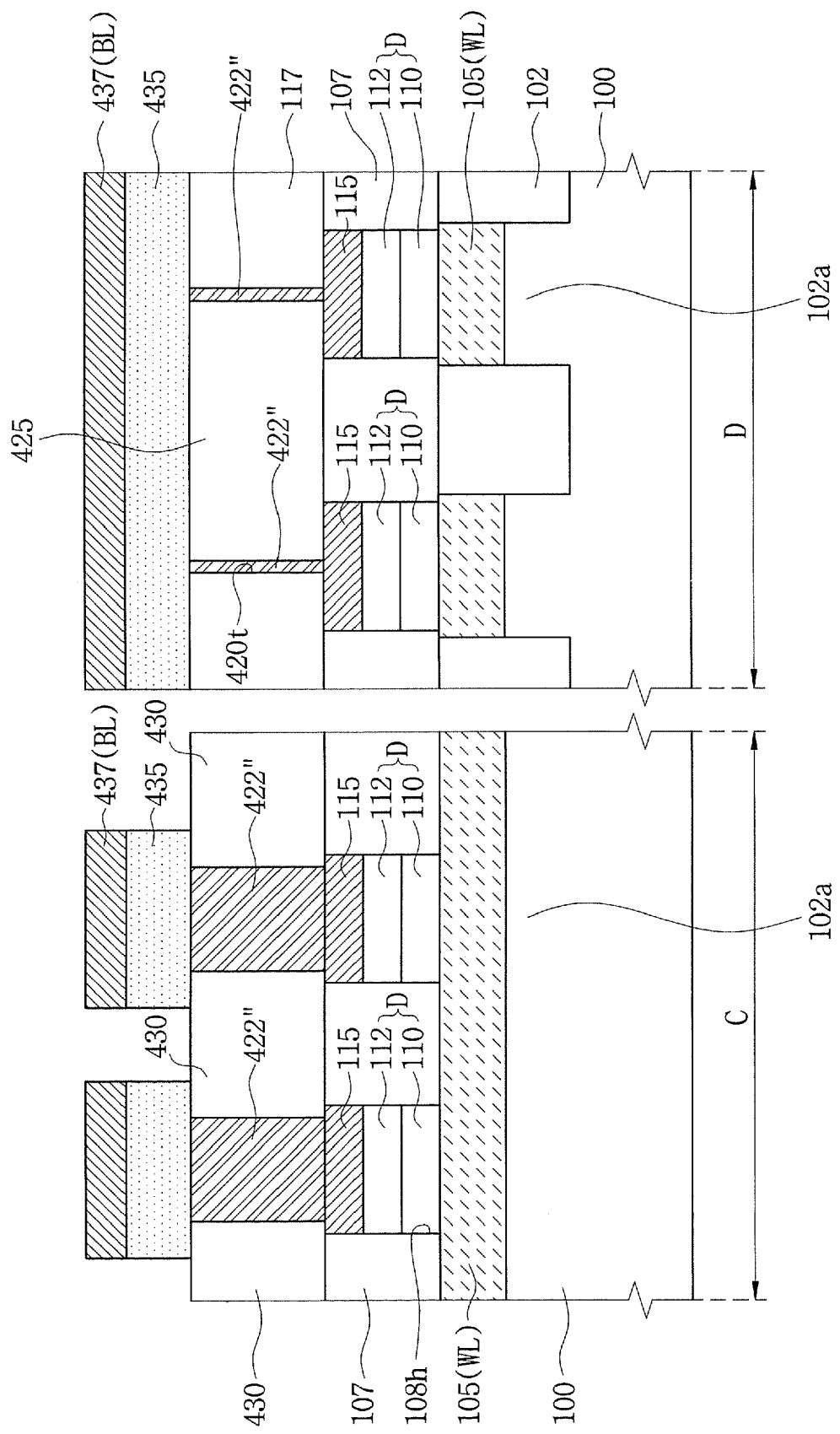
FIG. 10 is a cross-sectional view taken along lines III-III' and IV-IV' of FIG. 9, illustrating methods of fabricating a phase change memory device in some embodiments according to the invention.

FIG. 9 is a plan view illustrating methods of fabricating a phase change memory device according to yet other example embodiments of the present invention, and FIG. 10 is a cross-sectional view taken along lines III-III' and IV-IV' of FIG. 9. Reference symbols C and D of FIG. 10 indicate cross-sectional views taken along lines III-III' and IV-IV' of FIG. 9, respectively.

Referring to FIGS. 9 and 10, the same process as the method described with reference to FIG. 3A may be carried out up to the formation of the diode electrodes 115 within the first interlayer insulating layer 107.

Subsequently, a second interlayer insulating layer 117 may be formed on the substrate 100 having the diode electrodes 115. The second interlayer insulating layer 117 may be patterned to form line-shaped trenches 420t, which extend in an x-axis direction and simultaneously expose portions of the two neighboring diode electrodes 115 in a y-axis direction, within the second interlayer insulating layer 117. That is, the line-shaped trenches 420t may be formed in a direction perpendicular to the line-shaped trenches 120t shown in FIG. 3B.

Subsequently, bottom electrode spacers may be formed on sidewalls of the line-shaped trenches 420t. First insulating patterns 425 filling the line-shaped trenches 420t may be formed on the substrate having the bottom electrode spacers. The first insulating patterns 425 may be formed of an insulating layer such as a silicon oxide layer, a silicon nitride layer, a silicon oxynitride layer or combinations thereof. In addition, in some embodiments according to the invention, the first insulating patterns 425 may be formed of the same material layer as the second interlayer insulating layer 117.

Alternatively, in some embodiments according to the invention, instead of the bottom electrode spacers, L-shaped bottom electrode patterns having the same structure as the L-shaped bottom electrode patterns 222' shown in FIG. 6B may be formed on sidewalls of the line-shaped trenches 420t.

Line-shaped mask patterns extending in the y-axis may be formed on the substrate having the first insulating patterns 425, the bottom electrode spacers and the second interlayer insulating layer 117. The line-shaped mask patterns may include line-shaped openings exposing a top region between the neighboring diode electrodes 115 in the x-axis direction. The line-shaped mask patterns may be formed of a material layer having an etch selectivity with respect to the second interlayer insulating layer 117, the first insulating patterns 425 and the bottom electrode spacers.

Subsequently, the second interlayer insulating layer 117, the first insulating patterns 425, and the bottom electrode spacers may be etched until the first interlayer insulating layer 107 or the diode electrodes 115 are exposed using the line-shaped mask patterns as an etch mask. As a result, line-shaped bottom electrodes 422" may be formed on the diode electrodes 115. The line-shaped bottom electrodes 422" may have top surfaces defined by the x and y axes. The y-axis width of the top surface of the line-shaped bottom electrodes 422" becomes equal to the thickness of the bottom electrode spacers. Accordingly, the y-axis of the top surface of the line-shaped bottom electrodes 422" may have a smaller width than a resolution limit of a photolithography process. The sections of the line-shaped bottom electrodes 422" in the y-axis direction may have a shape of number "1."

Alternatively, in some embodiments according to the invention, when L-shaped bottom electrode patterns are formed on sidewalls of the line-shaped trenches 120t, the first insulating patterns 425, the L-shaped bottom electrode patterns, and the second interlayer insulating layer 117 may be etched until the first interlayer insulating layer 107 or the diode electrodes 115 are exposed using the line-shaped mask patterns as an etch mask. As a result, L-shaped bottom electrodes may be formed on the diode electrodes 115. The L-shaped bottom electrodes may have top surfaces defined by the x and y axes. The y-axis of the top surface of the L-shaped bottom electrodes may have a smaller width than a resolution limit of a photolithography process. The sections of the L-shaped bottom electrodes in the y-axis direction may have an L shape or a symmetrical structure of the L shape.

Subsequently, second insulating patterns 430 may be filled in the etched region after the line-shaped mask patterns are removed. To detail this, a second insulating layer may be formed on the substrate having the etched region, and may be planarized until the top surfaces of the line-shaped bottom electrodes 422" are exposed. Alternatively, the line-shaped mask patterns may not be removed before forming the second insulating layer, and may be simultaneously removed together with the second insulating layer by the process of planarizing the second insulating layer.

A phase change pattern 435 and a top electrode 437 may be sequentially deposited on the substrate having the second insulating patterns 430 while being in contact with the line-shaped bottom electrodes 422". The top electrodes 437 may act as a bit line BL. The top electrodes 437 BL may be formed in a direction perpendicular to the word lines 105 WL. The phase change patterns 435 and the top electrodes 437 BL may be formed in a direction perpendicular to the line direction of the line-shaped trenches 420t. As a result, a distance L2 between the line-shaped bottom electrodes 422" sharing the phase change pattern 435 may be greater than a distance L1 between the line-shaped bottom electrodes 122" shown in FIG. 2. Therefore, thermal disturbance between cells may be reduced.

In addition, the phase change memory device shown in the plan view of FIG. 4 may also have a structure that the bottom electrodes 122''' and 222''' are rotated by 90° on the plan view as shown in FIGS. 9 and 10.

Figure 11:
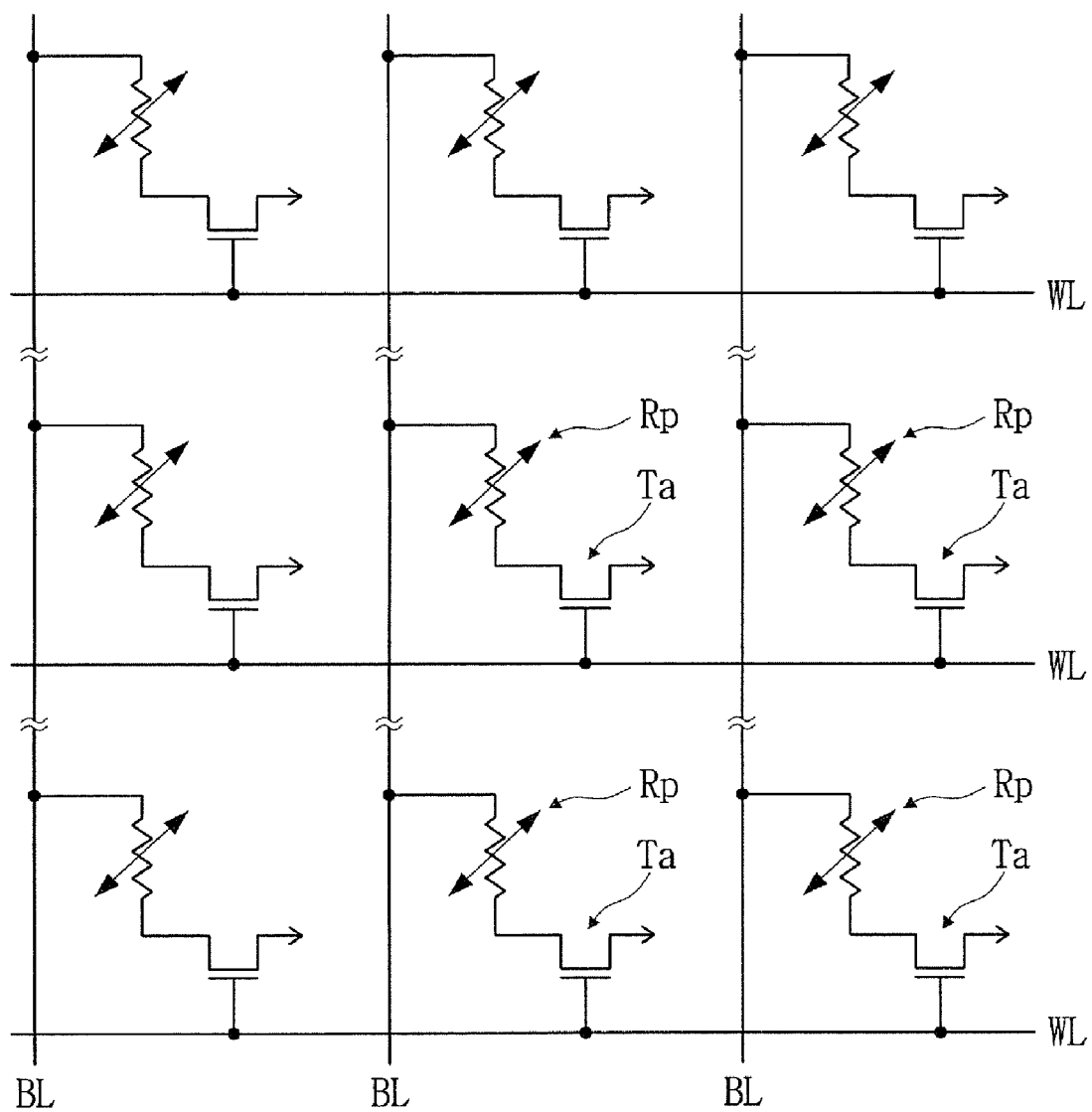
FIG. 11 is an equivalent circuit diagram of a portion of a cell array region of a phase change memory device in some embodiments according to the invention.
Figure 12:
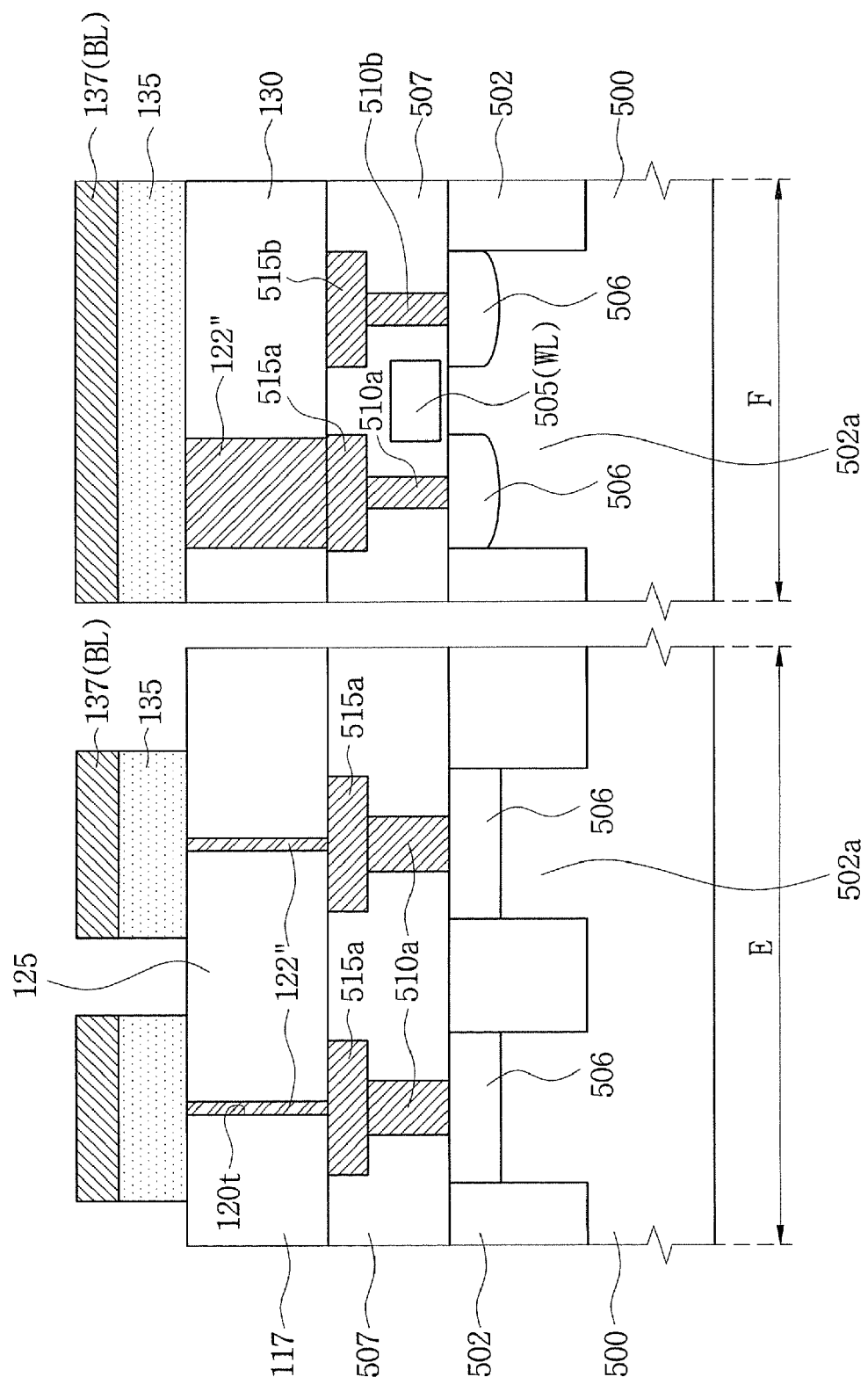
FIG. 12 is a cross-sectional view illustrating methods of fabricating a phase change memory device in some embodiments according to the invention corresponding to the equivalent circuit diagram of FIG. 11.

FIG. 11 is an equivalent circuit diagram illustrating a portion of a cell array region of a phase change memory device according to yet other example embodiments of the present invention, and FIG. 12 is a cross-sectional view illustrating methods of fabricating a phase change memory device according to yet other example embodiments of the present invention corresponding to the equivalent circuit diagram of FIG. 11. Reference symbols E and F of FIG. 12 respectively indicate cross-sectional views in the x and y axis directions of the phase change memory device according to yet other example embodiments of the present invention corresponding to the equivalent circuit diagram of FIG. 11.

Referring to FIG. 11, the phase change memory device according to yet other example embodiments of the present invention may include bit lines BL disposed parallel to each other in a column direction, word lines WL disposed parallel to each other in a row direction, a plurality of phase change patterns Rp, and a plurality of transistors Ta.

The bit lines BL may intersect the word lines WL. The phase change patterns Rp may be disposed at respective intersections between the bit lines BL and the word lines WL. Each of the phase change patterns Rp may be serially connected to source and drain regions of the corresponding one of the transistors Ta. In addition, each of the phase change patterns Rp may be connected to the corresponding one of the bit lines BL. Each of the transistors Ta may be connected to the corresponding one of the word lines WL. The transistors Ta may act as an access device. However, the transistors Ta may be omitted. Alternatively, the access device may be a diode.

Referring to FIG. 12, an isolation layer 502 defining active regions 502a may be formed on the substrate 500. Word lines 505 WL may be formed on the active regions 502a. Source and drain regions 506 may be formed within the active regions 502a adjacent to both sides of the word lines 505 WL. A bottom insulating layer 507 may be formed to cover the substrate 500 having the word lines 505 WL. The word line 505 WL, the active region 502a, and the source and drain regions 506 may constitute a transistor (Ta of FIG. 11).

First plugs 510a and second plugs 510b may be formed within the bottom insulating layer 507. Drain pads 515a and source lines 515b may be formed on the first plugs 510a and the second plugs 510b, respectively. The drain pads 515a and the source lines 515b may be formed within the bottom insulating layer 507. The drain pads 515a may be electrically connected to one selected region of the source and drain regions 506 by the first plugs 510a penetrating the bottom insulating layer 507. The source lines 515b may be electrically connected to the other selected region of the source and drain regions 506 by the second plugs 510b penetrating the bottom insulating layer 507.

Subsequently, the same process as the method described with reference to FIGS. 3B through 3E may be carried out up to the formation of the top electrode 137 BL.

The phase change memory device according to example embodiments of the present invention will now be described with reference back to FIGS. 2, 3E, and 6C.

Referring to FIGS. 2, 3E, and 6C, the phase change memory device may have an isolation layer 102 defining active regions 102a in a predetermined region of a substrate 100. A semiconductor substrate such as a silicon wafer or a SOI wafer may be employed for the substrate 100. The substrate 100 may have first conductivity type impurity ions. The isolation layer 102 may be a silicon oxide layer, a silicon nitride layer, a silicon oxynitride layer, or combinations thereof. The active regions 102a may have a line-shaped structure.

The active regions 102a may include impurity ions of a second conductivity type different from the first conductivity type so that the active regions may act as word lines WL 105. Hereinafter, it is assumed that the first and second conductivity types are P and N types for simplicity of description, respectively. However, the first and second conductivity types may be N and P types, respectively.

A first interlayer insulating layer 107 may be disposed on the substrate 100 having the word lines WL 105 and the isolation layer 102. The first interlayer insulating layer 107 may include a silicon oxide layer, a silicon nitride layer, a silicon oxynitride layer, or combinations thereof. Contact holes 108h may be disposed through the first interlayer insulating layer 107 to expose a predetermined region of the word lines WL 105. First and second semiconductor patterns 110 and 112 may be sequentially disposed within the contact holes 108h. The first and second semiconductor patterns 110 and 112 may constitute diodes D.

The first semiconductor pattern 110 may be in contact with the word lines WL 105. The first semiconductor pattern 110 may include the second conductivity type impurity ions. The second semiconductor pattern 112 may include the first conductivity type impurity ions. Alternatively, the first semiconductor pattern 110 may include the first conductivity type impurity ions and the second semiconductor pattern 112 may include the second conductivity type impurity ions.

Diode electrodes 115 may be disposed on the respective diodes D. The diode electrodes 115 may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof. For example, the diode electrodes 115 may include a TiN layer and a W layer which are sequentially stacked.

The diode electrodes 115 may be disposed within the contact holes 108h. In this case, the diode electrodes 115 may be self-aligned on the respective diodes D. Alternatively, the diode electrodes 115 may be omitted.

Top interlayer insulating layers 117, 125 and 130 may be disposed on the substrate 100 having the diode electrodes 115. Line-shaped bottom electrodes 122" may be disposed on the diode electrodes 115 through the top interlayer insulating layer 117, 125 and 130 as shown in FIG. 3E. Alternatively, L-shaped bottom electrodes 222" may be disposed on the diode electrodes 115 through the top interlayer insulating layer 117, 225, 230 as shown in FIG. 6C.

The bottom electrodes 122" and 222" may have top surfaces defined by the x and y axes. The x-axis of the top surface of the bottom electrodes 122" and 222" may have a smaller width than a resolution limit of a photolithography process. The sections of the line-shaped bottom electrodes 122" in the x-axis direction may have a shape of number "1." The sections of the L-shaped bottom electrodes 222" in the x-axis direction may have an L shape or a symmetrical structure of the L shape.

Phase change patterns 135 and 235 and top electrodes 137 and 237 may be sequentially disposed on the substrate having the bottom electrodes 122" and 222" while being in contact with the bottom electrodes 122" and 222". The top electrodes 137 and 237 may act as a bit line BL. The phase change patterns 135 and 235 and the top electrodes 137 and 237 may extend in a direction parallel to or perpendicular to the line direction of the line-shaped trenches 120t and 220t. The top electrodes 137 and 237 BL may extend in a direction perpendicular to the word lines 105 WL.

Alternatively, as shown in FIGS. 9 and 10, the line-shaped trenches 420t may extend in a direction perpendicular to the line-shaped trenches 120t shown in FIG. 3E. Line-shaped bottom electrodes 422" may be disposed to cover sidewalls of the line-shaped trenches 420t. Alternatively, L-shaped bottom electrodes may be disposed instead of the line-shaped bottom electrodes 422". The line-shaped bottom electrodes 422" may have a structure that the bottom electrodes 122" shown in FIG. 2 are rotated by 90° on the plan view.

The phase change patterns 135 and 235 may be a chalcogenide material layer. For example, the phase change patterns 135 and 235 may include a compound formed of at least two selected from the group consisting of Te, Se, Ge, Sb, Bi, Pb, Sn, Ag, As, S, Si, P, O, and C. An interface layer (not shown) may be interposed between the phase change patterns 135 and 235 and the bottom electrodes 122" and 222".

The top electrodes 137 and 237 BL may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

The phase change memory device according to other example embodiments of the present invention will now be described with reference back to FIGS. 4, 5C, and 7.

Referring to FIGS. 4, 5C, and 7, the phase change memory device may include an isolation layer 102 defining active regions 102a in a predetermined region of a substrate 100. The substrate 100 may have first conductivity type impurity ions. The active regions 102a may have a line-shaped structure. The active regions 102a may include impurity ions of a second conductivity type different from the first conductivity type to act as word lines WL 105. Hereinafter, it is assumed that the first and second conductivity types are P and N types for simplicity of description, respectively. However, the first and second conductivity types may be N and P types, respectively.

A first interlayer insulating layer 107 may be disposed on the substrate 100 having the word lines WL 105 and the isolation layer 102. Contact holes 108h may be disposed to expose predetermined regions of the word lines WL 105 through the first interlayer insulating layer 107. First and second semiconductor patterns 110 and 112 may be sequentially disposed within the contact holes 108h. The first and second semiconductor patterns 110 and 112 may constitute diodes D. The first semiconductor pattern 110 may be in contact with the word lines WL 105.

Diode electrodes 115 may be disposed on the respective diodes D. The diode electrodes 115 may include a TiN layer and a W layer which are sequentially stacked. The diode electrodes 115 may be disposed within the contact holes 108h. In this case, the diode electrodes 115 may be self-aligned on the respective diodes D. Alternatively, the diode electrodes 115 may be omitted.

Top interlayer insulating layers 117, 125 and 130' may be disposed on the substrate 100 having the diode electrodes 115. Line-shaped bottom electrodes 122''' may be disposed on the diode electrodes 115 through the top interlayer insulating layers 117, 125 and 130' as shown in FIG. 5C. Alternatively, L-shaped bottom electrodes 222''' may be disposed on the diode electrodes 115 through the top interlayer insulating layers 117, 225 and 230' as shown in FIG. 7.

The bottom electrodes 122''' and 222''' may have top surfaces defined by the x and y axes. Both the x and y axes of the top surface of the bottom electrodes 122''' and 222''' may have smaller widths than a resolution limit of a photolithography process. Sections of the line-shaped bottom electrodes 122''' in the x and y axis direction may have a shape of number "1." The sections of the L-shaped bottom electrodes 222''' in the x-axis direction may have an L shape or a symmetrical structure of the L shape.

Phase change patterns 135 and 235 and top electrodes 137 and 237 may be sequentially disposed on the substrate having the bottom electrodes 122''' and 222''' while being in contact with the bottom electrodes 122''' and 222'''. The top electrodes 137 and 237 may act as a bit line BL. The phase change patterns 135 and 235 and the top electrodes 137 and 237 may extend in a direction parallel to or perpendicular to the line direction of the line-shaped trenches 120t and 220t. The top electrodes 137 and 237 BL may extend in a direction perpendicular to the word lines 105 WL.

The phase change memory device according to yet other example embodiments of the present invention will now be described with reference back to FIG. 12.

Referring to FIG. 12, an isolation layer 502 defining active regions 502a may be disposed on a substrate 500. Word lines 505 WL may be disposed on the active regions 502a. Source and drain regions 506 may be disposed within the active regions 502a adjacent to both sides of the word lines 505 WL. A bottom insulating layer 507 may be disposed to cover the substrate 500 having the word lines 505 WL. The word line 505 WL, the active region 502a, and the source and drain regions 506 may constitute a transistor (Ta of FIG. 11).

First plugs 510a and second plugs 510b may be disposed within the bottom insulating layer 507. Drain pads 515a and source lines 515b may be disposed on the first plugs 510a and the second plugs 510b, respectively. The drain pads 515a and the source lines 515b may be disposed within the bottom insulating layer 507. The drain pads 515a may be electrically connected to one selected region of the source and drain regions 506 by the first plugs 510a penetrating the bottom insulating layer 507. The source lines 515b may be electrically connected to the other selected region of the source and drain regions 506 by the second plugs 510b penetrating the bottom insulating layer 507.

Top interlayer insulating layers 117, 125 and 130 may be disposed on the substrate 500 having the drain pads 515a and the source lines 515b. Line-shaped bottom electrodes 122" may be disposed which penetrate the top interlayer insulating layers 117, 125, 130 to be in contact with the drain pads 515a. Alternatively, L-shaped bottom electrodes instead of the line-shaped bottom electrodes 122" may be disposed. The bottom electrodes 122" may have top surfaces defined by the x and y axes. The x-axis of the top surface of the bottom electrodes 122" may have a smaller width than a resolution limit of a photolithography process. The sections of the line-shaped bottom electrodes 122" in the x-axis direction may have a shape of number "1." The sections of the L-shaped bottom electrodes may have an L shape or a symmetrical structure of the L shape.

A phase change pattern 135 and a top electrode 137 may be sequentially disposed on the substrate having the bottom electrodes 122" while being in contact with the bottom electrodes 122". The top electrodes 137 may act as a bit line BL. The phase change patterns 135 and the top electrodes 137 BL may extend in a direction parallel to or perpendicular to the line direction of the line-shaped trenches 120t. The top electrodes 137 BL may extend in a direction perpendicular to the word lines 105 WL.

Methods of fabricating the phase change memory device according to other example embodiments of the present invention will now be described with reference to FIGS. 14A through 14E. In this case, reference symbols C and D in FIGS. 14A through 14E indicate cross-sectional views taken along lines V-V' and VI-VI' of FIG. 13, respectively.

Figure 13:
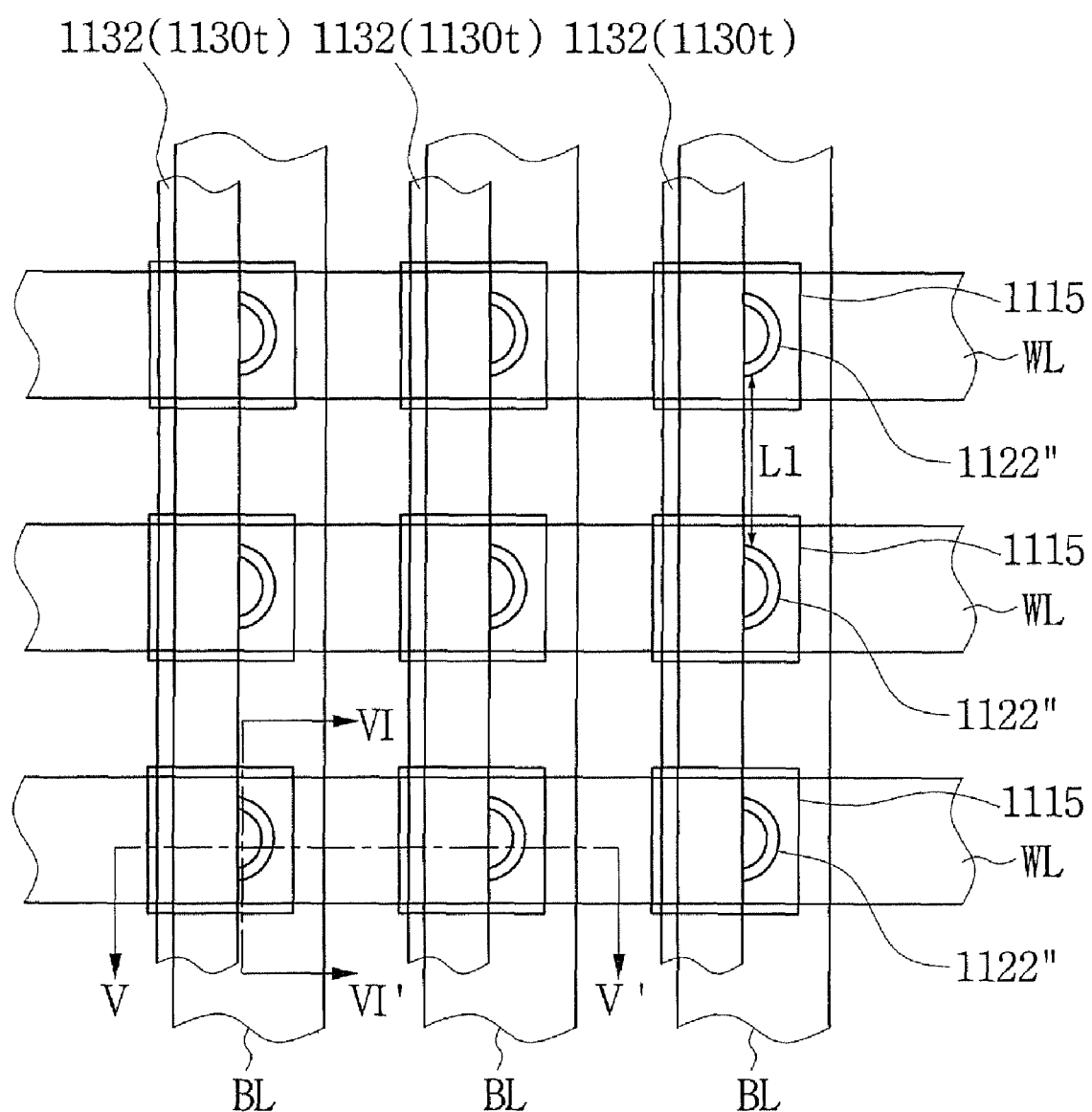
FIG. 13 is a plan view of a cell array region of a phase change memory device in some embodiments according to the invention corresponding to the equivalent circuit diagram of FIG. 1.
Figure 14A:
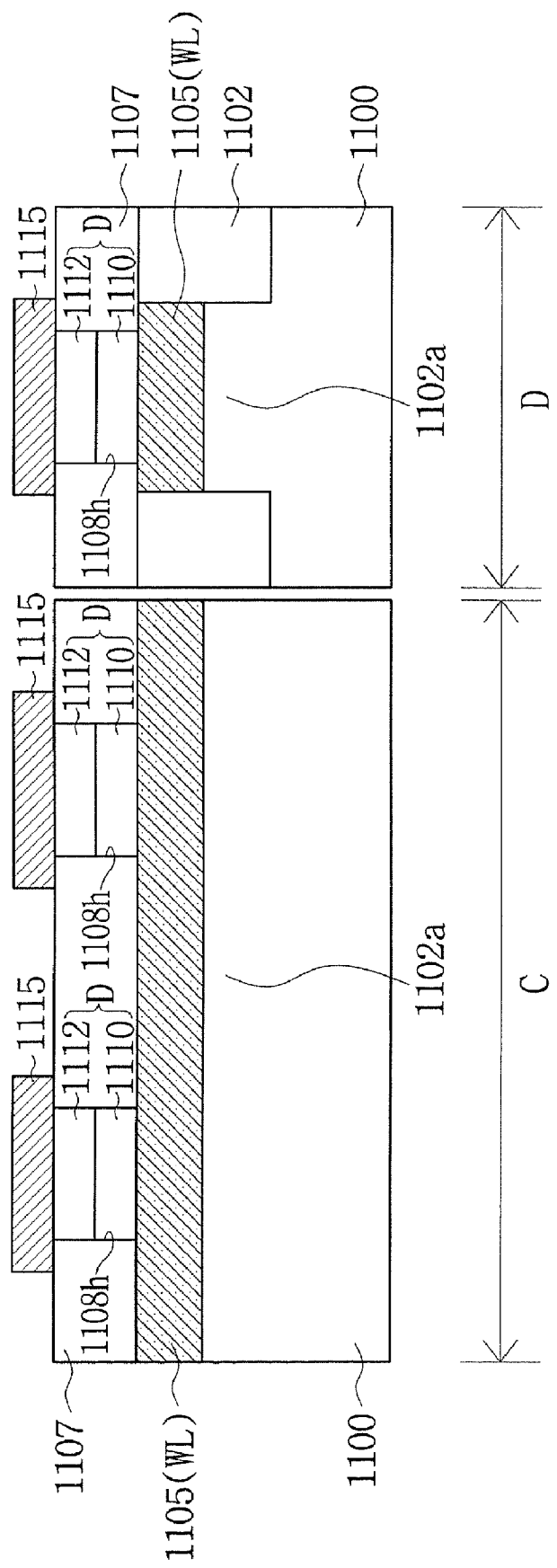
FIGS. 14A through 14E are cross-sectional views taken along lines V-V' and VI-VI' of FIG. 13, illustrating a method of fabricating a phase change memory device in some embodiments according to the invention.

Referring to FIGS. 13 and 14A, an isolation layer 1102 defining active regions 1102a may be formed in a predetermined region of a substrate 1100. A semiconductor substrate such as a silicon wafer or SOI wafer may be employed as the substrate 1100. The substrate 1100 may have first conductivity type impurity ions. The isolation layer 1102 may be formed using an STI technique. The isolation layer 1102 may be formed of a silicon oxide layer, a silicon nitride layer, a silicon oxynitride layer, or combinations thereof. The active regions 1102a may be formed to have line-shapes.

Impurity ions of a second conductivity type different from the first conductivity type may be implanted into the active regions 1102a to form word lines WL 1105. Hereinafter, for simplicity of description, a case in which the first and second conductivity types are P and N types, respectively, will be described. However, the first and second conductivity types may be N and P types, respectively.

A first interlayer insulating layer 1107 may be formed on the substrate 1100 having the word lines WL 1105 and the isolation layer 1102. The first interlayer insulating layer 1107 may be formed of a silicon oxide layer, a silicon nitride layer, a silicon oxynitride layer, or combinations thereof. The first interlayer insulating layer 1107 may be patterned to form contact holes 1108h exposing a predetermined region of the word lines WL 1105.

First and second semiconductor patterns 1110 and 1112 may be sequentially deposited within the contact holes 1108h. The first and second semiconductor patterns 1110 and 1112 may be formed using an epitaxial growth technique or a CVD technique. The first and second semiconductor patterns 1110 and 1112 may constitute diodes D.

The first semiconductor pattern 1110 may be in contact with the word lines WL 1105. The first semiconductor pattern 1110 may be formed to have the second conductivity type impurity ions. The second semiconductor pattern 1112 may be formed to have the first conductivity type impurity ions. Alternatively, the first semiconductor pattern 1110 may be formed to have the first conductivity type impurity ions and the second semiconductor pattern 1112 may be formed to have the second conductivity type impurity ions. A metal silicide layer may be further formed on the second semiconductor pattern 1112, however, a description thereof will be omitted for simplicity of description.

Diode electrodes 1115 may be formed on the respective diodes D. The diode electrodes 115 may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof. For example, the diode electrodes 1115 may be formed by sequentially depositing a TiN layer and a W layer.

The diode electrodes 1115 may be formed within the contact holes 1108h. In this case, the diode electrodes 1115 may be self-aligned on the respective diodes D. Alternatively, the diode electrodes 1115 may be omitted.

Figure 14B:
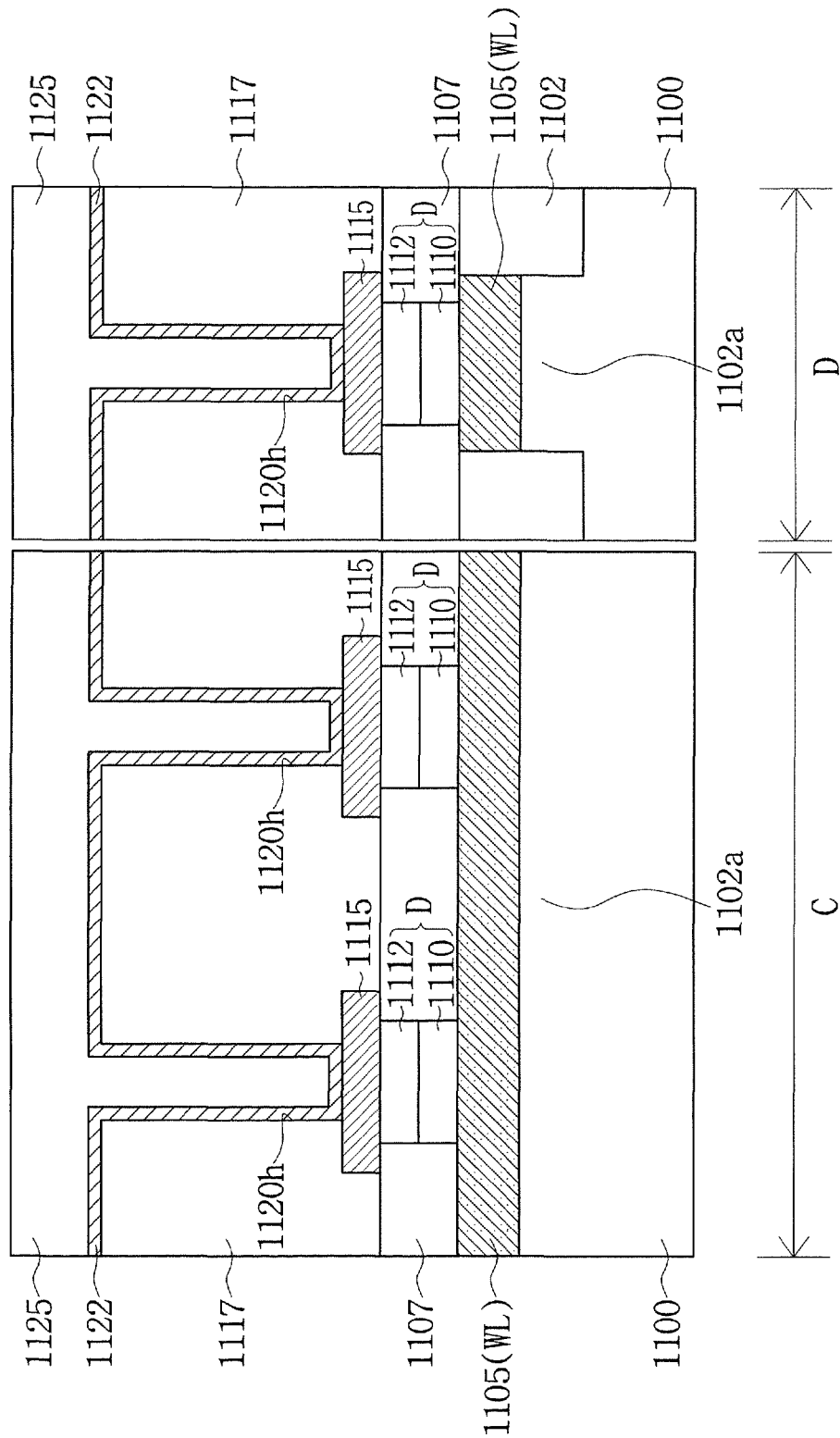

Referring to FIGS. 13 and 14B, a second interlayer insulating layer 1117 may be formed on the substrate 1100 having the diode electrodes 1115. The second interlayer insulating layer 1117 may be patterned to form bottom electrode contact holes 1120h which expose the diode electrodes 1115. A bottom electrode layer 1122 may be formed along a surface on the substrate having the bottom electrode contact holes 1120h. The bottom electrode layer 1122 may cover the exposed diode electrodes 1115 within the bottom electrode contact holes 1120h, and may cover sidewalls of the bottom electrode contact holes 1120h and a top surface of the second interlayer insulating layer 1117.

The bottom electrode layer 1122 may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

An internal insulating layer 1125 filling the bottom electrode contact holes 1120h may be formed on the substrate 1100 having the bottom electrode layer 1122. The internal insulating layer 1125 may be formed of an insulating layer such as a silicon oxide layer, a silicon nitride layer, a silicon oxynitride layer or combinations thereof. The internal insulating layer 1125 may be formed of the same material layer as the second interlayer insulating layer 1117.

In other embodiments, the internal insulating layer 1125 may be omitted. In this case, the bottom electrode layer 1122 may be formed to completely fill the bottom electrode contact holes 1120*h*.

Figure 14C:
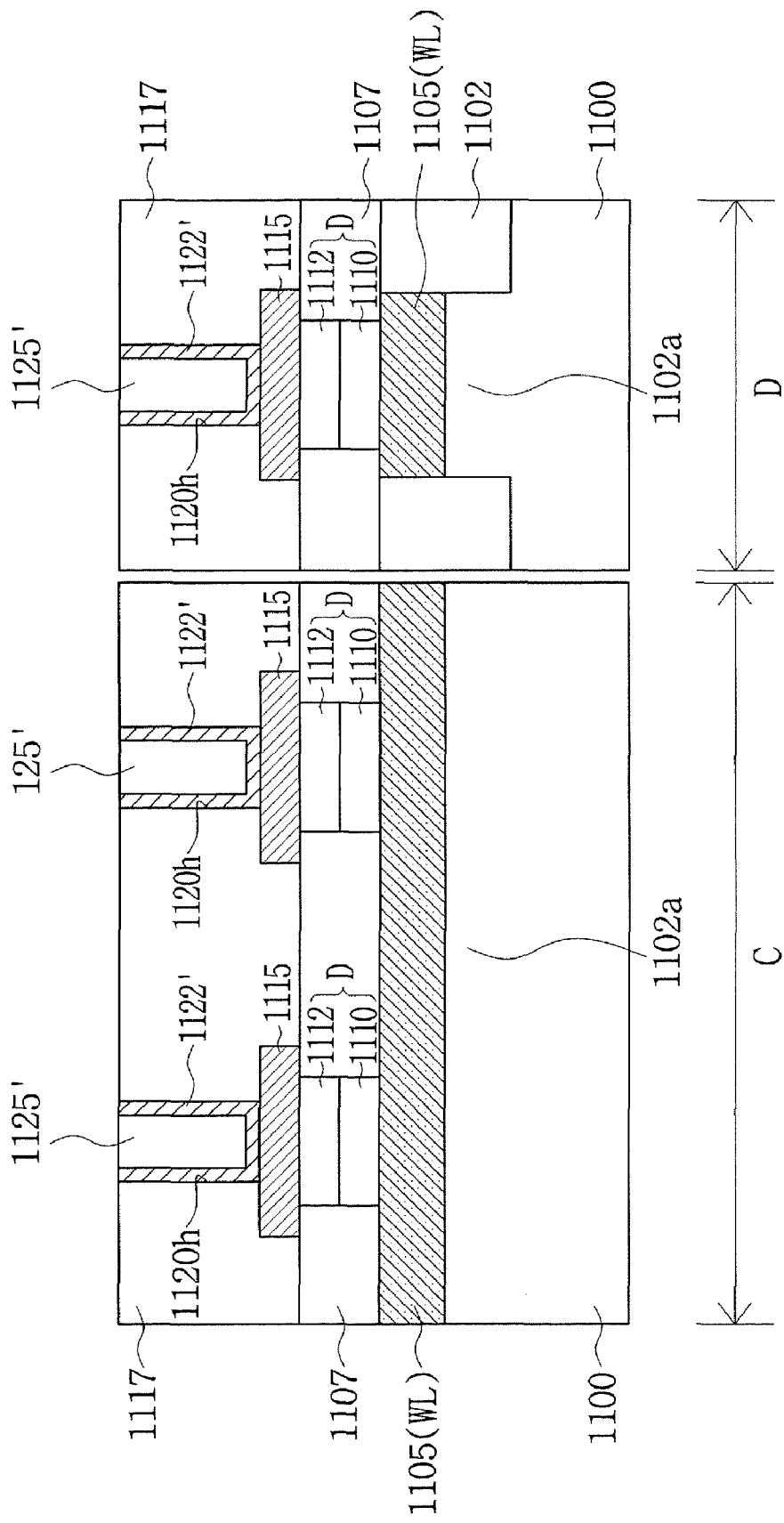

Referring to FIGS. 13 and 14C, the internal insulating layer 1125 and the bottom electrode layer 1122 may be partially removed to form cylindrical bottom electrodes 1122' and internal insulating patterns 1125' on the diode electrodes 1115 within the bottom electrode contact holes 1120*h*.

Specifically, the formation of the cylindrical bottom electrodes 1122' and the internal insulating patterns 1125' may be performed using an etch-back process. Alternatively, the formation of the cylindrical bottom electrodes 1122' and the internal insulating patterns 1125' may be patterned using combinations of a chemical mechanical polishing (CMP) process and an etch-back process.

For example, the internal insulating layer 1125 and the bottom electrode layer 1122 may be planarized using a CMP process adopting the second interlayer insulating layer 1117 as a stop layer. As a result, the internal insulating layer 1125 and the bottom electrode layer 1122 may be remained in the bottom electrode contact holes 1120*h*.

In yet other embodiments, after the internal insulating layer 1125 and the bottom electrode layer 1122 are planarized until the top surface of the second interlayer insulating layer 1117 is exposed, a planarization process may be carried out at least once to more uniformly form the height of the cylindrical bottom electrodes 1122' and the internal insulating patterns 1125' within the second interlayer insulating layer 1117.

The cylindrical bottom electrodes 1122' may be formed to surround sidewalls and bottom surfaces of the internal insulating patterns 1125'. The cylindrical bottom electrodes 1122' may be in contact with the respective diode electrodes 1115. When the diode electrodes 1115 are omitted, the cylindrical bottom electrodes 1122' may be in direct contact with the diodes D. The exposed surface of each of the cylindrical bottom electrodes 1122' may have a ring shape. A contact area between the cylindrical bottom electrodes 1122' and the diode electrodes 1115 may be smaller than the top surface of the diode electrodes 1115.

In yet other embodiments, when the internal insulating layer 1125 is omitted, each of the cylindrical bottom electrodes 1122' may have a pillar shape. In this case, the exposed surface of each of the cylindrical bottom electrodes 1122' may have a circular shape.

Figure 14D:
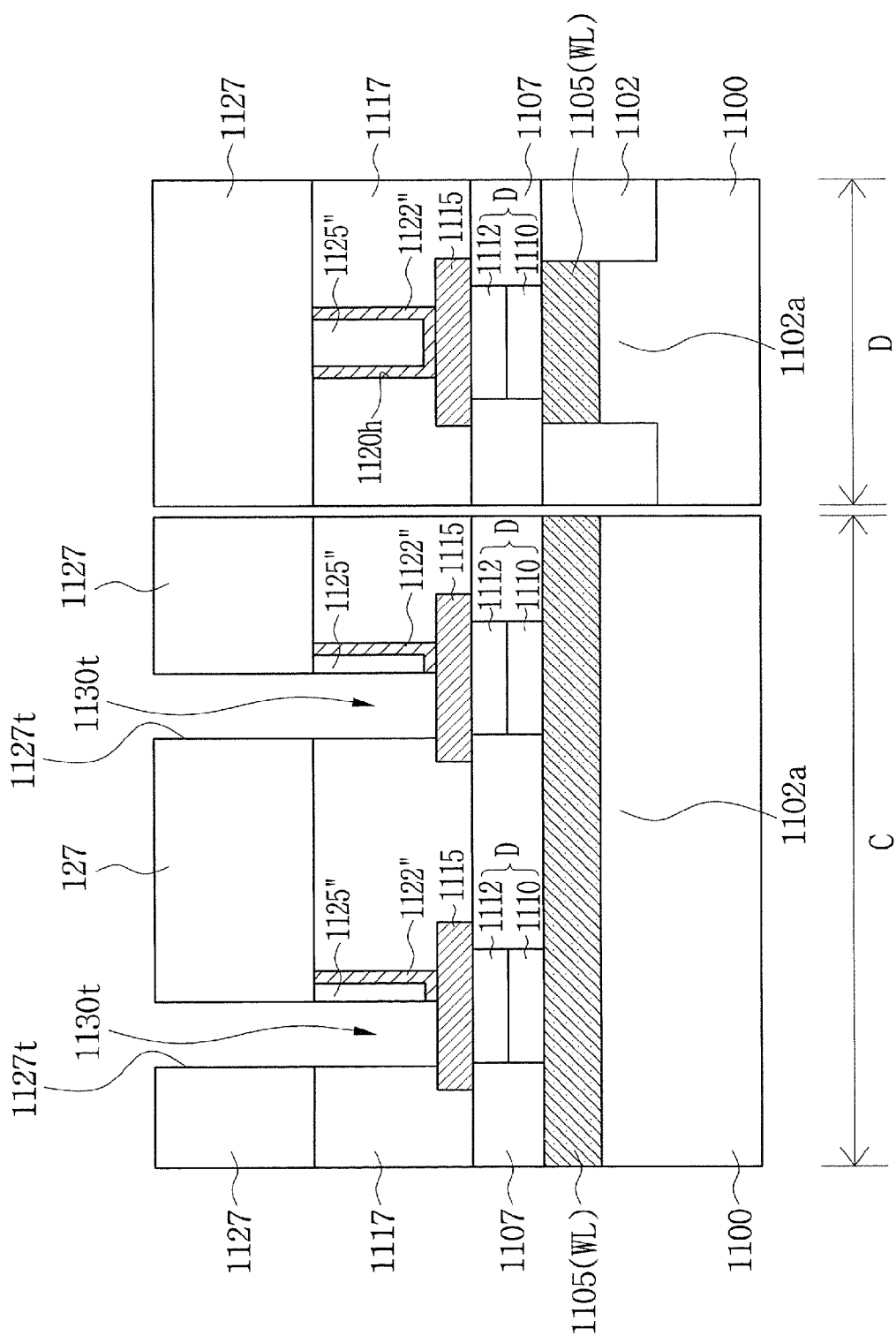

Referring to FIGS. 13 and 14D, mask patterns 1127 may be formed on the substrate 1100 having the cylindrical bottom electrodes 1122' and the internal insulating patterns 1125'. The mask patterns 1127 may include line-shaped openings 1127*t* exposing portions of the cylindrical bottom electrodes 1122' in an x-axis or y-axis direction. Accordingly, portions of a plurality of cylindrical bottom electrodes 1122' disposed in the x-axis or y-axis direction may be simultaneously exposed by the corresponding one of the line-shaped openings 1127*t*. The mask patterns 1127 may be hard mask patterns or photoresist patterns.

In addition, portions of the internal insulating patterns 1125' may be exposed by the line-shaped openings 1127*t*. For example, when the line-shaped openings 1127*t* expose 50% of the cylindrical bottom electrodes 1122', 50% of the top surfaces of the internal insulating patterns 1125' may also be exposed.

The cylindrical bottom electrodes 1122' having the exposed portions and the second interlayer insulating layer 1117 may be etched using the mask patterns 1127 as an etch mask. As a result, line-shaped trenches 1130*t* may be formed to expose the diode electrodes 1115 and the first interlayer insulating layer 1107. In this case, when the portions of the internal insulating patterns 1125' are exposed by the line-shaped openings 1127*t*, the internal insulating patterns 1125' may be also simultaneously etched. As a result, partially cut cylindrical bottom electrodes 1122" and partially cut internal insulating patterns 1125" may be formed.

From the top view, a top surface of each of the partially cut cylindrical bottom electrodes 1122" may have a "C" shape, a crescent shape with a uniform thickness, or a "(" shape. Accordingly, the top surface of each of the partially cut cylindrical bottom electrodes 1122" may have a smaller area than the ring-shaped top surface of each of the cylindrical bottom electrodes 1122'.

Figure 15A:
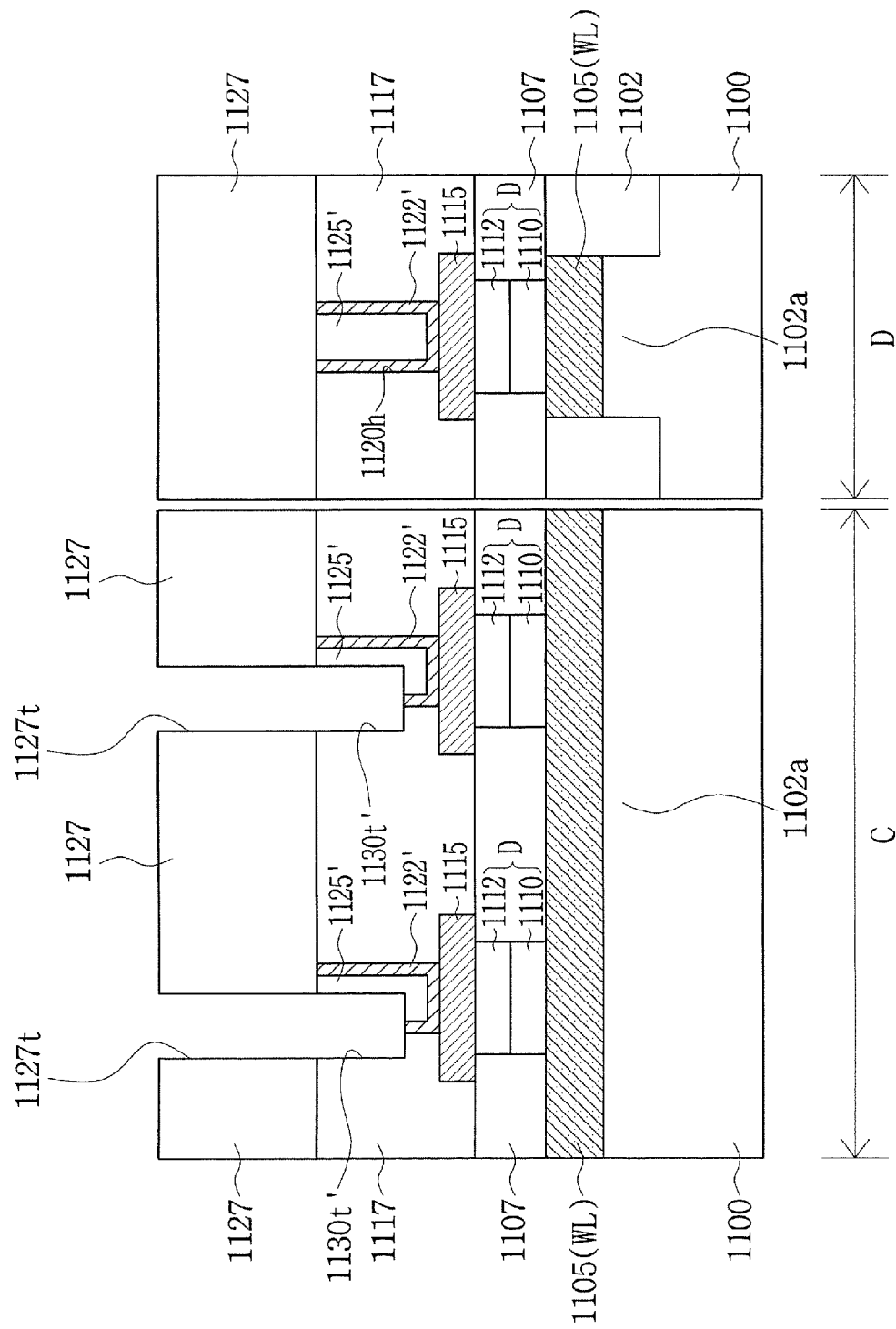
FIGS. 15A through 15B are cross-sectional views taken along lines V-V' and VI-VI' of FIG. 13, illustrating methods of fabricating a phase change memory device in some embodiments according to the invention.

Alternatively, as shown in FIG. 15A, the bottom electrodes 1122' having the exposed portions and the second interlayer insulating layer 1117 may be etched using the mask patterns 1127 as an etch mask, thereby forming line-shaped trenches 1130*t'* exposing the etched sidewalls and top surfaces of the bottom electrodes 1122'. In this case, when portions of the internal insulating patterns 1125' are exposed by the line-shaped openings 1127*t*, the internal insulating patterns 1125' may be also simultaneously etched.

The line-shaped trenches 1130*t* and 1130*t'* may be formed in an x-axis or y-axis direction. Specifically, as shown in FIG. 13, the line-shaped trenches 1130*t* and 1130*t'* may extend in a line direction perpendicular to the word lines 1105 WL.

Figure 16:
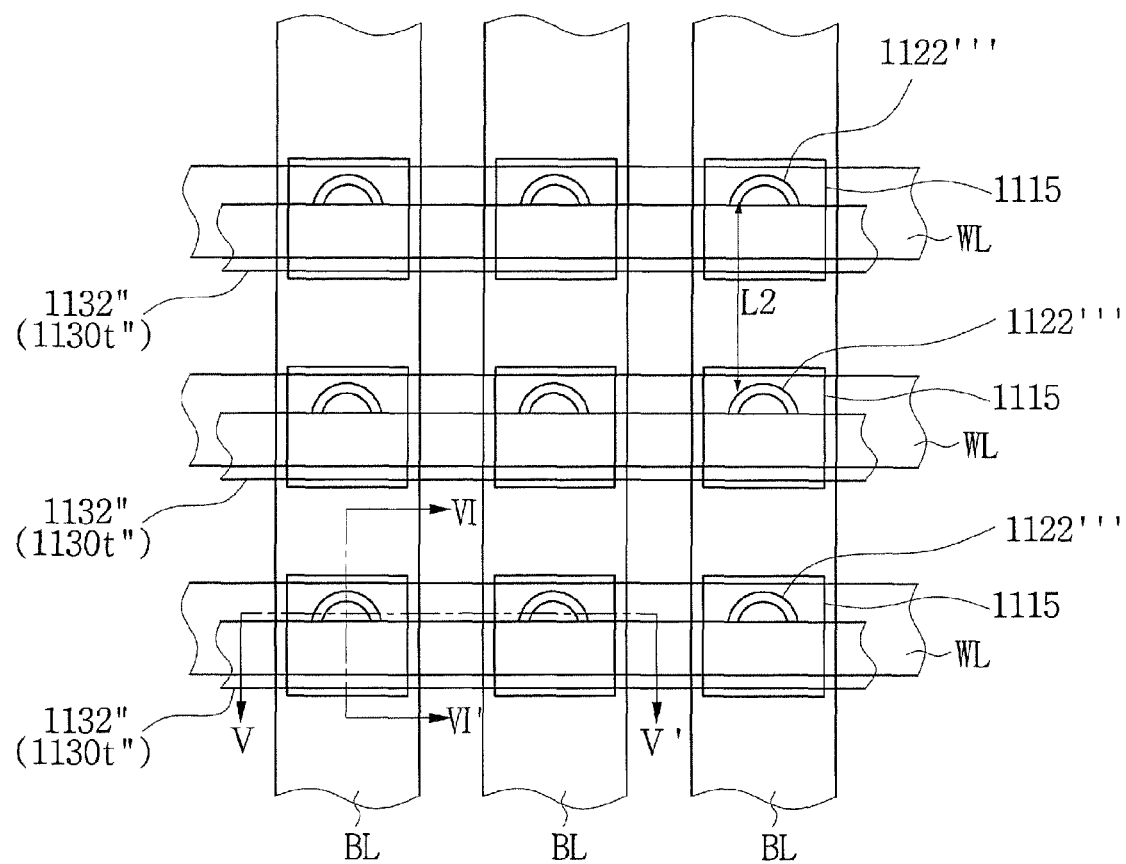
FIG. 16 is a plan view of a cell array region of a phase change memory device in some embodiments according to the invention.
Figure 17:
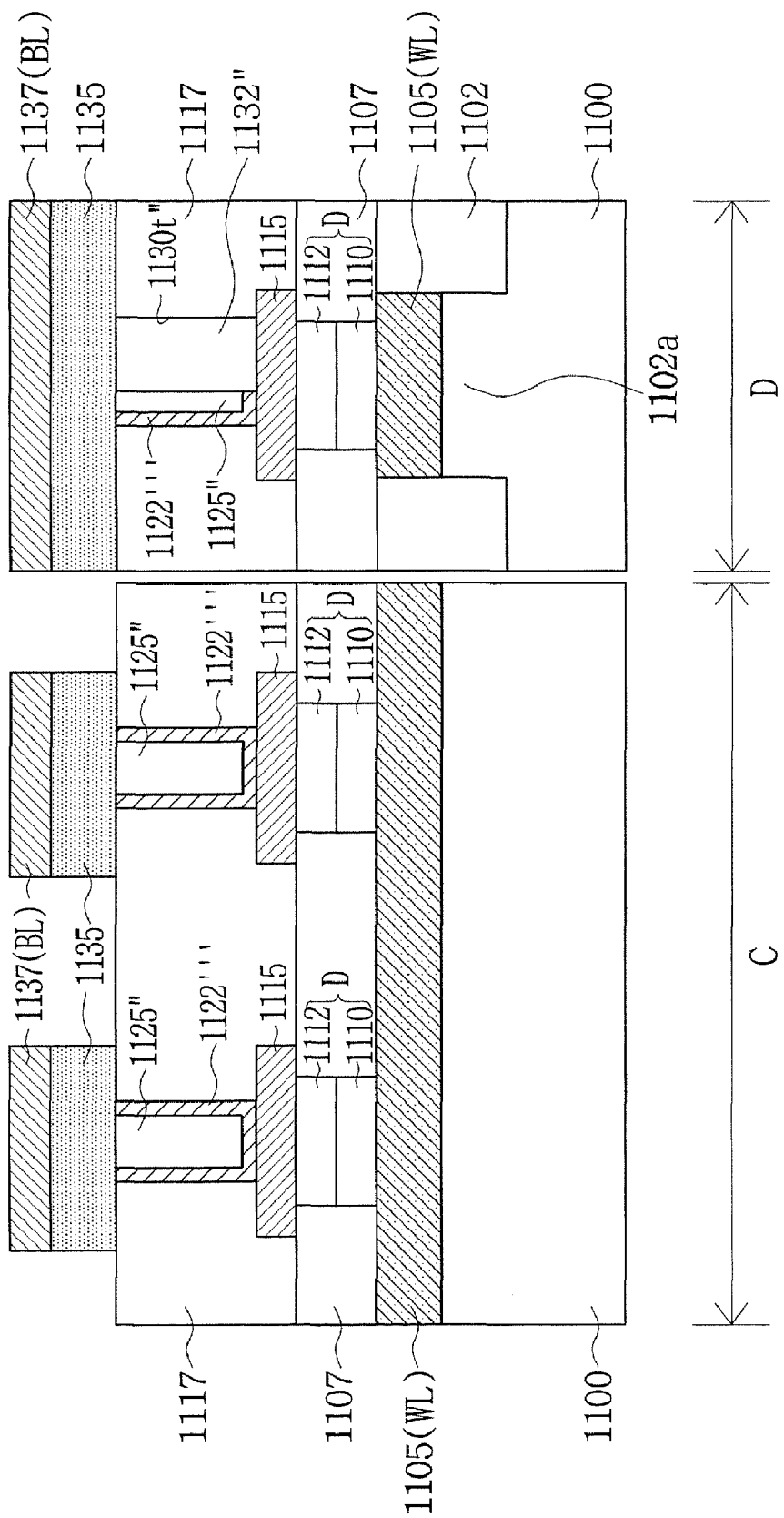
FIG. 17 is a cross-sectional view taken along lines V-V' and VI-VI' of FIG. 16, illustrating methods of fabricating a phase change memory device in some embodiments according to the invention.

Alternatively, as shown in FIGS. 16 and 17, the line-shaped trenches 1130*t'* may extend in a line direction parallel to the word lines 1105 WL.

Figure 14E:
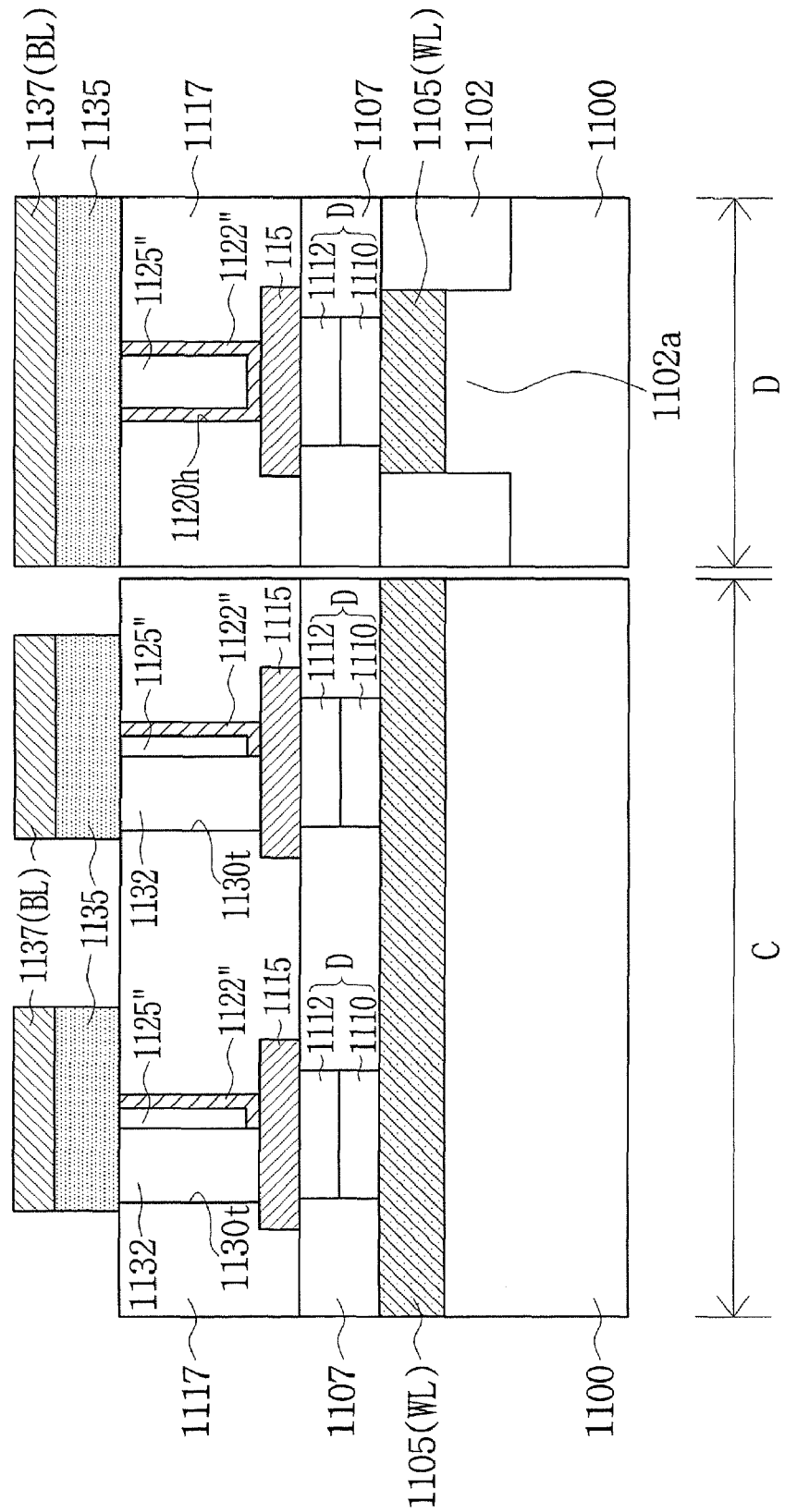

Referring to FIGS. 13 and 14E, an insulating layer may be formed on the substrate 1100 having the line-shaped trenches 1130*t* to fill the line-shaped trenches 1130*t*. The insulating layer may be planarized until the top surfaces of the partially cut cylindrical bottom electrodes 1122" are exposed. As a result, line-shaped insulating patterns 1132 may be formed in the respective line-shaped trenches 1130*t*.

Figure 15B:
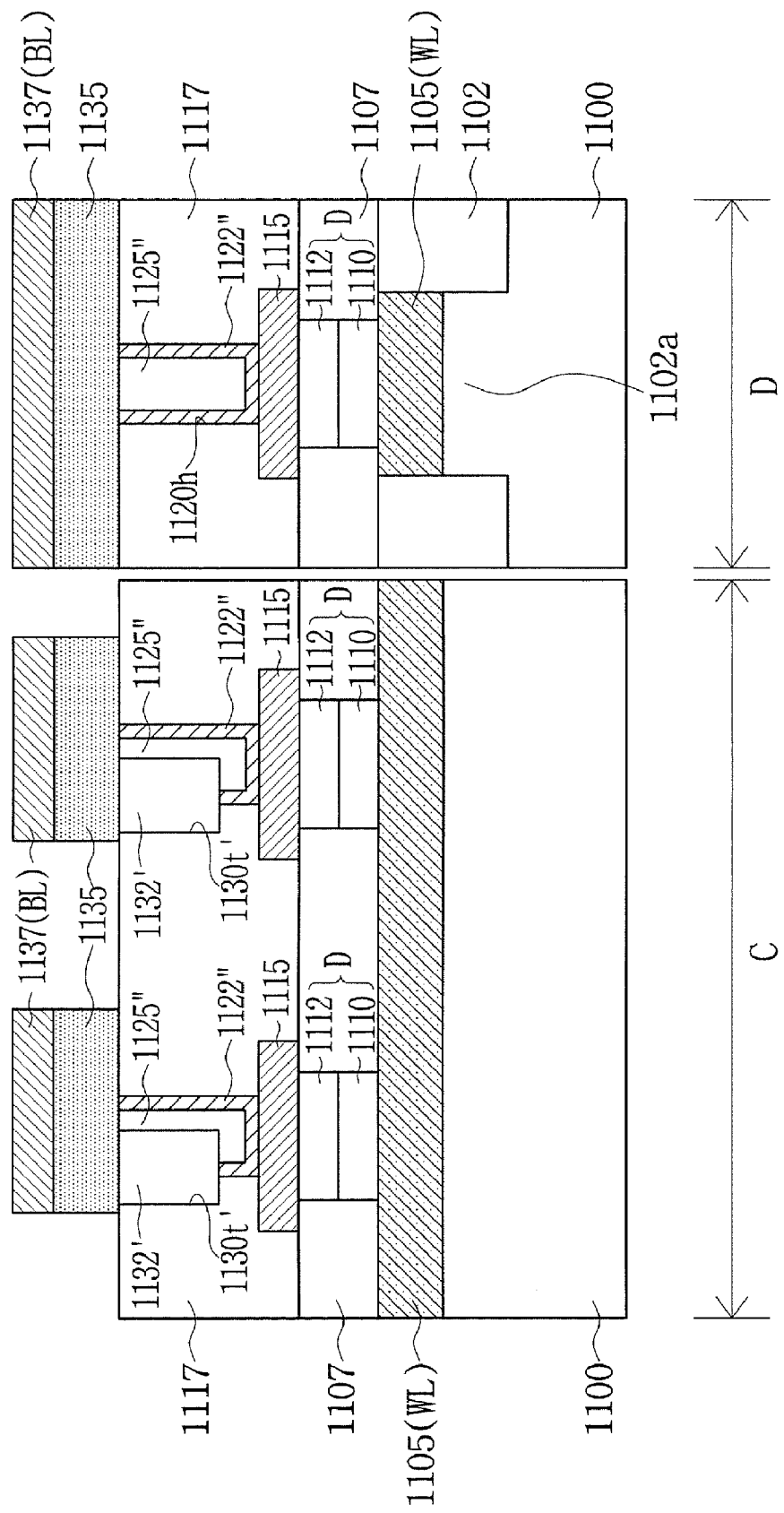

Alternatively, as shown in FIG. 15B, an insulating layer may be formed on the substrate 1100 having the line-shaped trenches 1130*t'* to fill the line-shaped trenches 1130*t'*. The insulating layer may be planarized until the top surfaces of the partially cut cylindrical bottom electrodes 1122" are exposed. As a result, line-shaped insulating patterns 1132' may be formed in the respective line-shaped trenches 1130*t'*.

Phase change patterns 1135 and top electrodes 1137 may be sequentially deposited on the substrate 1100 having the line-shaped insulating patterns 1132 and 1132' while being in contact with the partially cut cylindrical bottom electrodes 1122". The top electrodes 1137 may act as a bit line BL. The phase change patterns 1135 and the top electrodes 1137 may extend in a direction perpendicular to the word lines 1105 WL. Alternatively, as shown in FIG. 13, the phase change patterns 1135 and the top electrodes 1137 BL may extend in a direction parallel to the line direction of the line-shaped insulating patterns 1132.

Alternatively, as shown in FIGS. 16 and 17, when line-shaped insulating patterns 1132' extend in a line direction parallel to the word lines 1105 WL, the phase change patterns 1135 and the top electrodes 1137 BL may extend in a direction perpendicular to the line direction of the line-shaped insulating patterns 1132' as shown in FIG. 16. As a result, a distance L2 between the partially cut cylindrical bottom electrodes 1122" sharing the phase change pattern 1135 may be greater than a distance L1 between the partially cut cylindrical bottom electrodes 1122" shown in FIG. 13. Therefore, thermal disturbance between cells may be reduced.

The phase change patterns 1135 may be a chalcogenide material layer. For example, the phase change patterns 1135 may include a compound formed of at least two selected from the group consisting of Te, Se, Ge, Sb, Bi, Pb, Sn, Ag, As, S, Si, P, O, and C. An interface layer (not shown) may be interposed between the phase change patterns 1135 and the partially cut cylindrical bottom electrodes 1122''.

The top electrodes 1137 BL may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

As described above, the top surfaces of the partially cut cylindrical bottom electrodes 1122'' according to example embodiments of the present invention may have a smaller area than the ring-shaped top surfaces of the cylindrical bottom electrodes 1122'. As a result, an interface area between the phase change pattern 1135 and the bottom electrode 1122'' where Joule heat is generated may be reduced so that a current to be applied during a reset operation may be reduced compared to the conventional art.

Figure 18:
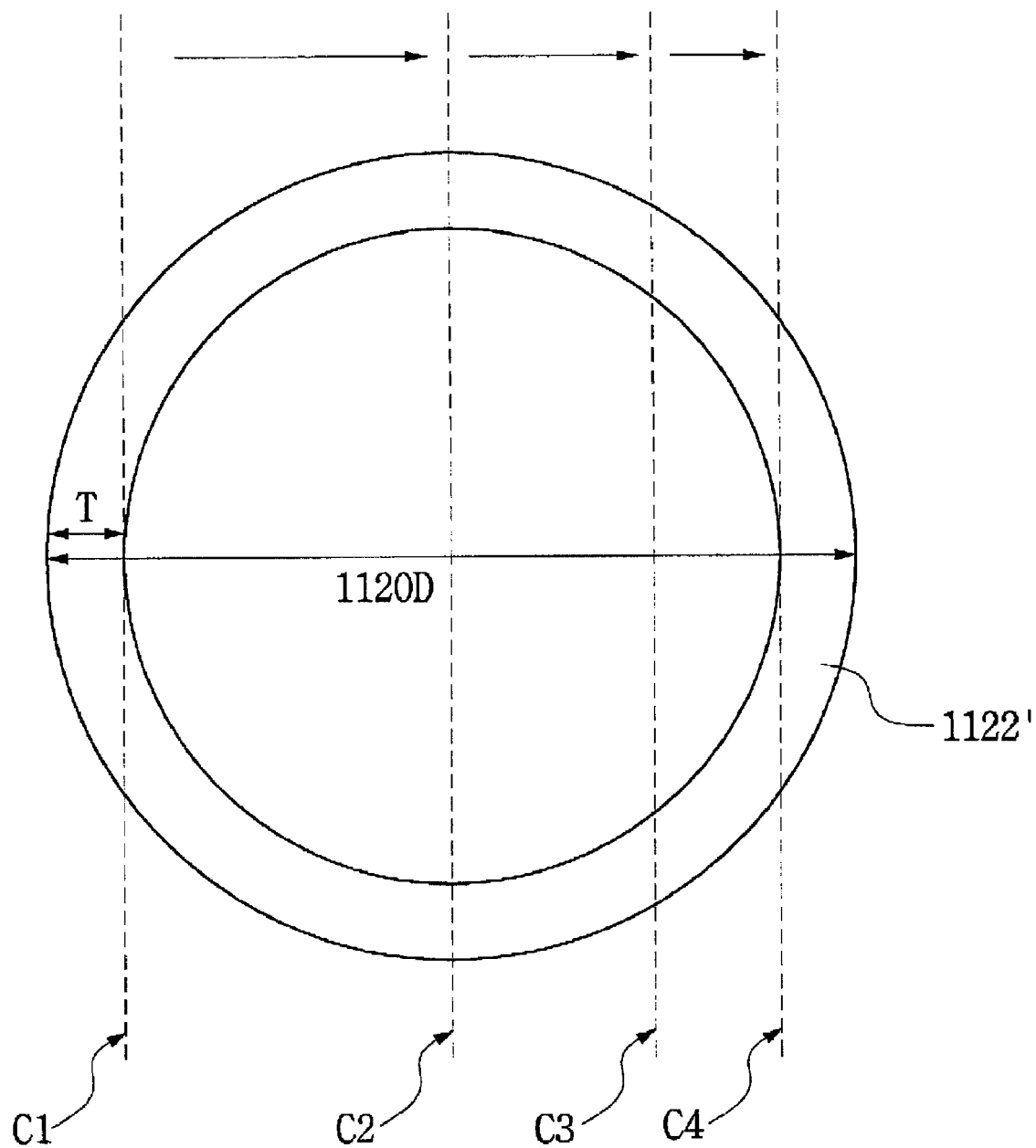
FIG. 18 is an enlarged plan view of ring-shaped top surfaces of cylindrical bottom electrodes of FIG. 14C in some embodiments according to the invention.

FIG. 18 is an enlarged plan view of ring-shaped top surfaces of cylindrical bottom electrodes of FIG. 14C, and FIGS. 19A through 19D are plan views of structures obtained by cutting a portion of the cylindrical bottom electrode of FIG. 18 by a line-shaped insulating pattern along cut lines C1, C2, C3, and C4, respectively. The partially cut cylindrical bottom electrodes 1122'' may be formed using the line-shaped insulating patterns 1132 while varying the position of a cut line. For example, the cut line may be freely selected out of the cut lines C1 to C4.

Figure 19A:
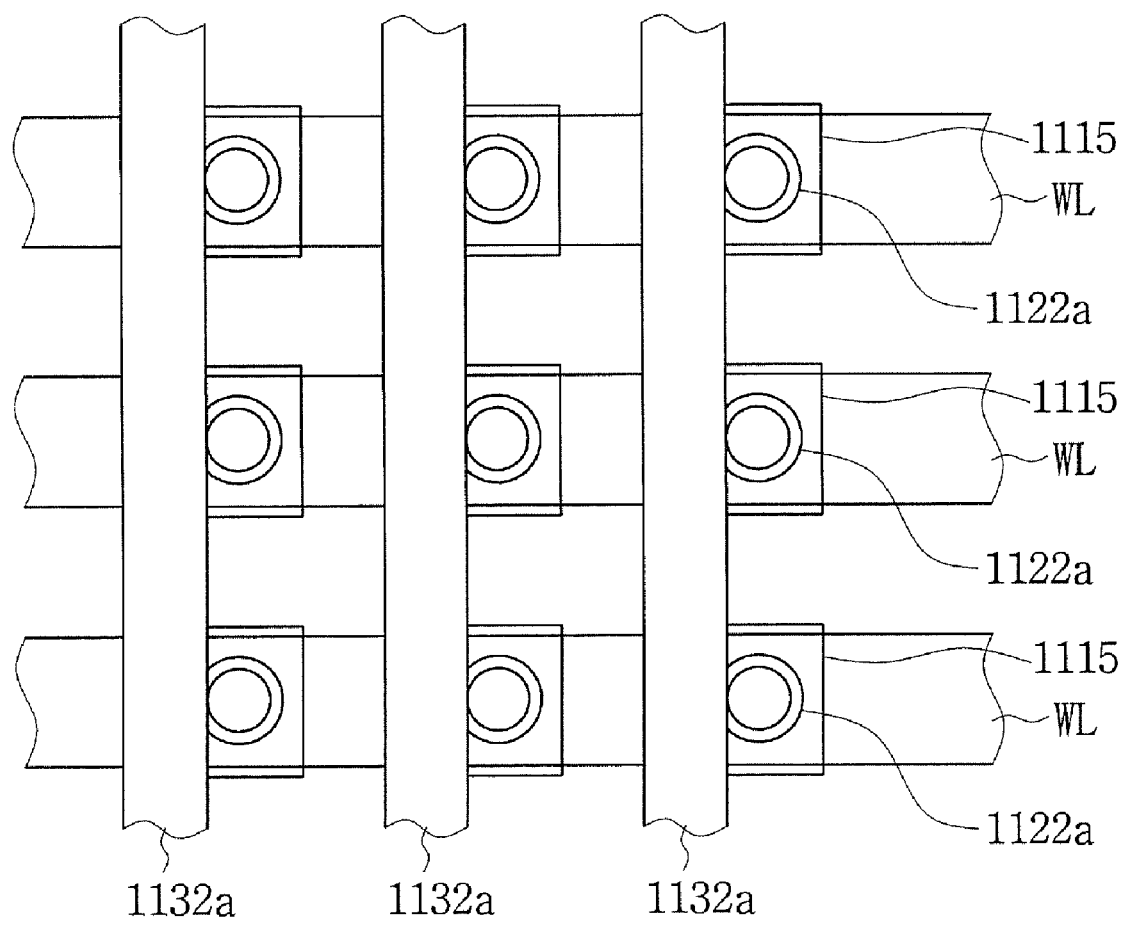
FIGS. 19A through 19D are plan views of structures obtained by cutting a portion of the cylindrical bottom electrode of FIG. 18 by a line-shaped insulating pattern along cut lines C1, C2, C3, and C4, respectively in some embodiments according to the invention.

Referring to FIGS. 18 and 19A, FIG. 19A is a plan view of partially cut cylindrical bottom electrode 1122a of which portions are cut by line-shaped insulating patterns 1132a along the cut line C1. The cut line C1 represents a line along which the cylindrical bottom electrodes 1122' are cut by a thickness T of cylindrical sidewalls. As a result, a top surface of each of the partially cut cylindrical bottom electrodes 1122a may have a "C" shape from the top view, and have a smaller area than the top surface of each of the cylindrical bottom electrodes 1122'.

Figure 19B:
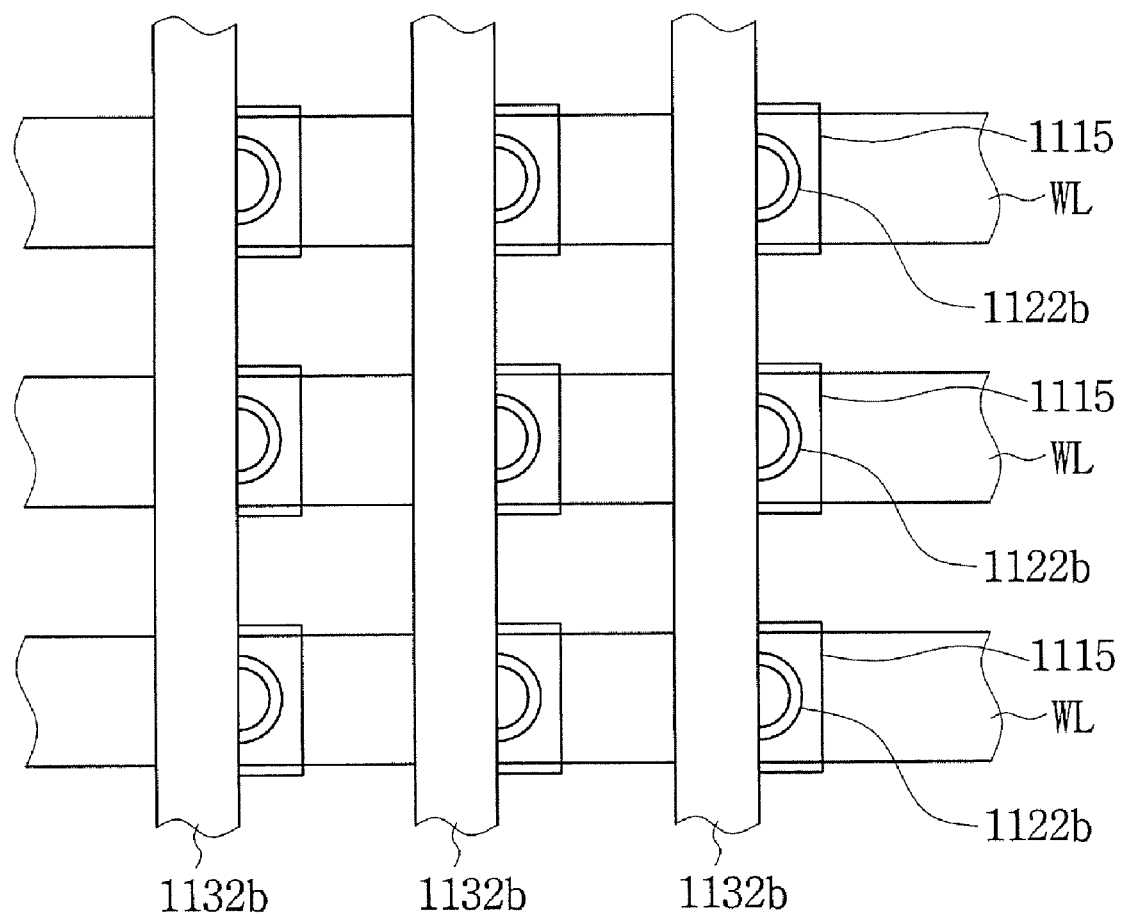

Referring to FIGS. 18 and 19B, FIG. 19B is a plan view of partially cut cylindrical bottom electrodes 1122b of which portions are cut by line-shaped insulating patterns 1132b along the cut line C2. The cut line C2 represents a line along which the cylindrical bottom electrodes 1122' are cut by ½ a cylindrical diameter 1120D. As a result, a top surface of each of the partially cut cylindrical bottom electrodes 1122b may have a crescent shape from the top view, and have ½ the area of each of the cylindrical bottom electrodes 1122'.

Figure 19C:
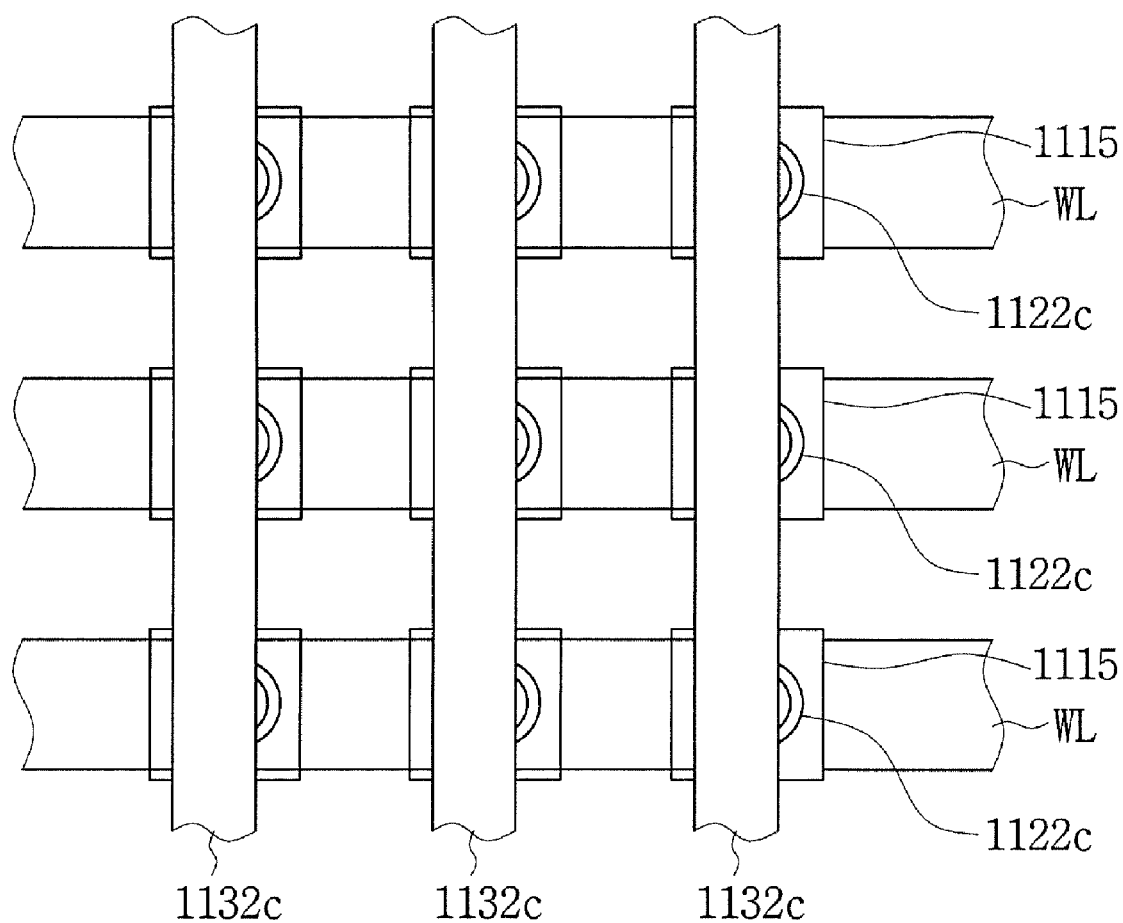

Referring to FIGS. 18 and 19C, FIG. 19C is a plan view of partially cut cylindrical bottom electrodes 1122c of which portions are cut by line-shaped insulating patterns 1132c along the cut line C3. The cut line C3 represents a line along which the cylindrical bottom electrodes 1122' are cut by ¾ the cylindrical diameter 1120D. As a result, a top surface of each of the partially cut cylindrical bottom electrodes 1122c may have a ")" shape from the top view, and have a smaller area than ½ the area of the top surface of each of the cylindrical bottom electrodes 1122'.

Figure 19D:
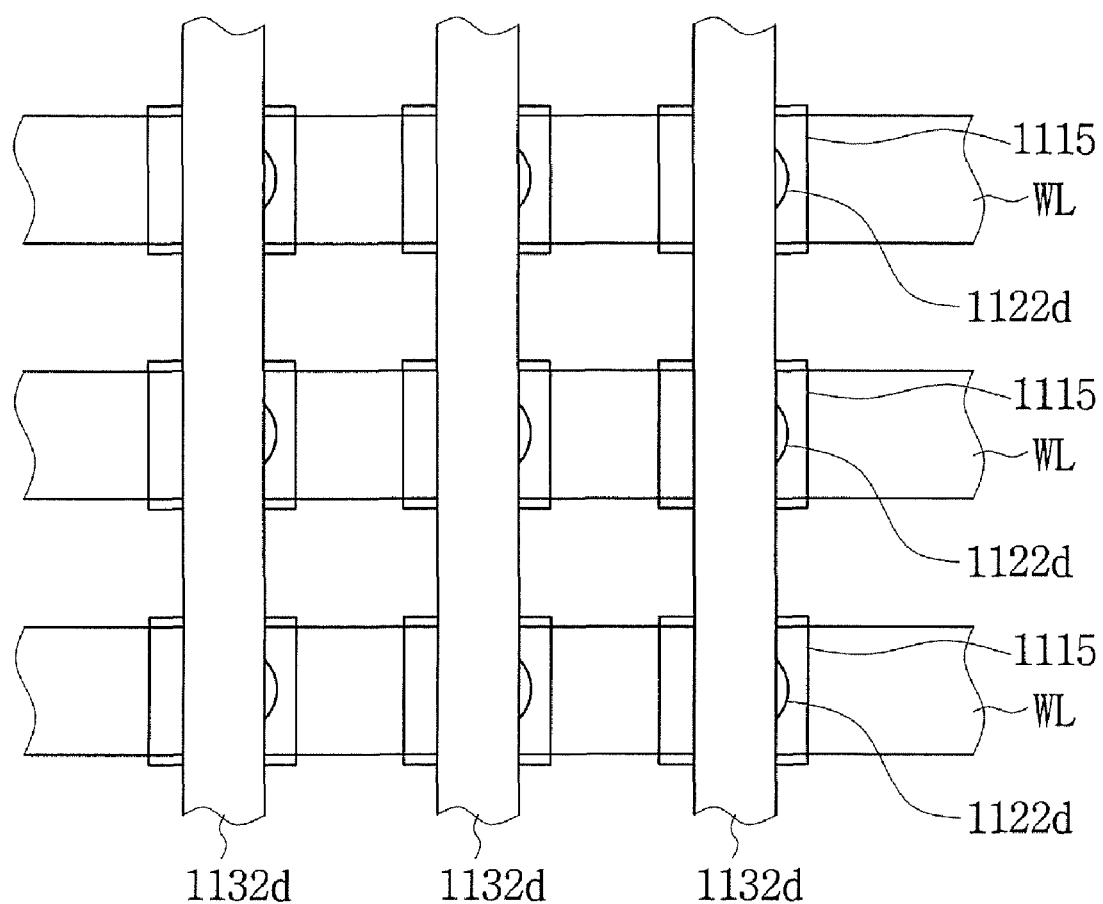

Referring to FIGS. 18 and 19D, FIG. 19D is a plan view of partially cut cylindrical bottom electrodes 1122d of which portions are cut by line-shaped insulating patterns 1132d along the cut line C4. The cut line C4 represents a line along which the cylindrical bottom electrodes 1122' are cut by a value obtained by subtracting the cylindrical thickness T from the cylindrical diameter 1120D. In other words, the partially cut cylindrical bottom electrodes 1122d may be left by the cylindrical thickness T, and the remaining regions may be removed by the line-shaped insulating patterns 1132d. As a result, a top surface of each of the partially cut cylindrical bottom electrodes 1122d may have a ")" shape from the top view, and have a smaller area than the top surface of each of the partially cut cylindrical bottom electrodes 1122c shown in FIG. 19C.

As described above, the top surfaces of the partially cut cylindrical bottom electrodes 1122a, 1122b, 1122c, and 1122d according to example embodiments of the present invention may have smaller areas than the ring-shaped top surfaces of the cylindrical bottom electrodes 1122'. As a result, an interface area between the phase change pattern 1135 and the bottom electrode 1122a, 1122b, 1122c, or 1122d where Joule heat is generated may be reduced so that a current to be applied during a reset operation may be reduced compared to the conventional art.

Figure 20:
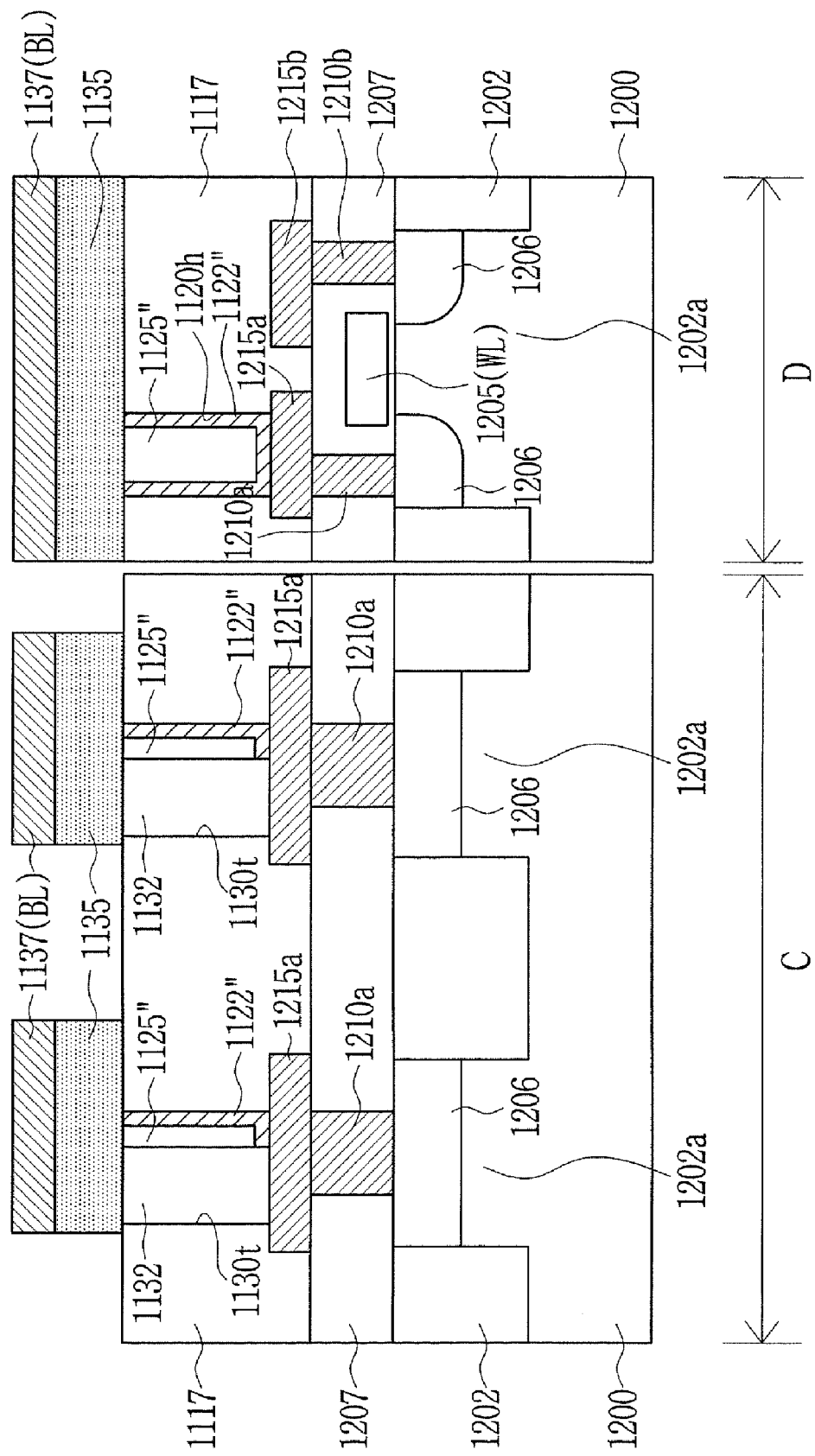
FIG. 20 is a cross-sectional view illustrating methods of fabricating a phase change memory device in some embodiments according to the invention.

FIG. 20 is a cross-sectional view illustrating methods of fabricating a phase change memory device according to yet other example embodiments of the present invention.

Referring to FIG. 20, an isolation layer 1202 defining active regions 1202a may be formed on a substrate 1200. Word lines 1205 WL may be formed on the active regions 1202a. Source and drain regions 1206 may be formed within the active regions 1202a adjacent to both sides of the word lines 1205 WL. A bottom insulating layer 1207 may be formed to cover the substrate 1200 having the word lines 1205 WL. The word line 1205 WL, the active region 1202a, and the source and drain regions 1206 may constitute a transistor (Ta of FIG. 11).

First plugs 1210a and second plugs 1210b may be formed within the bottom insulating layer 1207. Drain pads 1215a and source lines 1215b may be formed on the first plugs 1210a and the second plugs 1210b, respectively. The drain pads 1215a and the source lines 1215b may be formed within the bottom insulating layer 1207. The drain pads 1215a may be electrically connected to one selected region of the source and drain regions 1206 by the first plugs 1210a penetrating the bottom insulating layer 1207. The source lines 1215b may be electrically connected to the other selected region of the source and drain regions 1206 by the second plugs 1210b penetrating the bottom insulating layer 1207.

Subsequently, the same process as the method described with reference to FIGS. 14B through 14E may be carried out up to the formation of the top electrode 1137.

The phase change memory device according to example embodiments of the present invention will now be described with reference back to FIGS. 13 and 14E.

Referring to FIGS. 13 and 14E, the phase change memory device may have an isolation layer 1102 defining active regions 1102a in a predetermined region of a substrate 1100. A semiconductor substrate such as a silicon wafer or as SOI wafer may be employed as the substrate 1100. The substrate 1100 may have first conductivity type impurity ions. The isolation layer 1102 may be a silicon oxide layer, a silicon nitride layer, a silicon oxynitride layer, or combinations thereof. The active regions 1102a may have a line-shaped structure.

The active regions 1102a may include impurity ions of a second conductivity type different from the first conductivity type so that the active regions 1102a may act as word lines WL 1105. Hereinafter, for simplicity of description, a case in which the first and second conductivity types are P and N types, respectively, will be described. However, the first and second conductivity types may be N and P types, respectively.

A first interlayer insulating layer 1107 may be disposed on the substrate 1100 having the word lines WL 1105 and the isolation layer 1102. The first interlayer insulating layer 1107 may include a silicon oxide layer, a silicon nitride layer, a silicon oxynitride layer, or combinations thereof. Contact holes 1108h may be disposed through the first interlayer insulating layer 1107 to expose a predetermined region of the word lines WL 1105. First and second semiconductor patterns 1110 and 1112 may be sequentially disposed within the contact holes 1108h. The first and second semiconductor patterns 1110 and 1112 may constitute diodes D.

The first semiconductor pattern 1110 may be in contact with the word lines WL 1105. The first semiconductor pattern 1110 may include the second conductivity type impurity ions. The second semiconductor pattern 1112 may include the first conductivity type impurity ions. Alternatively, the first semiconductor pattern 1110 may include the first conductivity type impurity ions and the second semiconductor pattern 1112 may include the second conductivity type impurity ions.

Diode electrodes 1115 may be disposed on the respective diodes D. The diode electrodes 1115 may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof. For example, the diode electrodes 1115 may include a TiN layer and a W layer which are sequentially stacked.

The diode electrodes 1115 may be disposed within the contact holes 1108h. In this case, the diode electrodes 1115 may be self-aligned on the respective diodes D. Alternatively, the diode electrodes 1115 may be omitted.

A second interlayer insulating layer 1117 may be disposed on the substrate 1100 having the diode electrodes 1115. Cylindrical bottom electrodes may be disposed on the diode electrodes 1115 through the second interlayer insulating layer 1117. Internal insulating patterns may be disposed within the cylindrical bottom electrodes. Line-shaped insulating patterns 1132 may be disposed in the second interlayer insulating layer 1117 in an x-axis or y-axis direction to cut portions of the cylindrical bottom electrodes in a vertical direction. Phase change patterns 1135 may be disposed on the substrate 1100 having partially cut cylindrical bottom electrodes 1122" and partially cut internal insulating patterns 1125' while being in contact with the partially cut cylindrical bottom electrodes 1122" and the partially cut internal insulating patterns 1125'. Top electrodes 1137 may be disposed on the respective phase change patterns 1135. The top electrodes 1137 may act as a bit line BL.

From the top view, a top surface of each of the partially cut cylindrical bottom electrodes 1122" may have a "C" shape, a crescent shape with a uniform thickness, or a "(" shape. Accordingly, the top surface of each of the partially cut cylindrical bottom electrodes 1122" may have a smaller area than a top surface of a conventional cylindrical bottom electrode. In addition, from the top view, the same portions of the top surfaces of the partially cut cylindrical bottom electrodes 1122" may be cut to form a uniform CCC arrangement.

The line-shaped insulating patterns 1132 may be filled in line-shaped trenches 1130t, which cut portions of the cylindrical bottom electrodes in a vertical direction and penetrate the second interlayer insulating layer 1117 to expose portions of the top surfaces of the diode electrodes 1115 and cut sidewalls of the partially cut cylindrical bottom electrodes 1122".

Alternatively, as shown in FIG. 15B, the line-shaped insulating patterns 1132' may be filled in line-shaped trenches 1130t', which cut portions of the cylindrical bottom electrodes in a vertical direction and expose top surfaces and sidewalls of cut regions of the partially cut cylindrical bottom electrodes 1122" in the second interlayer insulating layer 1117.

The partially cut cylindrical bottom electrodes 1122" may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

The partially cut internal insulating patterns 1125" may be formed of an insulating layer such as a silicon oxide layer, a silicon nitride layer, a silicon oxynitride layer or combinations thereof. In addition, the partially cut internal insulating patterns 1125" may be formed of the same material layer as the second interlayer insulating layer 1117.

In yet other embodiments, the partially cut internal insulating patterns 1125" may be omitted. In this case, the partially cut cylindrical bottom electrodes 1122" may have a partially cut pillar structure.

The line-shaped trenches 1130t and 1130t' may be formed in an x-axis or y-axis direction. Specifically, as shown in FIG. 13, the line-shaped trenches 1130t and 1130t' may extend in a line direction perpendicular to the word lines 1105 WL.

Alternatively, as shown in FIGS. 16 and 17, the line-shaped trenches 1130t' may extend in a line direction parallel to the word lines 1105 WL.

Phase change patterns 1135 and top electrodes 1137 may extend in a direction perpendicular to the word lines 1105 WL. Alternatively, as shown in FIG. 13, the phase change patterns 1135 and the top electrodes 1137 BL may extend in a direction parallel to the line direction of the line-shaped insulating patterns 1132.

Alternatively, as shown in FIGS. 16 and 17, when line-shaped insulating patterns 1132' extend in a line direction parallel to the word lines 1105 WL, the phase change patterns 1135 and the top electrodes 1137 BL may extend in a direction perpendicular to the line direction of the line-shaped insulating patterns 1132' as shown in FIG. 16. As a result, a distance L2 between the partially cut cylindrical bottom electrodes 1122" sharing the phase change pattern 1135 may be greater than a distance L1 between the partially cut cylindrical bottom electrodes 1122" shown in FIG. 13. Therefore, thermal disturbance between cells may be reduced.

The phase change patterns 1135 may be a chalcogenide material layer. For example, the phase change patterns 1135 may include a compound formed of at least two selected from the group consisting of Te, Se, Ge, Sb, Bi, Pb, Sn, Ag, As, S, Si, P, O, and C.

The top electrodes 1137 BL may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

As described above, the top surfaces of the partially cut cylindrical bottom electrodes 1122" according to example embodiments of the present invention may have a smaller area than the ring-shaped top surfaces of the cylindrical bottom electrodes 1122'. As a result, an interface area between the phase change pattern 1135 and the bottom electrode 1122" where Joule heat is generated may be reduced so that a current to be applied during a reset operation may be reduced compared to the conventional art.

A phase change device according to other example embodiments of the present invention will now be described with reference back to FIG. 20.

Referring to FIG. 20, an isolation layer 1202 defining active regions 1202a may be disposed on a substrate 1200. Word lines 1205 WL may be disposed on the active regions 1202a. Source and drain regions 1206 may be disposed within the active regions 1202a adjacent to both sides of the word lines 1205 WL. A bottom insulating layer 1207 may be disposed to cover the substrate 1200 having the word lines 1205 WL. The word line 1205 WL, the active region 1202a, and the source and drain regions 1206 may constitute a transistor (Ta of FIG. 11).

First plugs 1210a and second plugs 1210b may be disposed within the bottom insulating layer 1207. Drain pads 1215a and source lines 1215b may be disposed on the first plugs 1210a and the second plugs 1210b, respectively. The drain pads 1215a and the source lines 1215b may be disposed within the bottom insulating layer 1207. The drain pads 1215a may be electrically connected to one selected region of the source and drain regions 1206 by the first plugs 1210a penetrating the bottom insulating layer 1207. The source lines 1215b may be electrically connected to the other selected region of the source and drain regions 1206 by the second plugs 1210b penetrating the bottom insulating layer 1207.

A second interlayer insulating layer 1117 may be disposed on the substrate 1100 having the drain pads 1215a and the source lines 1215b. Cylindrical bottom electrodes may be disposed on the diode electrodes 1115 through the second interlayer insulating layer 1117. Internal insulating patterns may be disposed within the cylindrical bottom electrodes. Line-shaped insulating patterns 1132 may be disposed in the second interlayer insulating layer 1117 in an x-axis or y-axis direction to cut portions of the cylindrical bottom electrodes in a vertical direction. Phase change patterns 1135 may be disposed on the substrate 1100 having partially cut cylindrical bottom electrodes 1122" and partially cut internal insulating patterns 1125' while being in contact with the partially cut cylindrical bottom electrodes 1122" and the partially cut internal insulating patterns 1125'. Top electrodes 1137 may be disposed on the respective phase change patterns 1135. The top electrodes 1137 may act as a bit line BL.

From the top view, a top surface of each of the partially cut cylindrical bottom electrodes 1122" may have a "C" shape, a crescent shape with a uniform thickness, or a "(" shape. Accordingly, the top surface of each of the partially cut cylindrical bottom electrodes 1122" may have a smaller area than a top surface of a conventional cylindrical bottom electrode. In addition, from the top view, the same portions of the top surfaces of the partially cut cylindrical bottom electrodes 1122" may be cut to form a uniform CCC arrangement.

The partially cut cylindrical bottom electrodes 1122" may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

The partially cut internal insulating patterns 1125" may be formed of an insulating layer such as a silicon oxide layer, a silicon nitride layer, a silicon oxynitride layer or combinations thereof. In addition, the partially cut internal insulating patterns 1125" may be formed of the same material layer as the second interlayer insulating layer 1117. In yet other embodiments, the partially cut internal insulating patterns 1125" may be omitted. In this case, the partially cut cylindrical bottom electrodes 1122" may have a partially cut pillar structure.

Phase change patterns 1135 and top electrodes 1137 may extend in a direction perpendicular to the word lines 1105 WL. Alternatively, as shown in FIG. 13, the phase change patterns 1135 and the top electrodes 1137 BL may extend in a direction parallel to or perpendicular to the line direction of the line-shaped insulating patterns 1132.

The phase change patterns 1135 may be a chalcogenide material layer. For example, the phase change patterns 1135 may include a compound formed of at least two selected from the group consisting of Te, Se, Ge, Sb, Bi, Pb, Sn, Ag, As, S, Si, P, O, and C. The top electrodes 1137 BL may include one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer and combinations thereof.

According to embodiments of the present invention, line-shaped or L-shaped bottom electrodes may have top surfaces defined by the x and y axes, and the x-axis or y-axis of the top surface of the line-shaped or L-shaped bottom electrodes may have a smaller width than a resolution limit of a photolithography process. Alternatively, in other embodiments, both the x-axis and the y-axis of the top surface of the line-shaped or L-shaped bottom electrodes may have a smaller width than the resolution limit of the photolithography process. Therefore, the line-shaped or L-shaped bottom electrodes can overcome the patterning limit to have a smaller area than the conventional art.

In addition, from the top view, the top surface of each of the partially cut cylindrical bottom electrodes 1122" may have a "C" shape, a crescent shape with a uniform thickness, or a "(" shape. Accordingly, the top surface of each of the partially cut cylindrical bottom electrodes 1122" may have a smaller area than the ring-shaped top surface of the conventional cylindrical bottom electrode.

As a result, an interface area between a phase change pattern and a bottom electrode where Joule heat is generated may be reduced so that a current to be applied during a reset operation may be reduced compared to the conventional art. Consequently, a phase change memory device which overcomes the patterning limit and is advantageous for high integration can be implemented.

While the invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A method of fabricating a phase change memory device, comprising:

forming line-shaped or L-shaped bottom electrodes in contact with respective bottom patterns on a substrate and having top surfaces defined by dimensions in x and y axes directions on the substrate, wherein the dimension along the x-axis of the top surface of the bottom electrodes has less width than a resolution limit of a photolithography process used to fabricate the phase change memory device;

forming phase change patterns in contact with the top surface of the bottom electrodes and having a greater width than each of the dimensions in the x and y axes directions of the top surface of the bottom electrodes; and forming top electrodes on the phase change patterns, wherein the line shape or the L shape represents a sectional line shape or a sectional L shape of the bottom electrodes in the x-axis direction.

2. The method according to claim 1, wherein the dimension in y-axis direction of the top surface of the bottom electrodes has a width equal to or greater than the resolution limit of a photolithography process.

3. The method according to claim 2, wherein forming L-shaped bottom electrodes comprises:

forming an interlayer insulating layer on the substrate having the bottom patterns;

forming line-shaped trenches extending in the y-axis direction and simultaneously exposing portions of the two bottom patterns neighboring in the x-axis direction within the interlayer insulating layer;

sequentially forming a bottom electrode layer and a spacer layer in the substrate having the line-shaped trenches;

sequentially etching-back the spacer layer and the bottom electrode layer to form L-shaped bottom electrode patterns and spacers;

forming first insulating patterns filling the line-shaped trenches in the substrate having the L-shaped bottom electrode patterns and the spacers;

forming line-shaped mask patterns extending in the x-axis direction on the substrate having the first insulating patterns and the L-shaped bottom electrode patterns;

etching the first insulating patterns, the L-shaped bottom electrode patterns, and the interlayer insulating layer until the bottom patterns are exposed using the line-shaped mask patterns as an etch mask; and filling second insulating patterns in the etched region.

4. The method according to claim 3, further comprising:

before forming the line-shaped mask patterns extending in the x-axis direction, planarizing the substrate having the first insulating patterns, the L-shaped bottom electrode patterns, and the spacers to planarize top surfaces of the L-shaped bottom electrode patterns.

5. The method according to claim 2, wherein forming L-shaped bottom electrodes comprises:

forming an interlayer insulating layer on the substrate having the bottom patterns;

forming line-shaped trenches extending in the y-axis direction and simultaneously exposing portions of the two bottom patterns neighboring in the x-axis direction within the interlayer insulating layer;

forming bottom electrode patterns covering sidewalls and bottom surfaces of the line-shaped trenches;

forming internal insulating patterns filling the line-shaped trenches in the substrate having the bottom electrode patterns;

forming mask patterns having a first opening exposing a central region of the internal insulating patterns in the y-axis direction and a second opening exposing a top region between the bottom patterns in the x-axis direction, on the substrate having the internal insulating patterns and the bottom electrode patterns;

etching the internal insulating patterns, the bottom electrode patterns, and the interlayer insulating layer until the bottom patterns are exposed using the mask patterns as an etch mask; and filling insulating patterns in the etched region.

6. The method according to claim 1, wherein forming line-shaped bottom electrodes comprises:

forming an interlayer insulating layer on the substrate having the bottom patterns;

forming line-shaped trenches extending in the y-axis direction and simultaneously exposing portions of the two bottom patterns neighboring in the x-axis direction within the interlayer insulating layer;

forming bottom electrode spacers on sidewalls of the line-shaped trenches;

forming first insulating patterns in the line-shaped trenches in the substrate having the bottom electrode spacers;

forming line-shaped mask patterns extending in the x-axis direction on the substrate having the first insulating patterns, the bottom electrode spacers and the interlayer insulating layer;

etching the first insulating patterns, the bottom electrode spacers and the interlayer insulating layer until the bottom patterns are exposed using the line-shaped mask patterns as an etch mask; and filling second insulating patterns in the etched region.

7. The method according to claim 6, wherein forming bottom electrode spacers comprises:

forming a bottom electrode layer covering sidewalls and bottom surfaces of the line-shaped trenches and a top surface of the interlayer insulating layer; and etching-back the bottom electrode layer.

8. The method according to claim 6, wherein forming first insulating patterns in the line-shaped trenches in the substrate having the bottom electrode spacers comprises:

forming a first insulating layer on the substrate having the bottom electrode spacers; and planarizing the first insulating layer to expose top surfaces of the bottom electrode spacers.

9. The method according to claim 1, wherein the dimension in the y-axis direction of the top surface of the bottom electrodes has less width than a resolution limit of a photolithography process.

10. The method according to claim 9, wherein forming line-shaped bottom electrodes comprises:

forming an interlayer insulating layer on the substrate having the bottom patterns;

forming line-shaped trenches extending in the y-axis direction and simultaneously exposing portions of the two bottom patterns neighboring in the x-axis direction within the interlayer insulating layer;

forming bottom electrode spacers on sidewalls of the line-shaped trenches;

forming first insulating patterns filling the line-shaped trenches in the substrate having the bottom electrode spacers;

forming line-shaped sacrificial patterns extending in the x-axis direction on the substrate having the first insulating patterns, the bottom electrode spacers, and the interlayer insulating layer;

forming mask spacers on sidewalls of the line-shaped sacrificial patterns;

etching the line-shaped sacrificial patterns, the interlayer insulating layer, the bottom electrode spacers, and the first insulating patterns until the bottom patterns are exposed using the mask spacers as an etch mask; and filling second insulating patterns in the etched region.

11. The method according to claim 10, wherein forming bottom electrode spacers comprises:

forming a bottom electrode layer covering sidewalls and bottom surfaces of the line-shaped trenches and a top surface of the interlayer insulating layer; and etching-back the bottom electrode layer.

12. The method according to claim 10, wherein the sidewalls of the line-shaped sacrificial patterns are formed above the respective bottom patterns.

13. The method according to claim 9, wherein the forming of the L-shaped bottom electrodes comprises:

forming an interlayer insulating layer on the substrate having the bottom patterns;

forming line-shaped trenches extending in the y-axis direction and simultaneously exposing portions of the two bottom patterns neighboring in the x-axis direction within the interlayer insulating layer;

sequentially forming a bottom electrode layer and a spacer layer in the substrate having the line-shaped trenches;

sequentially etching-back the spacer layer and the bottom electrode layer to form L-shaped bottom electrode patterns and spacers;

forming first insulating patterns filling the line-shaped trenches in the substrate having the L-shaped bottom electrode patterns and the spacers;

forming line-shaped sacrificial patterns extending in the x-axis direction on the substrate having the first insulating patterns and the L-shaped bottom electrode patterns;

forming mask spacers on sidewalls of the line-shaped sacrificial patterns;

etching the line-shaped sacrificial patterns, the first insulating patterns, the L-shaped bottom electrode patterns, and the interlayer insulating layer until the bottom patterns are exposed using the mask spacers as an etch mask; and filling second insulating patterns in the etched region.

14. The method according to claim 13, wherein the sidewalls of the line-shaped sacrificial patterns are formed above the respective bottom patterns.

15. The method according to claim 1, wherein the L-shaped bottom electrodes include a section of an L shape and a section of a symmetrical structure of the L shape.

16. The method according to claim 15, wherein the L-shaped bottom electrodes adjacent to each other have the symmetrical L-shaped structures.

17. The method according to claim 1, wherein the bottom patterns are formed of diodes.

18. The method according to claim 1, wherein the bottom patterns are formed of a contact plug in contact with the substrate and a conductive pattern disposed on the contact plug.

19. The method according to claim 18, further comprising:

before forming the contact plug, forming transistors electrically connected to the respective bottom patterns on the substrate.

20. The method according to claim 1, wherein the phase change patterns extend in a direction parallel to the x-axis of the top surface of the bottom electrodes or extend in a direction parallel to the y-axis of the top surface of the bottom electrodes.

21. The method according to claim 1, wherein the phase change patterns and the top electrodes are simultaneously formed by patterning.

22. A method of fabricating a phase change memory device, comprising:

preparing a substrate having bottom patterns;

forming an interlayer insulating layer on the substrate having the bottom patterns;

forming cylindrical bottom electrodes in contact with the bottom patterns through the interlayer insulating layer;

forming insulating patterns in the interlayer insulating layer to cut portions of the cylindrical bottom electrodes and the interlayer insulating layer in a vertical direction;

forming phase change patterns in contact with upper portions of the partially cut cylindrical bottom electrodes; and forming top electrodes on the phase change patterns.

23. The method according to claim 22, wherein the partially cut cylindrical bottom electrodes have a crescent shape, a "C" shape, or a "(" shape from the top view.

24. The method according to claim 22, wherein the bottom patterns include diodes and diode electrodes which are sequentially stacked.

25. The method according to claim 22, wherein the bottom patterns include contact plugs in contact with the substrate and conductive patterns disposed on the contact plugs.

26. The method according to claim 25, further comprising forming transistors electrically connected to the respective bottom patterns on the substrate.

27. The method according to claim 22, wherein the forming of the insulating patterns comprises:

cutting the portions of the cylindrical bottom electrodes and the interlayer insulating layer in a vertical direction to form trenches exposing portions of top surfaces of the bottom patterns and cut sidewalls of the partially cut cylindrical bottom electrodes; and forming an insulating layer within the trenches.

28. The method according to claim 22, wherein the forming of the insulating patterns comprises:

cutting the portions of the cylindrical bottom electrodes and the interlayer insulating layer in a vertical direction to form trenches exposing top surfaces and sidewalls of the cut portions of the partially cut cylindrical bottom electrodes; and forming an insulating layer within the trenches.

29. The method according to claim 22, wherein the forming of the cylindrical bottom electrodes comprises:

forming bottom electrode contact holes exposing top surfaces of the bottom patterns through the interlayer insulating layer;

forming a bottom electrode layer covering sidewalls and bottom surfaces of the bottom electrode contact holes on the interlayer insulating layer having the bottom electrode contact holes;

forming an internal insulating layer filling the bottom electrode contact holes on the substrate having the bottom electrode layer; and planarizing the internal insulating layer and the bottom electrode layer until a top surface of the interlayer insulating layer is exposed.

30. The method according to claim 29, further comprising, after planarizing the internal insulating layer and the bottom electrode layer until the top surface of the interlayer insulating layer is exposed, performing a planarization process at least once.

31. A method of fabricating a phase change memory device, comprising:
- forming an interlayer insulating layer on a substrate having bottom patterns;
- forming cylindrical bottom electrodes on the respective bottom patterns through the interlayer insulating layer;
- forming line-shaped insulating patterns in the interlayer insulating layer in an x-axis or y-axis direction to removed portions of the cylindrical bottom electrodes and the interlayer insulating layer in a vertical direction;
- forming phase change patterns in contact with partially removed cylindrical bottom electrodes on the partially removed cylindrical bottom electrodes; and
- forming top electrodes on the respective phase change patterns.

32. The method according to claim 31, wherein the partially removed cylindrical bottom electrodes have a crescent shape, a "C" shape, or a "(" shape from the top view.

33. The method according to claim 31, wherein the same portions of the partially removed cylindrical bottom electrodes are cut to form a uniform CCC arrangement from the top view.

34. The method according to claim 31, wherein the phase change patterns are formed to extend in a direction parallel to or perpendicular to a surface along which the portions of the cylindrical bottom electrodes are cut.

35. The method according to claim 31, wherein the forming of the line-shaped insulating patterns comprises:
- cutting the portions of the cylindrical bottom electrodes and the interlayer insulating layer in a vertical direction to form line-shaped trenches exposing portions of top surfaces of the bottom patterns and cut sidewalls of the partially cut cylindrical bottom electrodes; and
- forming an insulating layer within the line-shaped trenches.

36. The method according to claim 31, wherein the forming of the line-shaped insulating patterns comprises:
- cutting the portions of the cylindrical bottom electrodes and the interlayer insulating layer in a vertical direction to form line-shaped trenches exposing top surfaces and sidewalls of the cut portions of the partially cut cylindrical bottom electrodes; and
- forming an insulating layer in the line-shaped trenches.

* * * * *